US012793642B2

(12) United States Patent
Kim

(10) Patent No.: US 12,793,642 B2
(45) Date of Patent: Nov. 10, 2026

(54) ELECTRONIC DEVICE AND METHOD OF DRIVING THE SAME

(71) Applicant: SAMSUNG DISPLAY CO., LTD., Yongin-si (KR)

(72) Inventor: Gigeun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/347,087

(22) Filed: Oct. 1, 2025

(65) Prior Publication Data

US 2026/0120638 A1 Apr. 30, 2026

(30) Foreign Application Priority Data

Oct. 30, 2024 (KR) ........................ 10-2024-0150860

(51) Int. Cl.
*G09G 3/3233* (2016.01)
*H10K 59/122* (2023.01)

(52) U.S. Cl.
CPC ......... *G09G 3/3233* (2013.01); *H10K 59/122* (2023.02); *G09G 2300/0819* (2013.01); *G09G 2300/0852* (2013.01); *G09G 2300/0861* (2013.01); *G09G 2310/08* (2013.01); *G09G 2320/0233* (2013.01); *G09G 2320/0257* (2013.01); *G09G 2320/045* (2013.01); *G09G 2320/068* (2013.01); *G09G 2380/10* (2013.01)

(58) Field of Classification Search
CPC ........ G09G 3/3233; G09G 3/003; G09G 3/20; G09G 3/32; G09G 3/3208; G09G 3/3291; G09G 2300/0819; G09G 2300/0842; G09G 2300/0852; G09G 2300/0861; G09G 2310/08; G09G 2320/0233; G09G 2320/0257; G09G 2320/045; G09G 2320/046; G09G 2320/068; G09G 2320/0686; G09G 2380/10; H10K 59/122
See application file for complete search history.

(56) References Cited

U.S. PATENT DOCUMENTS

| | | | | |
|---|---|---|---|---|
| 7,675,492 | B2 | 3/2010 | Park et al. | |
| 9,928,773 | B2 * | 3/2018 | Kim | G09G 3/3233 |
| 11,024,241 | B2 * | 6/2021 | Lee | G09G 5/026 |
| 11,263,950 | B2 * | 3/2022 | Bae | G09G 3/2003 |

(Continued)

*Primary Examiner* — Vinh T Lam
(74) *Attorney, Agent, or Firm* — F. CHAU & ASSOCIATES, LLC

(57) ABSTRACT

An electronic device includes a display panel including a first display region which operates in a first mode, and a second display region which operates in the first mode or a second mode. An afterimage compensating circuit compensates for a first input image signal for the first display region and a second input image signal for the second display region based on degradation information for the first display region and the second display region, respectively. First blocks are defined in the first display region, and second blocks are defined in the second display region to have a size different from a size of the first blocks. The afterimage compensating circuit includes an accumulating memory including a first storage region that accumulates first degradation data for the first blocks, and a second storage region that accumulates second degradation data for the second blocks.

20 Claims, 29 Drawing Sheets

(56) References Cited

U.S. PATENT DOCUMENTS

| | | | | |
|---|---|---|---|---|
| 2016/0189337 | A1* | 6/2016 | Song | G09G 3/2096 345/565 |
| 2021/0056912 | A1* | 2/2021 | Park | G09G 3/2092 |
| 2021/0174716 | A1* | 6/2021 | Noh | G09G 3/035 |
| 2021/0193017 | A1* | 6/2021 | Ahn | G09G 3/2044 |
| 2021/0287593 | A1* | 9/2021 | Baek | G09G 3/007 |
| 2022/0180806 | A1* | 6/2022 | Lee | G09G 3/035 |
| 2022/0383794 | A1* | 12/2022 | Kim | G09G 3/2003 |
| 2023/0252920 | A1* | 8/2023 | Hong | G09G 3/003 345/214 |
| 2023/0306884 | A1* | 9/2023 | Choi | G06F 1/1626 |
| 2023/0368737 | A1* | 11/2023 | Jun | G06F 3/011 |
| 2024/0144860 | A1* | 5/2024 | Hong | G09G 3/32 |
| 2024/0257710 | A1* | 8/2024 | Chou | G09G 3/2096 |

* cited by examiner

<First Mode>

<Second Mode>

ELECTRONIC DEVICE AND METHOD OF DRIVING THE SAME

CROSS-REFERENCE TO RELATED APPLICATIONS

This application claims priority under 35 U.S.C. § 119 to Korean Patent Application No. 10-2024-0150860 filed on Oct. 30, 2024, the disclosure of which is incorporated by reference herein in its entirety.

TECHNICAL FIELD

Embodiments of the present disclosure relate to an electronic device and a method of driving the same, and more particularly, to an electronic device capable of compensating for an afterimage, and a method of driving the same.

DISCUSSION OF RELATED ART

Multimedia electronic devices, such as televisions, cellular phones, tablet computers, navigation systems, and game consoles, include an electronic device that displays an image. In addition, an electronic device may be provided in an interior of a vehicle.

In addition to a common input device such as a button, a keyboard, or a mouse, the electronic device may include an input sensor to provide a touch-based input manner that allows a user to enter information or commands easily and intuitively.

SUMMARY

Embodiments of the present disclosure provide an electronic device capable of reducing the size of an accumulating memory to compensate for an afterimage.

Embodiments of the present disclosure provide a method of driving an electronic device capable of reducing the size of an accumulating memory to compensate for an afterimage.

According to an embodiment of the present disclosure, an electronic device includes a display panel including a first display region which operates in a first mode, and a second display region which operates in the first mode or a second mode, and an afterimage compensating circuit configured to receive a first input image signal for the first display region and a second input image signal for the second display region, and generate a first compensated image signal and a second compensated image signal by compensating for the first input image signal and the second input image signal based on degradation information of the first display region and the second display region, respectively.

In an embodiment, a plurality of first blocks are defined in the first display region, and a plurality of second blocks are defined in the second display region to have a size different from a size of the first blocks. The afterimage compensating circuit includes an accumulating memory including a first storage region configured to accumulate first degradation data for each of the plurality of first blocks, and a second storage region configured to accumulate second degradation data for each of the plurality of second blocks.

In an embodiment, the second storage region includes a first mode storage region configured to accumulate the second degradation data for each of the second blocks in the first mode, and a second mode storage region configured to accumulate the second degradation data for each of the second blocks in the second mode.

According to an embodiment of the present disclosure, in a method of driving an electronic device, the electronic device includes a first display region, which operates in a first mode, and a second display region which operates in the first mode or a second mode.

The method of driving the electronic device includes receiving a first input image signal for the first display region and a second input image signal for the second display region, generating a first compensated image signal and a second compensated image signal by compensating for the first input image signal and the second input image signal based on degradation information for the first display region and the second display region, respectively, displaying an image in the first display region and the second display region based on the first compensated image signal and the second compensated image signal, respectively. and accumulating first degradation data generated based on the first compensated image signal in a first storage region of an accumulating memory and accumulating second degradation data generated based on the second compensated image signal in a second storage region of the accumulating memory.

In an embodiment, a plurality of first blocks are defined in the first display region, and a plurality of second blocks are defined in the second display region to have a size different from a size of the first blocks.

In an embodiment, the second storage region includes a first mode storage region to accumulate (2-1)-th degradation data for each of the second blocks in the first mode, and a second mode storage region to accumulate (2-2)-th degradation data for each of the second blocks in the second mode.

According to an embodiment of the present disclosure, an electronic device includes a display panel including a first display region which operates in a first mode or a second mode, and a second display region which operates in the first mode or the second mode, and an afterimage compensating circuit configured to receive a first input image signal for the first display region and a second input image signal for the second display region, and generate a first compensated image signal and a second compensated image signal by compensating for the first input image signal and the second input image signal based on degradation information of the first display region and the second display region, respectively.

The afterimage compensating circuit includes an accumulating memory including a first storage region and a second storage region. The second storage region includes a first mode storage region configured to accumulate (2-1)-th degradation data for the second display region in the first mode, and a second mode storage region configured to accumulate (2-2)-th degradation data for the second display region in the second mode. The first storage region includes a third mode storage region configured to accumulate (1-1)-th degradation data for the first display region in the first mode, and a fourth mode storage region configured to accumulate (1-2)-th degradation data for the first display region in the second mode.

BRIEF DESCRIPTION OF THE DRAWINGS

The above and other objects and features of the present disclosure will become more apparent by describing in detail embodiments thereof with reference to the accompanying drawings.

DETAILED DESCRIPTION

Figure 1:
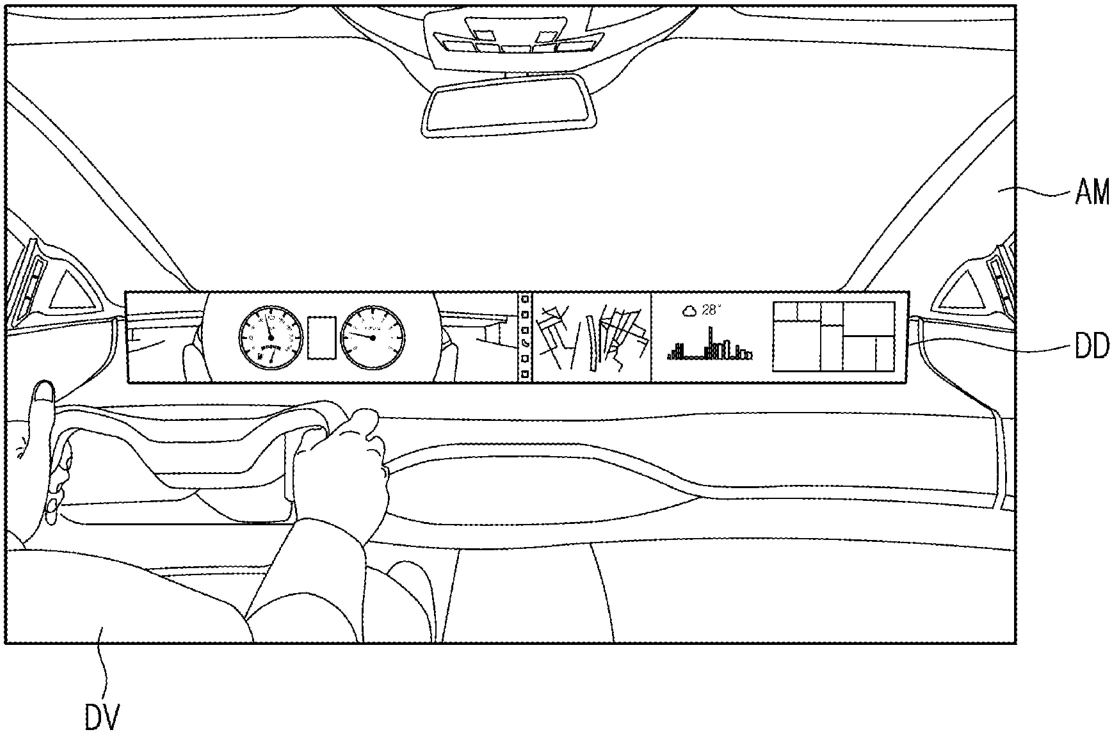
FIG. 1 is a view illustrating an interior of a vehicle including an electronic device disposed therein according to an embodiment of the present disclosure.

Embodiments of the present disclosure will be described more fully hereinafter with reference to the accompanying drawings. Like reference numerals may refer to like elements throughout the accompanying drawings.

In the specification, the expression that a first component (or region, layer, or part) is "on", "connected to", or "coupled to" a second component refers to that the first component is directly on, connected to, or coupled to the second component or refers to that a third component is interposed therebetween.

The term "and/or" includes any and all combinations of one or more of associated components.

Although the terms "first", or "second" may be used to describe various components, the components should not be construed as being limited by the terms. The terms are only used to distinguish one component from another component. For example, without departing from the scope and spirit of the present disclosure, a first component may be referred to as a second component, and similarly, the second component may be referred to as the first component. The singular forms are intended to include the plural forms unless the context clearly indicates otherwise.

In addition, the terms "under", "at a lower portion", "above", "an upper portion" are used to describe the relationship between components illustrated in drawings. The terms are relative and will be described with reference to a direction indicated in the drawing.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art, for example, within ±30%, 20%, 10% or 5% of the stated value. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

It will be further understood that the terms "comprise," "include," or "including," or "have" or "having" specify the presence of stated features, numbers, steps, operations, components, parts, or the combination thereof, but do not preclude the presence or addition of one or more other features, numbers, steps, operations, components, components, and/or the combination thereof.

Embodiments of the present disclosure relate to an electronic device and, more particularly, to an electronic device including multiple display regions that operate in different modes and an afterimage compensating circuit configured to improve visual quality by accurately compensating for region-specific image degradation. As display panels become more complex and adaptive to varying usage scenarios, such as public and private viewing modes, there is an increasing need for intelligent compensation mechanisms that address non-uniform aging and usage across different parts of the screen.

For example, embodiments provide an afterimage compensating circuit that divides the display panel into a first display region and a second display region, the latter of which operates selectively in a first or second mode. Each region may be subdivided into blocks of different sizes, which may improve memory usage and compensation accuracy. Degradation data may be accumulated separately for each region and mode using a mode-aware memory configuration. By compensating for image signals based on this granular and mode-specific degradation data, an electronic device according to embodiments of the present disclosure may reduce afterimage artifacts while reducing memory overhead, which may improve long-term image quality and user experience.

FIG. 1 is a view illustrating an interior of a vehicle including an electronic device provided therein according to an embodiment of the present disclosure.

Referring to FIG. 1, an electronic device DD may be provided in an interior of a vehicle AM. The electronic device DD may be provided in the interior of the vehicle AM to provide various pieces of information to a driver (or a user) DV. The electronic device DD may provide an image such as, for example, weather, a speed, a map, or a video, to the driver DV. The electronic device DD may be a touch-based electronic device which is operable in response to a touch input of the driver DV.

Although FIG. 1 illustrates the electronic device DD being implemented in a vehicle, embodiments of the present disclosure are not limited thereto. For example, the electronic device DD according to an embodiment of the present disclosure may be utilized in electronic equipment such as, for example, a smartphone, a digital camera, a laptop computer, a monitor, and a smart television, to provide an image to the user.

Figure 2A:
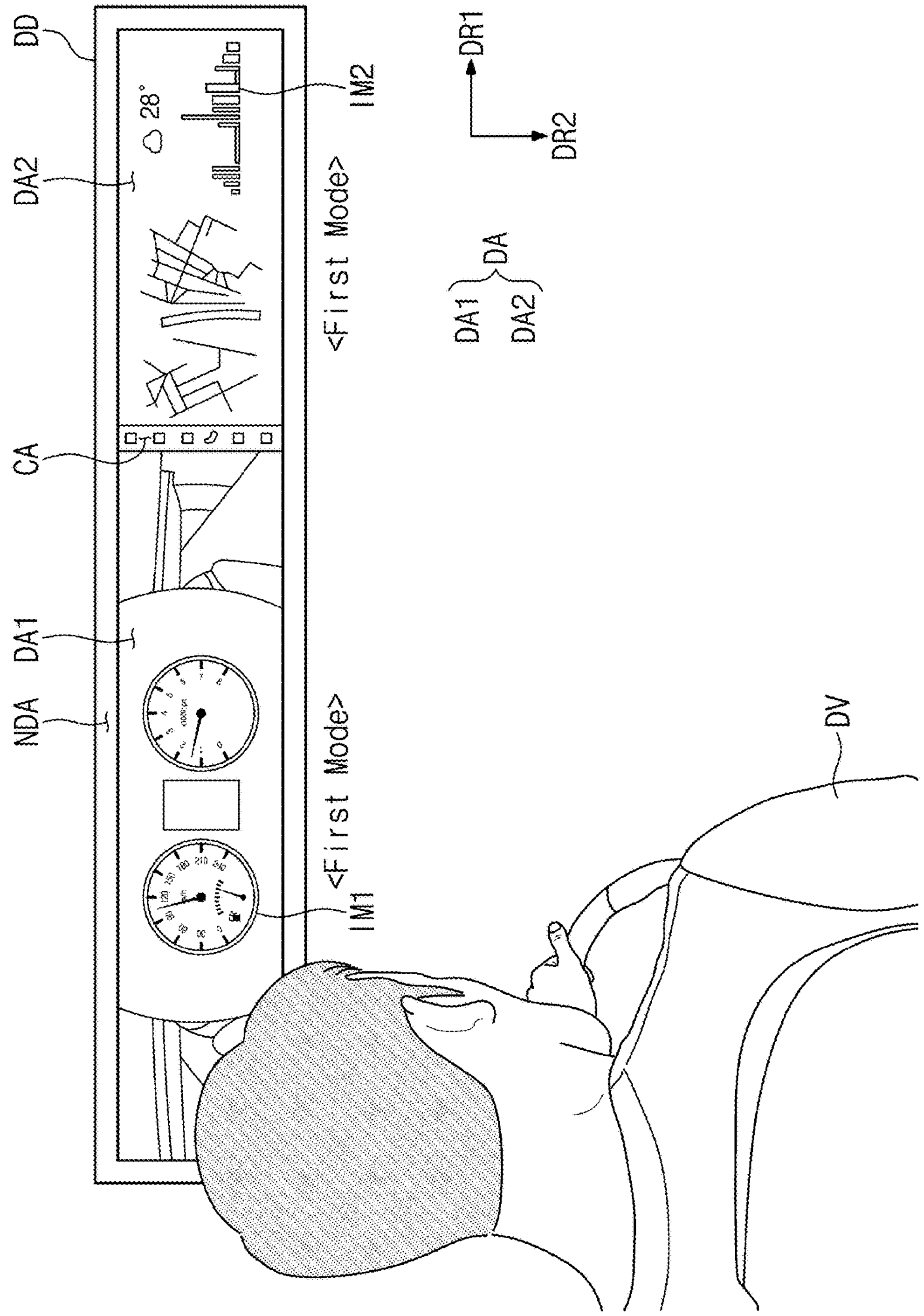
FIG. 2A illustrates the state of an electronic device including a first display region and a second display region, which operate in a first mode, according to an embodiment of the present disclosure.
Figure 2B:
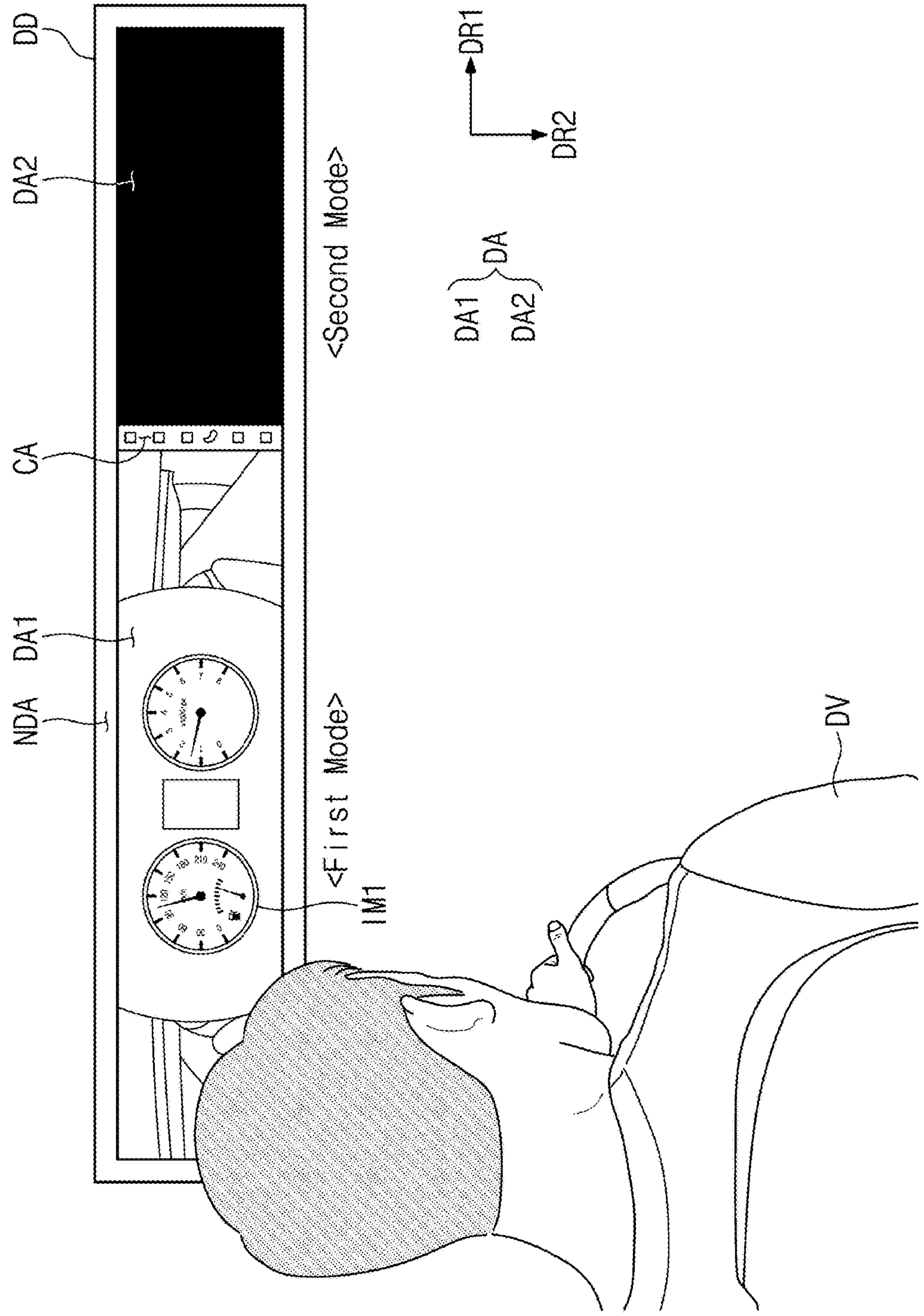
FIG. 2B illustrates the state of an electronic device including a first display region operating in a first mode and a second display region operating in a second mode according to an embodiment of the present disclosure.
Figure 2C:
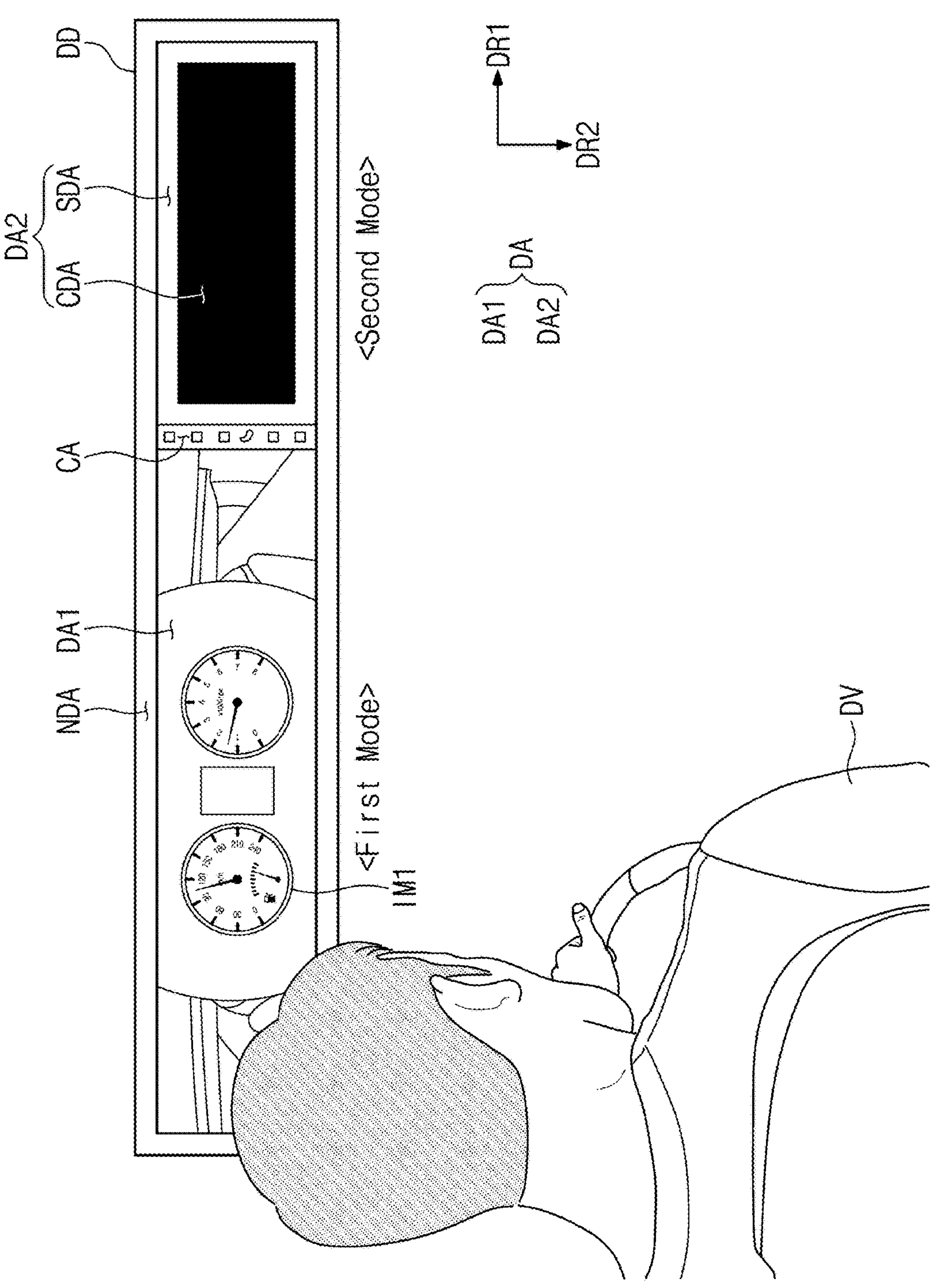
FIG. 2C illustrates the state of an electronic device including a first display region operating in a first mode and a mode switching region of a second display region, which operates in a second mode, according to an embodiment of the present disclosure.

FIG. 2A illustrates the state of an electronic device including a first display region and a second display region, which operate in a first mode, according to an embodiment of the present disclosure. FIG. 2B illustrates the state of an electronic device including a first display region operating in a first mode and a second display region operating in a second mode according to an embodiment of the present disclosure. FIG. 2C illustrates the state of an electronic device including a first display region operating in a first mode and a mode switching region of a second display region, which operates in a second mode, according to an embodiment of the present disclosure.

Referring to FIGS. 2A and 2B, the electronic device DD may have a plane defined by a first direction DR1 and a second direction DR2 crossing each other. The electronic device DD may have longer sides (relative to shorter sides) extending in the first direction DR1, and shorter sides (relative to the longer sides) extending in the second direction DR2. Although the electronic device DD may have the shape of a rectangle, the shape of the electronic device DD is not limited thereto. For example, the electronic device DD may have various shapes. In addition, corners of the electronic device DD, which connect the longer sides to the shorter sides, may have the shape of a curve.

Although a front surface of the electronic device DD may be defined as a display surface, the front surface may have the plane defined by the first direction DR1 and the second direction DR2. Images generated from the electronic device DD may be provided to a user through the display surface.

The electronic device DD may include a display region DA and a non-display region NDA around the display region DA. An image may be displayed in the display region DA, and an image is not displayed in the non-display region NDA. The non-display region NDA may surround the display region DA and may define an edge of the electronic device DD printed with a specific color. For example, the non-display region NDA may correspond to a bezel of the electronic device DD.

According to an embodiment of the present disclosure, the display region DA includes a first display region DA1 and a second display region DA2. The first display region DA1 and the second display region DA2 may be adjacent to each other in the first direction DR1, and may have an intermediate region CA interposed between the first display region DA1 and the second display region DA2. A first image IM1 may be displayed in the first display region DA1, and a second image IM2 may be displayed in the second display region DA2. The first display region DA1 is a region positioned in front of a driver seat of the vehicle AM (see FIG. 1) (e.g., disposed more proximate to the front of the driver seat than the front of a passenger seat), and the second display region DA2 may be a region positioned in front of a passenger seat (e.g., disposed more proximate to the front of the passenger seat than the front of the driver seat). In some embodiments, the intermediate region CA between the first display region DA1 and the second display region DA2 may be omitted.

According to an embodiment of the present disclosure, the first display region DA1 and the second display region DA2 may operate independently from each other. For example, the first display region DA1 may display an image only in the first mode, while the second display region DA2 may selectively operate in the first mode or the second mode. In this case, the first mode may be referred to as a public mode or a wide viewing angle mode, and the second mode may be referred to as a private mode or a narrow viewing angle mode. When the second display region DA2 operates in the second mode, the viewing field of the displayed image may be narrowed, such that the image is primarily visible only when viewed from the front. As a result, adjacent viewers, such as a person sitting to the side of the user sitting in front of the second display region DA2 (e.g., the driver), are unable to see the image displayed in the second display region DA2. In contrast, when both the first display region DA1 and the second display region DA2 operate in the first mode, the viewing field is widened, allowing the image to be visible even from side angles.

In embodiments of the present disclosure, the independent mode operation of the first display region DA1 and the second display region DA2 may affect how image signals are processed and compensated. Because the second display region DA2 can operate in either the first mode or the second mode, the image output characteristics may vary depending on the selected mode. For example, when operating in the second mode, the narrowed viewing angle may result in light being directed more narrowly toward the front, while the first mode may distribute light more broadly. These differences may lead to varying degradation behaviors across the display regions and modes, which can affect long-term image quality if not properly managed.

To address this, embodiments of the present disclosure may employ a region-aware and mode-aware image compensation system. For example, degradation characteristics may be tracked independently for each display region, and for each mode of the second display region. By maintaining separate compensation data depending on whether the second display region DA2 is operating in the first or second mode, more accurate afterimage correction and luminance stabilization can be achieved, which may improve long-term display quality and reduce artifacts that may otherwise arise from mixed-mode operation.

This approach may also support the efficient use of memory resources. Rather than storing overlapping degradation histories that blend behavior across modes, the system may partition storage so that degradation data relevant to each region and mode is accumulated independently. This structure enables precise compensation without requiring excessive memory or processing overhead.

As illustrated in FIG. 2A, the first display region DA1 and the second display region DA2 may operate in the first mode. In the first mode, a driver DV of the vehicle AM may view the second image IM2 displayed in the second display region DA2, in addition to the first image IM1 displayed in the first display region DA1. In addition, in the first mode, a passenger sitting in the passenger seat may view the first image IM1 displayed in the first display region DA1, in addition to the second image IM2 displayed in the second display region DA2.

As illustrated in FIG. 2B, the first display region DA1 may operate in the first mode, and the second display region DA2 may operate in the second mode. In this case, although the driver DV can view the first image IM1 displayed in the first display region DA1, the driver DV cannot view the second image IM2 displayed in the second display region DA2.

According to an embodiment of the present disclosure, the mode switching (e.g., switching from the first mode to the second mode, or the switching from the second mode to the first mode) in the second display region DA2 may be performed automatically depending on a driving speed of the vehicle AM. For example, the second display region DA2 may operate in the first mode when the driving speed of the vehicle AM is about equal to or less than a specific reference speed. However, when the driving speed of the vehicle AM exceeds the reference speed, an operating mode of the second display region DA2 may be switched to the second mode. Accordingly, in embodiments, when the driving speed exceeds the reference speed, the driver DV cannot view the second image IM2 displayed in the second display region DA2. In an embodiment, the mode switching in the second display region DA2 may be performed through handling (or setting) (e.g., manually) by a user, regardless of the driving speed.

As illustrated in FIG. 2C, the first display region DA1 may operate in the first mode, and a partial region (that is, a mode switching region CDA) of the second display region DA2 may operate in the second mode. Although the mode switching region CDA of the second display region DA2 operates in the second mode, a remaining region (that is, an outer region SDA) of the second display region DA2 except for the mode switching region CDA may operate in the first mode. In this case, although the driver DV can view an outer image displayed on the outer region SDA of the second display region DA2, the driver DV cannot view a central image displayed on the mode switching region CDA of the second display region DA2.

Figure 3A:
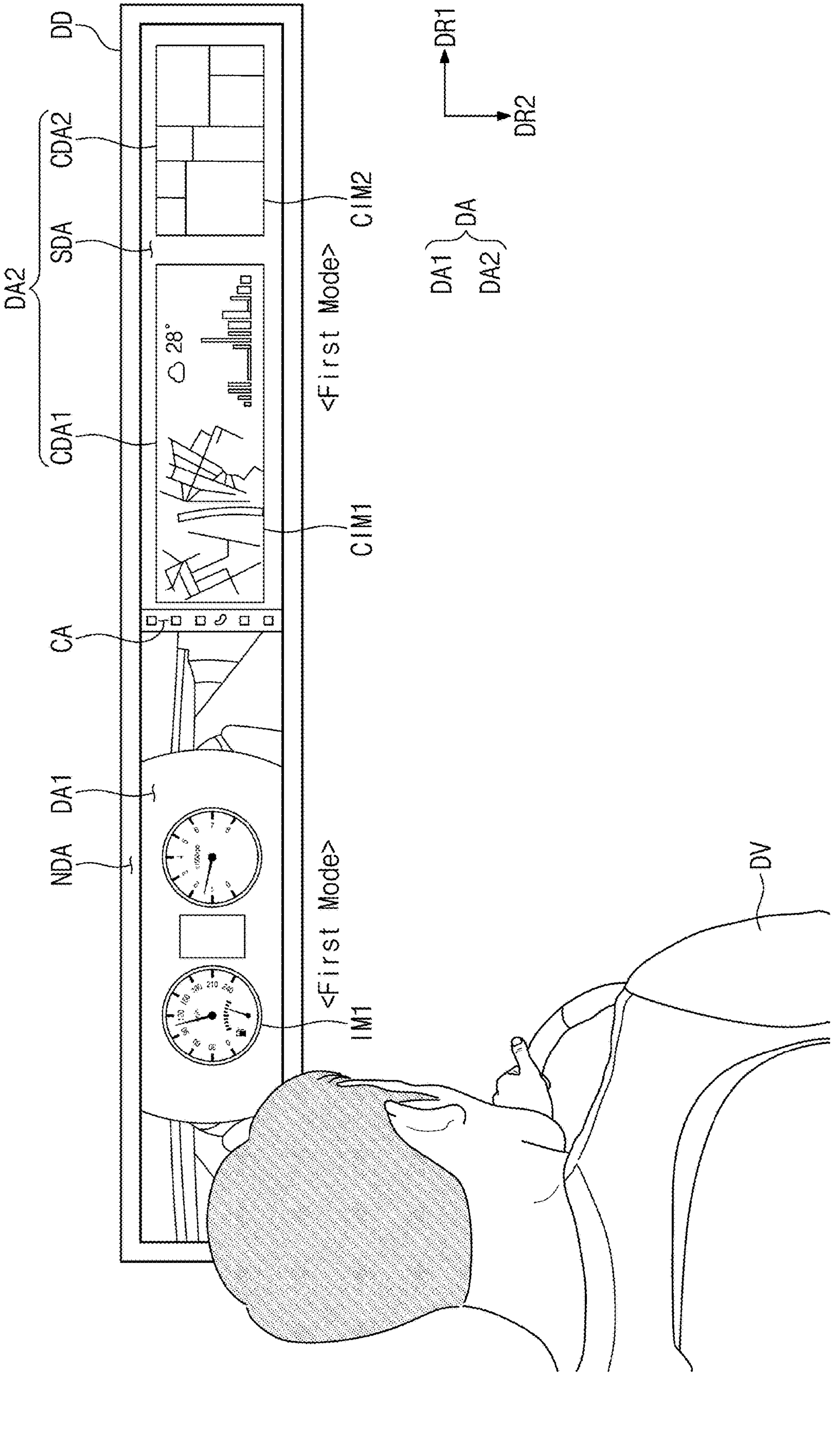
FIG. 3A illustrates the state of an electronic device including a first display region and a second display region, which operate in a first mode, according to an embodiment of the present disclosure.
Figure 3B:
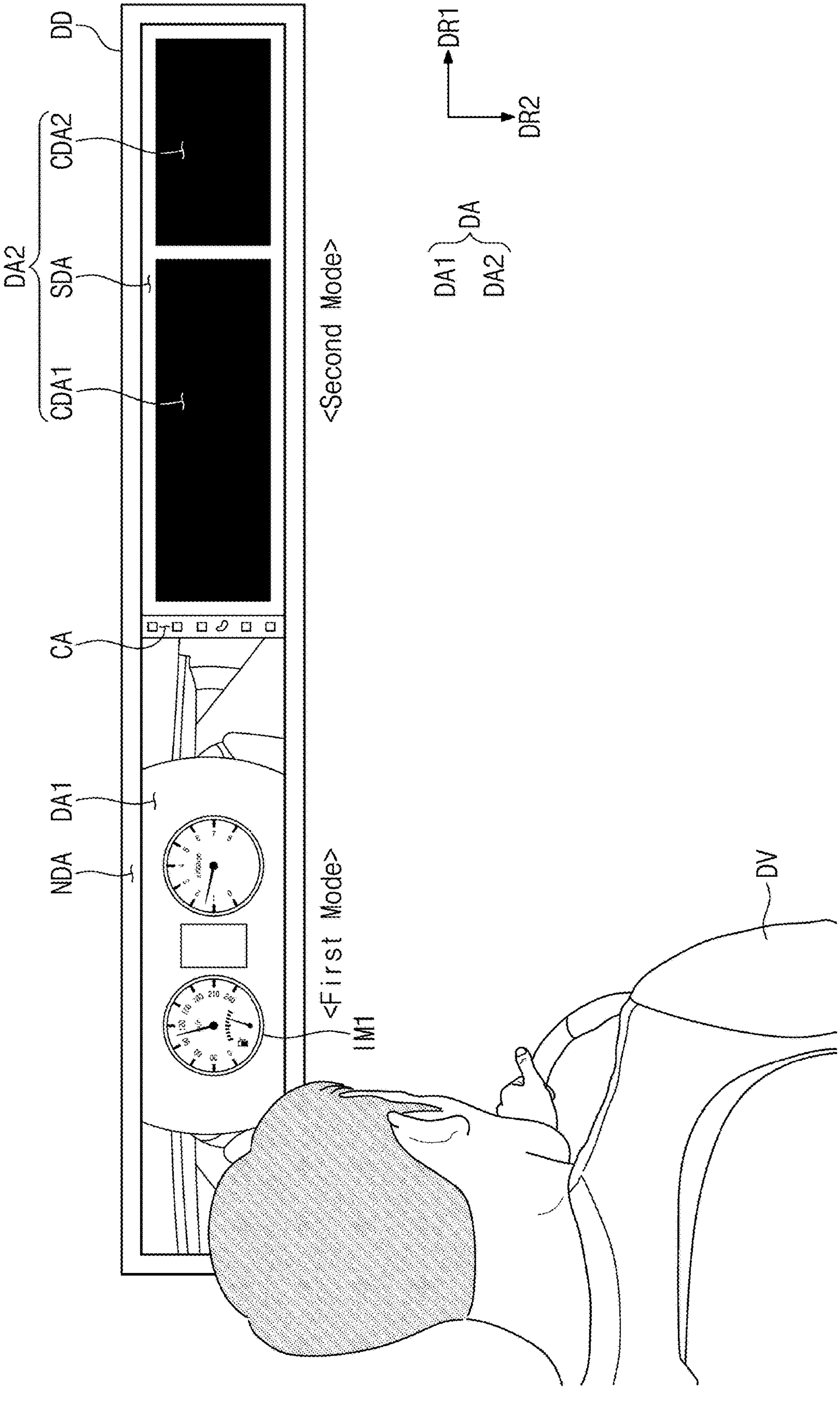
FIG. 3B illustrates the state of an electronic device including a first display region operating in a first mode and first and second mode switching regions of a second display region, which operates in a second mode, according to an embodiment of the present disclosure.

FIG. 3A illustrates the state of an electronic device including a first display region and a second display region, which operate in a first mode, according to an embodiment of the present disclosure. FIG. 3B illustrates the state of an electronic device including a first display region operating in a first mode and first and second mode switching regions of a second display region, which operates in a second mode, according to an embodiment of the present disclosure.

As illustrated in FIG. 3A, the first display region DA1 and the second display region DA2 may operate in the first mode. In the first mode, the driver DV of the vehicle AM may view the second image IM2 displayed in the second display region DA2, in addition to the first image IM1 displayed in the first display region DA1. According to an embodiment of the present disclosure, the second display region DA2 may include a first mode switching region CDA1 that displays a first central image CIM1, a second mode switching region CDA2 that displays a second central image CIM2, and the outer region SDA that surrounds the first and second mode switching regions CDA1 and CDA2. The first mode switching region CDA1 and the second mode switching region CDA2 may be spaced apart from each other in the first direction DR1. However, the present disclosure is not limited thereto. For example, the first mode switching region CDA1 and the second mode switching region CDA2 may be spaced apart from each other in a direction (e.g., the second direction DR2) different from the first direction DR1 according to embodiments. In addition, the mode switching regions provided in the second display region DA2 may be varied in number and shape. When the second display region DA2 operates in the first mode, the first mode switching region CDA1, the second mode switching region CDA2, and the outer region SDA may operate in the first mode.

As illustrated in FIG. 3B, the first display region DA1 may operate in the first mode, and a partial region (that is, at least one of the first mode switching region CDA1 and the second mode switching region CDA2) of the second display region DA2 may operate in the second mode. In this case, the outer region SDA of the second display region DA2 may operate in the first mode. When the first mode switching region CDA1 and the second mode switching region CDA2 operate in the second mode, the driver DV can view an outer image on the outer region SDA of the second display region DA2, but cannot view the first central image CIM1 and the second central image CIM2 displayed on the first mode switching region CDA1 and the second mode switching region CDA2 of the second display region DA2, respectively.

Figure 4A:
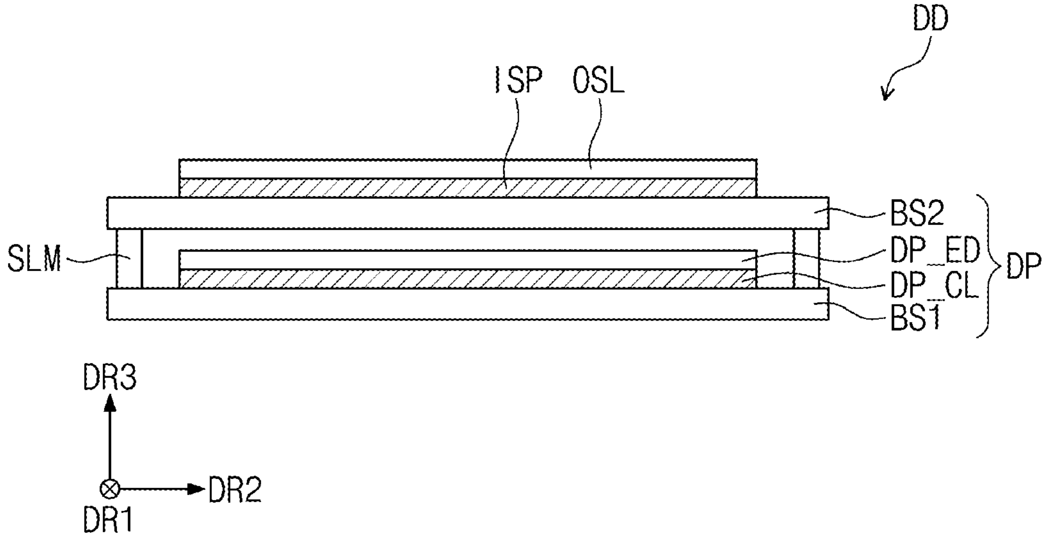
FIG. 4A is a cross-sectional view of an electronic device according to an embodiment of the present disclosure.
Figure 4B:
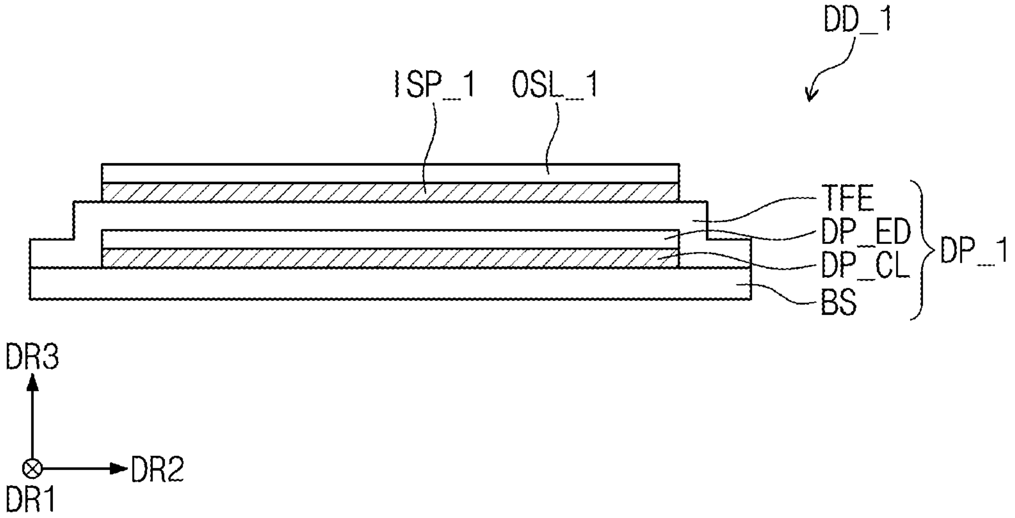
FIG. 4B is a cross-sectional view of an electronic device according to an embodiment of the present disclosure.
Figure 5A:
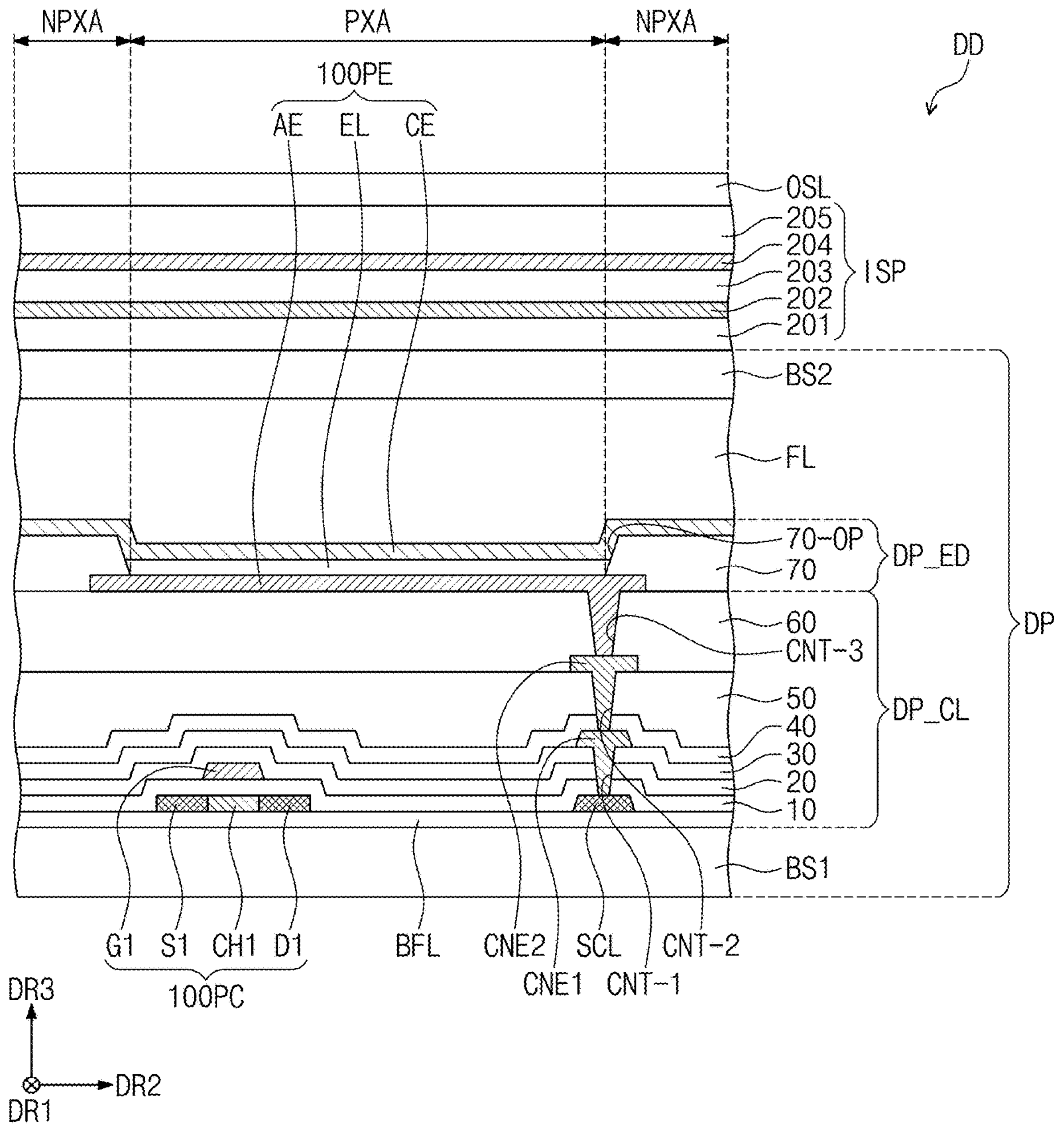
FIG. 5A is an enlarged cross-sectional view illustrating a portion of an electronic device illustrated in FIG. 4A.
Figure 5B:
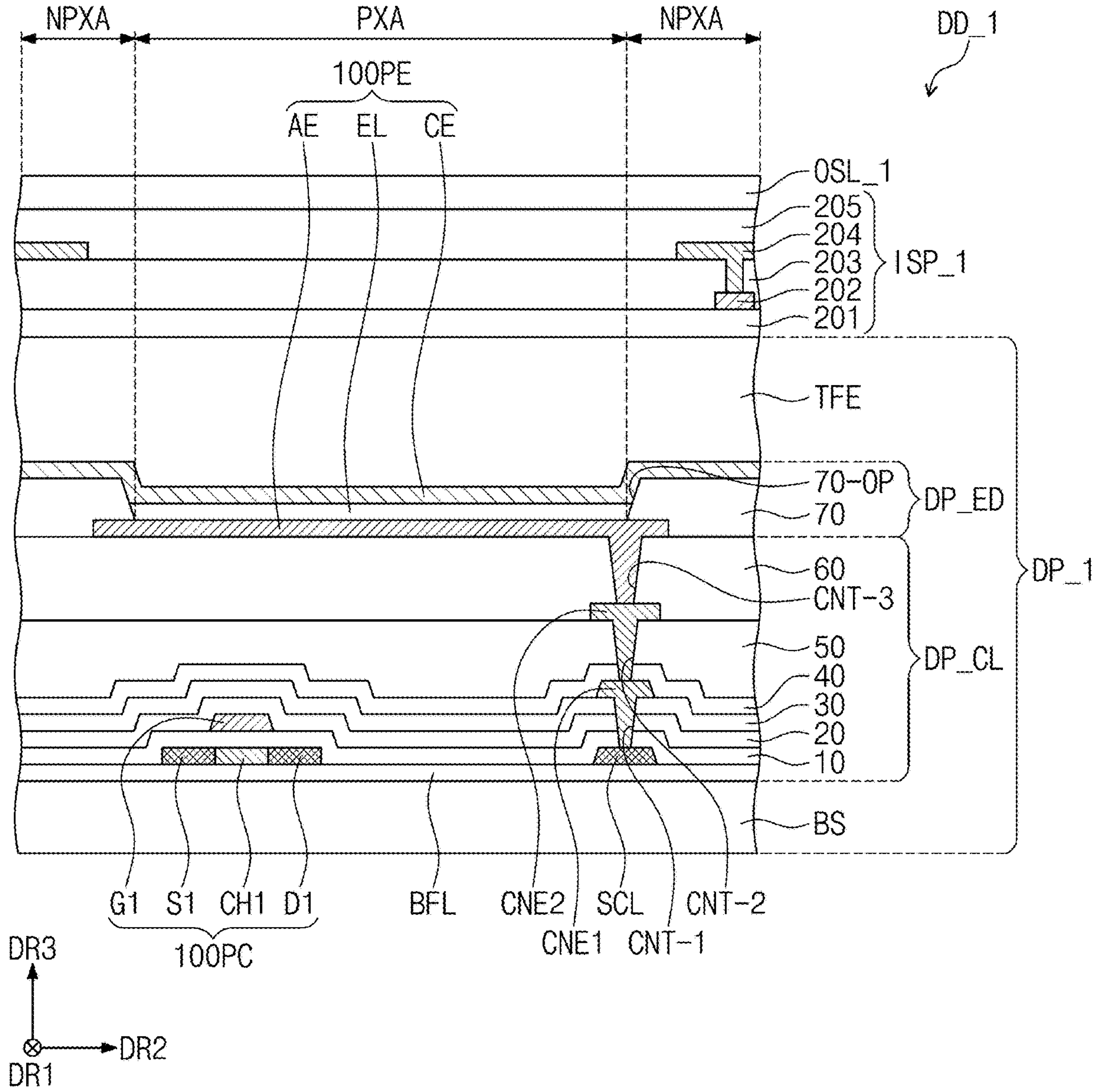
FIG. 5B is an enlarged cross-sectional view illustrating a portion of an electronic device illustrated in FIG. 4B.

FIG. 4A is a cross-sectional view of an electronic device according to an embodiment of the present disclosure, and FIG. 4B is a cross-sectional view of an electronic device according to an embodiment of the present disclosure. FIG. 5A is an enlarged cross-sectional view illustrating a portion of an electronic device illustrated in FIG. 4A. FIG. 5B is an enlarged cross-sectional view illustrating a portion of an electronic device illustrated in FIG. 4B.

Referring to FIG. 4A, the electronic device DD may include a display panel DP and an input sensing layer ISP. The input sensing layer ISP may be referred as an input sensing panel.

The display panel DP may include a first base layer BS1, a display circuit layer DP_CL, a display element layer DP_ED, a second base layer BS2, and a coupling member SLM. The input sensing layer ISP may be disposed on the second base layer BS2.

Each of the first base layer BS1 and the second base layer BS2 may be a stack structure including, for example, a silicon substrate, a plastic substrate, a glass substrate, an insulating film, or a plurality of insulating layers.

The display circuit layer DP_CL may be disposed on the first base layer BS1. The display circuit layer DP_CL may include a plurality of insulating layers, a plurality of conductive layers, and a semiconductor layer. The plurality of conductive layers of the display circuit layer DP_CL may constitute signal lines or a control circuit of a pixel.

The display element layer DP_ED may be disposed on the display circuit layer DP_CL. The display element layer DP_ED may include light-emitting elements. For example, the display element layer DP_ED may include an organic light emitting diode, an inorganic light emitting diode, a quantum dot, a quantum rod, a micro-LED, or a nano-LED.

The second base layer BS2 may be disposed on the display element layer DP_ED. A specific space may be defined between the second base layer BS2 and the display element layer DP_ED. The space may be filled with air or inert gas. In addition, according to an embodiment of the present disclosure, the space may be filled with a filling layer FL (see FIG. 5A) such as, for example, a silicone-based polymer, an epoxy-based resin, or an acrylic-based resin.

The coupling member SLM may be interposed between the first base layer BS1 and the second base layer BS2. The coupling member SLM may couple the first base layer BS1 to the second base layer BS2. The coupling member SLM may include an organic material such as, for example, photocurable resin or photoplastic resin, or an inorganic material such as, for example, a frit seal, but the present disclosure is not limited to any one embodiment.

The input sensing layer ISP may include a plurality of insulating layers and a plurality of conductive layers. The plurality of conductive layers may form sensing electrodes to sense an external input, sensing line electrically connected to the sensing electrodes, and sensing pads electrically connected to the sensing lines.

The electronic device DD may further include an optical path control layer OSL. The optical path control layer OSL may be disposed on the input sensing layer ISP. The optical path control layer OSL may include a structure to control a path of light output from the display panel DP.

Referring to FIG. 4B, an electronic device DD_1 may include a display panel DP_1, an input sensing layer ISP_1, and an optical path control layer OSL_1.

The display panel DP_1 may include the base layer BS, the display circuit layer DP_CL, the display element layer DP_ED, and an encapsulating layer TFE. The base layer BS may be a flexible type. The input sensing layer ISP_1 may be disposed on the encapsulating layer TFE. According to an embodiment of the present disclosure, the display panel DP_1 and the input sensing layer ISP_1 may be formed through subsequent process. In other words, the input sensing layer ISP_1 may be directly formed on the encapsulating layer TFE.

The optical path control layer OSL_1 may be disposed on the input sensing layer ISP_1. The optical path control layer OSL_1 may be formed through subsequent processes to the display panel DP_1 and the input sensing layer ISP_1, such that the optical path control layer OSL_1 is directly disposed on the input sensing layer ISP_1. However, the present disclosure is not limited thereto. For example, the optical path control layer OSL_1 may be bonded to the input sensing layer ISP_1 through an adhesive layer. The configuration of the optical path control layer OSL or OSL_1 will be described in further detail with reference to FIGS. 10A and 10B.

Referring to FIGS. 4A and 5A, at least one inorganic layer may be formed on a top surface of the first base layer BS1 in the display panel DP. The inorganic layer may include at least one of, for example, aluminum oxide, titanium oxide, silicon oxide, silicon oxynitride, silicon nitride, zirconium oxide, and hafnium oxide. The inorganic layer may have a multiple-layer structure. Inorganic layers in a multi-layer may form a barrier layer and/or a buffer layer. According to an embodiment, the display panel DP is illustrated as including a buffer layer BFL.

The buffer layer BFL may improve a bonding force between the first base layer BS1 and the semiconductor pattern. The buffer layer BFL may include a silicon oxide layer and a silicon nitride layer, and the silicon oxide layer and the silicon nitride layer may be alternately stacked.

The semiconductor pattern may be disposed on the buffer layer BFL. The semiconductor pattern may include polysilicon. However, the present disclosure is not limited thereto. For example, the semiconductor pattern may include amorphous silicon, low-temperature polycrystalline silicon, or an oxide semiconductor.

FIG. 5A illustrates only a portion of the semiconductor pattern, and the semiconductor pattern may be further disposed in another region. The semiconductor pattern may be provided across pixels in a specific rule. The semiconductor pattern may have electrical properties varied depending on a doping state. The semiconductor patterns may include a first region having higher conductivity and a second region having lower conductivity. The first region may be doped with an N-type dopant or a P-type dopant. A P-type transistor may include a doping region doped with the P-type dopant, and an N-type transistor may include a doping region doped with the N-type dopant. The second region may be an undoped region or may be doped at a concentration lower than that of the first region.

A conductivity of the first region may be greater than a conductivity of the second region and may substantially serves as an electrode or a signal line. The second region may substantially correspond to a channel region (or an active region) of a transistor. In other words, a portion of the semiconductor pattern may be a channel part of a transistor, another portion of the semiconductor pattern may be a source or a drain, and still another portion of the semiconductor pattern may be a connection electrode or a connection signal line.

Each of pixels may have an equivalent circuit including a plurality of transistors, at least one capacitor, and at least one light-emitting element, and the equivalent circuit of the pixel may be modified in various forms. One transistor 100PC and one light-emitting element 100PE that are included in one pixel are illustrated in FIG. 5A.

The transistor 100PC may include a source S1, a channel part CH1, a drain D1, and a gate G1. The source S1, the channel part CH1, and the drain D1 may be formed from the semiconductor pattern. The source S1 and the drain D1 may extend from the channel region CH1 in opposite directions, when viewed in a cross-sectional view. A portion of connection signal line SCL formed from the semiconductor pattern is illustrated in FIG. 5A. The connection signal line SCL may be connected to the drain D1 of the transistor 100PC, when viewed in a plan view.

A first insulating layer 10 may be disposed on the buffer layer BFL. The first insulating layer 10 may overlap a plurality of pixels in common and may cover the semiconductor pattern. The first insulating layer 10 may be an inorganic layer and/or an organic layer, and may have a single-layer structure or a multi-layer structure. The first insulating layer 10 may include at least one of, for example, aluminum oxide, titanium oxide, silicon oxide, silicon nitride, silicon oxynitride, zirconium oxide, or hafnium oxide. According to an embodiment, the first insulating layer 10 may be a silicon oxide layer in a single layer. In addition to the first insulating layer 10, insulating layers of the display circuit layer DP_CL, which is to be described below, may be an inorganic layer and/or an organic layer, and may have a single-layer structure or a multi-layer structure. The inorganic layer may include at least one of the materials described above, but the present disclosure is not limited thereto.

The gate G1 is disposed on the first insulating layer 10. The gate G1 may be a portion of a metal pattern. The gate G1 is overlapped with the channel part CH1. The gate G1 may function as a mask in the process for doping the semiconductor pattern.

A second insulating layer 20 may be disposed on the first insulating layer 10 and may cover the gate G1. The second insulating layer 20 may be commonly overlapped with the pixels. The second insulating layer 20 may be an inorganic layer and/or an organic layer, and may have a single-layer structure or a multi-layer structure. The second insulating layer 20 may include at least one of, for example, silicon oxide, silicon nitride, or silicon oxynitride. According to an embodiment, the second insulating layer 20 may have a multi-layer structure including a silicon oxide layer and a silicon nitride layer.

A third insulating layer 30 may be disposed on the second insulating layer 20. The third insulating layer 30 may have a single-layer structure or a multi-layer structure. For example, the third insulating layer 30 may have a multi-layer structure including a silicon oxide layer and a silicon nitride layer.

A first connection electrode CNE1 may be disposed on the third insulating layer 30. The first connection electrode CNE1 may be connected to the connection signal line SCL through a contact hole CNT-1 formed through the first, second, and third insulating layers 10, 20, and 30.

A fourth insulating layer 40 may be disposed on the third insulating layer 30. The fourth insulating layer 40 may be a silicon oxide layer in a single layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 formed through the fourth insulating layer 40, and the fifth insulating layer 50.

A sixth insulating layer 60 may be disposed on the fifth insulating layer 50 to cover the second connection electrode CNE2. The sixth insulating layer 60 may be an organic layer.

The display element layer DP_ED may be disposed on the display circuit layer DP_CL. The display element layer DP_ED may include a light-emitting element 100PE and a pixel defining layer 70. For example, the display element layer DP_ED may include an organic light emitting material, an inorganic light emitting material, a quantum dot, a quantum rod, a micro-LED, or a nano-LED. The following description will be described assuming that the light-emitting element 100PE is an organic light-emitting element, but the present disclosure is not limited thereto.

The light-emitting element 100PE may include a first electrode AE, a light-emitting layer EL, and a second electrode CE. The first electrode AE may be disposed on the sixth insulating layer 60. The first electrode AE may be connected to the second connection electrode CNE2 through a contact hole CNT-3 formed through the sixth insulating layer 60. The first electrode AE may be referred to as an anode.

The pixel defining layer 70 may be disposed on the sixth insulating layer 60 to cover a portion of the first electrode AE. An opening 70-OP is defined in the pixel defining layer 70. The opening 70-OP of the pixel defining layer 70 exposes at least a portion of the first electrode AE.

The display region DA (refer to FIG. 2A) may include a light-emitting region PXA and a non-light-emitting region NPXA adjacent to the light-emitting region PXA. The non-light-emitting region NPXA may surround the light-emitting region PXA. According to an embodiment, the light-emitting region PXA is defined to correspond to a partial region of the first electrode AE exposed by the opening 70-OP.

The light-emitting layer EL may be disposed on the first electrode AE. The light-emitting layer EL may be disposed in a region corresponding to the opening 70-OP. In other words, the light-emitting layer EL may be separately formed in each pixel. When the light-emitting layer EL is separately formed in each pixel, each of the light-emitting layers EL may emit a light of at least one of a blue color, a red color, or a green color. However, the present disclosure is not limited thereto. For example, the light-emitting layer EL may be formed in the pixels in common. In this case, the light-emitting layer EL may provide a blue color or may provide a white color.

The second electrode CE may be disposed on the light-emitting layer EL. The second electrode CE may be formed in an integral form and may be disposed in the pixels in common. The second electrode CE may be referred to as a cathode.

A hole control layer may be interposed between the first electrode AE and the light-emitting layer EL. The hole control layer may be disposed in common in the light-emitting region PXA and the non-light-emitting region NPXA. The hole control layer may include a hole transport layer and may further include a hole injection layer. An electron control layer may be disposed between the light-emitting layer EL and the second electrode CE. The electron control layer may include an electron transport layer and may further include an electron injection layer. The hole control layer and the electron control layer may be formed, in common, in the plurality of pixels by using an open mask.

The second base layer BS2 may be disposed on the display element layer DP_ED. According to an embodiment of the present disclosure, the first base layer BS1 and the second base layer BS2 may be a rigid type.

The filling layer FL may be disposed between the first base layer BS1 and the second base layer BS2. The filling layer FL may be disposed in a space sealed by the coupling member SLM (see FIG. 4A) between the first base layer BS1 and the second base layer BS2. The filling layer FL may include a thermosetting material.

The input sensing layer ISP may be disposed on the display panel DP. For example, the input sensing layer ISP may be disposed on the second base layer BS2.

Referring to FIGS. 4B and 5B, the encapsulating layer TFE may be disposed on the display element layer DP_ED. The encapsulating layer TFE may include an inorganic layer, an organic layer, and an inorganic layer sequentially stacked, and layers constituting the encapsulating layer TFE are not limited thereto.

The inorganic layers may protect the display element layer DP_ED from, for example, moisture and oxygen, and the organic layer may protect the display element layer DE_ED from a foreign material such as, for example, dust particles. The inorganic layers may include, for example, a silicon nitride layer, a silicon oxynitride layer, a silicon oxide layer, a titanium oxide layer, or an aluminum oxide layer. The organic layer may include an acrylic-based organic layer, but the present disclosure is not limited thereto.

The input sensing layer ISP_1 may be disposed on the display panel DP_1 through subsequent processes. In this case, it may be expressed that the input sensing layer ISP_1 is directly disposed on the display panel DP_1 (e.g., the encapsulating layer TFE). "The input sensing layer ISP_1 may be directly disposed on the display panel DP_1" refers to a configuration in which a third component is not interposed between the input sensing layer ISP_1 and the display panel DP_1. In other words, an additional adhesive member or coupling member is not disposed between the input sensing layer ISP_1 and the display panel DP_1 when one layer is directly disposed on the other. In an embodiment, the input sensing layer ISP_1 may be coupled to the display panel DP_1 through the adhesive member or the coupling member. The adhesive member may include a typical adhesive or a typical adhesion agent.

Referring to FIGS. 5A and 5B, the input sensing layers ISP and ISP_1 may include a base insulating layer 201, a first conductive layer 202, an intermediate insulating layer 203, a second conductive layer 204, and a cover insulating layer 205.

In an embodiment, the base insulating layer 201 may be an inorganic layer including at least one of, for example, silicon nitride, silicon oxynitride, or silicon oxide. In an embodiment, the base insulating layer 201 may be an organic layer including, for example, an epoxy resin, an acrylate resin, or an imide-based resin. The base insulating layer 201 may have a single-layer structure or may be a structure in which a plurality of layers are stacked in the third direction DR3.

Each of the first conductive layer 202 and the second conductive layer 204 may have a single-layer structure or a multi-layer structure including the layers stacked in the third direction DR3.

The conductive layer in a single layer structure may include a metal layer or a transparent conductive layer. The metal layer may include, for example, molybdenum, silver, titanium, copper, aluminum, or the alloy thereof. The transparent conductive layer may include a transparent conductive oxide, such as indium tin oxide, indium zinc oxide, zinc oxide, or indium zinc tin oxide. In addition, the transparent conductive layer may include, for example, conductive polymer, such as PEDOT, a metal nano-wire, or graphene.

The conductive layer in the multi-layer structure may include metal layers. The metal layers may, for example, have a three-layer structure of titanium/aluminum/titanium. The conductive layer in the multi-layer structure may include at least one metal layer and at least one transparent conductive layer.

At least one of the intermediate insulating layer 203 or the cover insulating layer 205 may include an inorganic film. The inorganic film may include at least one of, for example, aluminum oxide, titanium oxide, silicon oxide, silicon nitride, silicon oxynitride, zirconium oxide, or a hafnium oxide.

At least one of the intermediate insulating layer 203 or the cover insulating layer 205 may include an organic film. The organic film may include at least one of, for example, acrylic resin, methacryl resin, polyisoprene, a vinyl resin, epoxy resin, urethane resin, cellulose resin, siloxane resin, polyimide resin, polyamide resin, or perylene resin.

Figure 6:
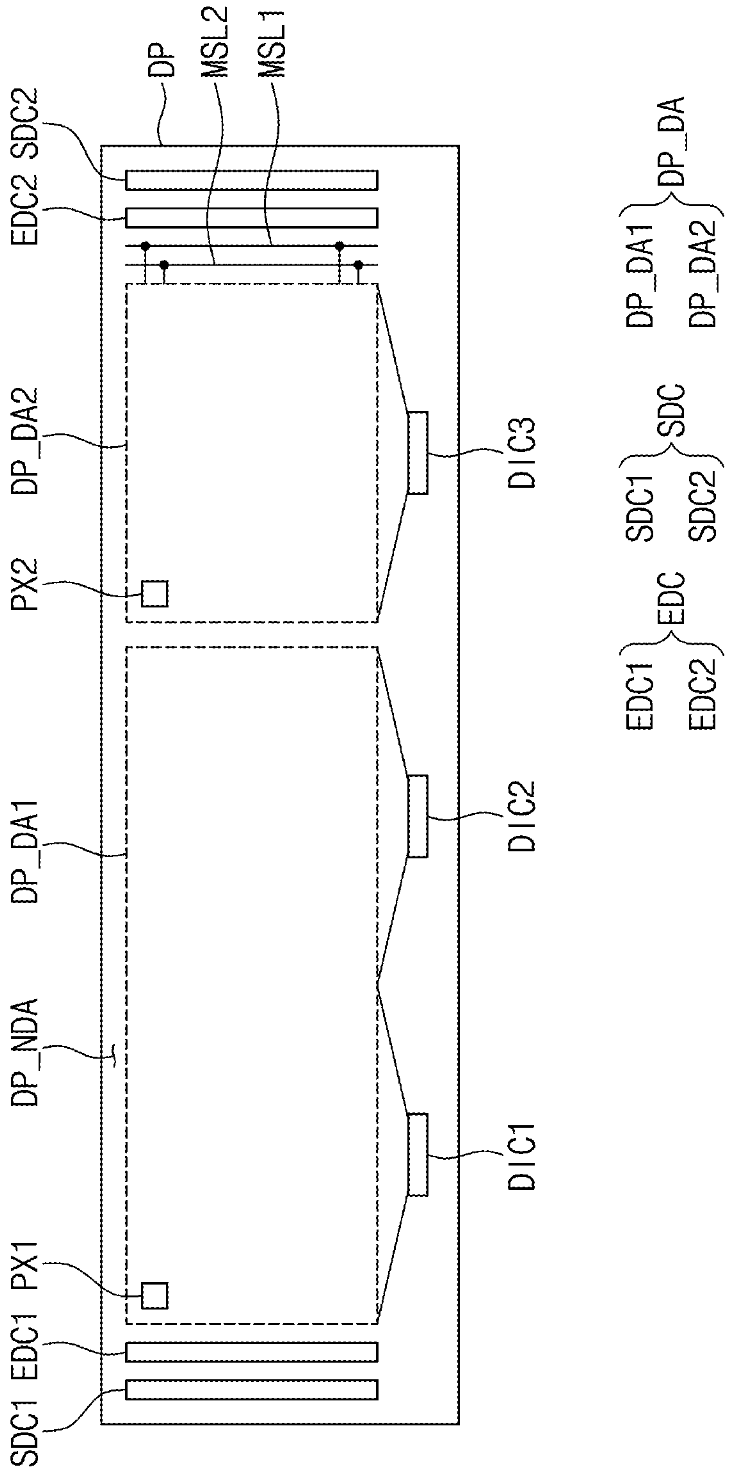
FIG. 6 is a block diagram of a display panel according to an embodiment of the present disclosure.

FIG. 6 is a block diagram of a display panel according to an embodiment of the present disclosure.

Referring to FIG. 6, the display panel DP may be a component configured to generate and display an image. The display panel DP may be an emissive-type display panel. For example, the display panel DP may be an organic light emitting display panel, a quantum dot display panel, a micro-LED display panel, or a nano-LED display panel.

The display panel DP includes a display region DP_DA and a non-display region DP_NDA adjacent to the display region DP_DA around the display region DP_DA. The display region DP_DA may be a region corresponding to the display region DA illustrated in FIG. 2A, and the non-display region DP_NDA may be a region corresponding to the non-display region NDA illustrated in FIG. 2A. The display region DP_DA may be a region in which an image is displayed, and the non-display region DP_NDA may be a bezel region in which an image is not displayed.

The display region DP_DA includes a first display region DP_DA1 and a second display region DP_DA2. The first display region DP_DA1 may be a region corresponding to the first display region DA1 illustrated in FIG. 2A, and the second display region DP_DA2 may be a region corresponding to the second display region DA2 illustrated in FIG. 2A. Although FIG. 6 illustrates the structure that the non-display region DP_NDA surrounds the first display region DP_DA1 and the second display region DP_DA2, the present disclosure is not limited thereto. In an embodiment, the non-display region DP_NDA may be disposed only on at least one side of the first display region DP_DA1 or second display region DP_DA2.

Although FIG. 6 illustrates that the size of the second display region DP_DA2 is smaller than the size of the first display region DP_DA1, the present disclosure is not limited thereto. For example, the size of the first display region DP_DA1 and the size of the second display region DP_DA2 may be about equal to each other in embodiments.

The display panel DP includes a plurality of pixels and signal lines connected to the plurality of pixels. Each of the plurality of pixels may include a light-emitting element. The signal lines may include, for example, data lines, scan lines, light-emitting control lines, and power lines. In this case, pixels disposed in the first display region DP_DA1 are referred to as first pixels PX1, and pixels disposed in the second display region DP_DA2 are referred to as second pixels PX2. According to an embodiment of the present disclosure, the first pixels PX1 and the second pixels PX2 may have the same shape and the same size. However, the present disclosure is not limited thereto, and the first pixels PX1 and the second pixels PX2 may have mutually different shapes and mutually different sizes in some embodiments.

The electronic device DD (see FIG. 2A) further includes a driving circuit that drives the display panel DP. The driving circuit may include a plurality of driving chips, a scan driving circuit SDC, and a light-emitting driving circuit EDC. The plurality of driving chips may include a first driving chip DIC1 and a second driving chip DIC2 connected to the first display region DP_DA1, and a third driving chip DIC3 connected to the second display region DP_DA2. The number of driving chips may be varied depending on the size and the resolution of the display region.

The scan driving circuit SDC includes a first scan driving circuit SDC1 connected to the first display region DP_DA1 and a second scan driving circuit SDC2 connected to the second display region DP_DA2. The light-emitting driving circuit EDC includes a first light-emitting driving circuit EDC1 connected to the first display region DP_DA1 and a second light-emitting driving circuit EDC2 connected to the second display region DP_DA2.

According to an embodiment of the present disclosure, the first scan driving circuit SDC1 and the first light-emitting driving circuit EDC1 are disposed on one side (e.g., a left side) of the first display region DP_DA1, and the second scan driving circuit SDC2 and the second light-emitting driving circuit EDC2 are disposed on one side (e.g., a right side) of the second display region DP_DA2. In an embodiment, the first scan driving circuit SDC1 and the first light-emitting driving circuit EDC1 may be disposed on opposite sides of the first display region DP_DA1, respectively, and the second scan driving circuit SDC2 and the second light-emitting driving circuit EDC2 may be disposed on opposite sides of the second display region DP_DA2, respectively.

A first switching line MSL1 and a second switching line MSL2 may be disposed on one side (e.g., the right side) of the second display region DP_DA2. The first switching line MSL1 and the second switching line MSL2 are connected to the second pixels PX2.

The first switching line MSL1 and the second switching line MSL2 may receive first and second switching signals MS1 and MS2 (see FIG. 7) from a driving controller T_CON (see FIG. 11A) which controls driving of the scan driving circuit SDC and the light-emitting driving circuit EDC, respectively.

Figure 7:
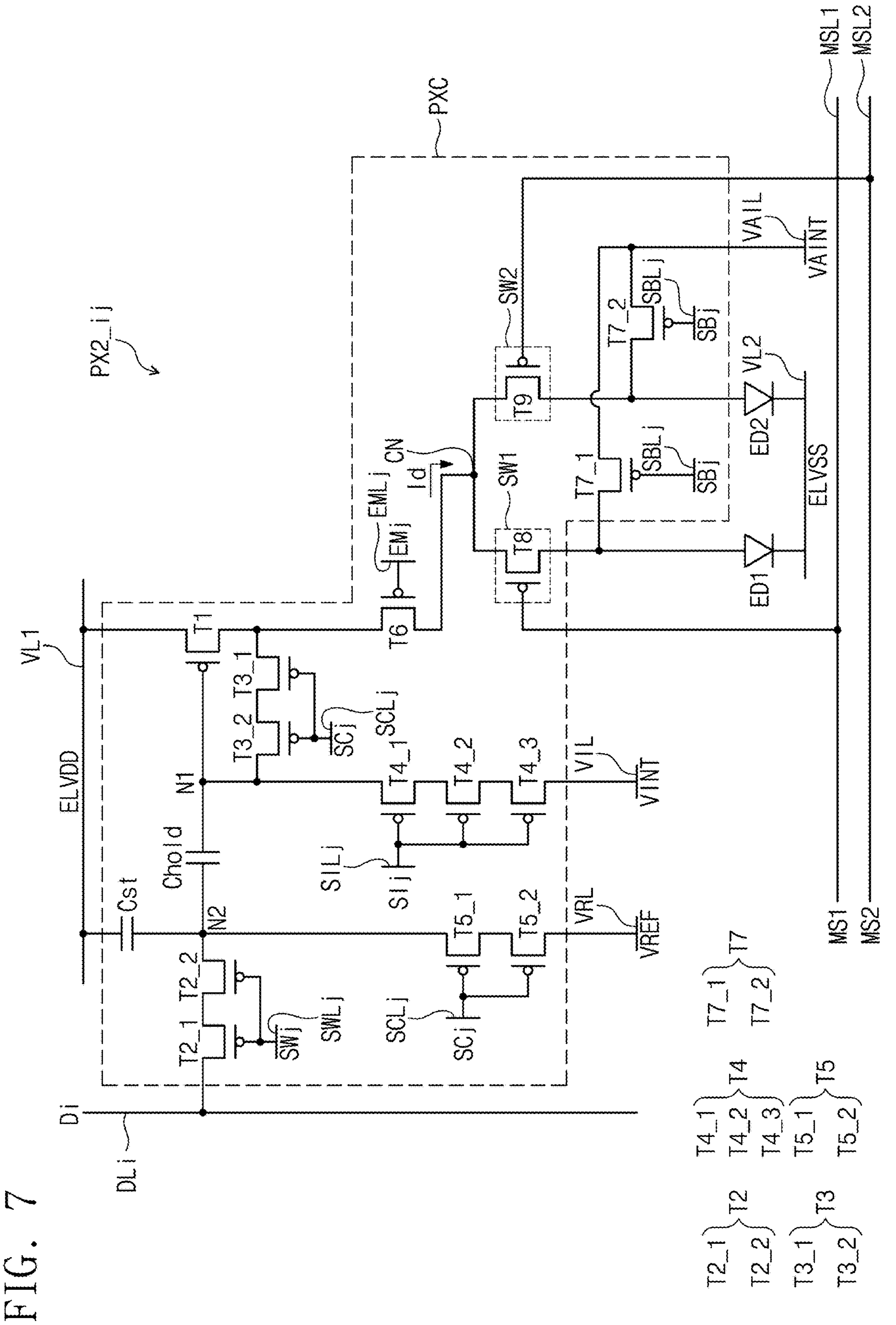
FIG. 7 is a circuit diagram of a second pixel according to an embodiment of the present disclosure.
Figure 8:
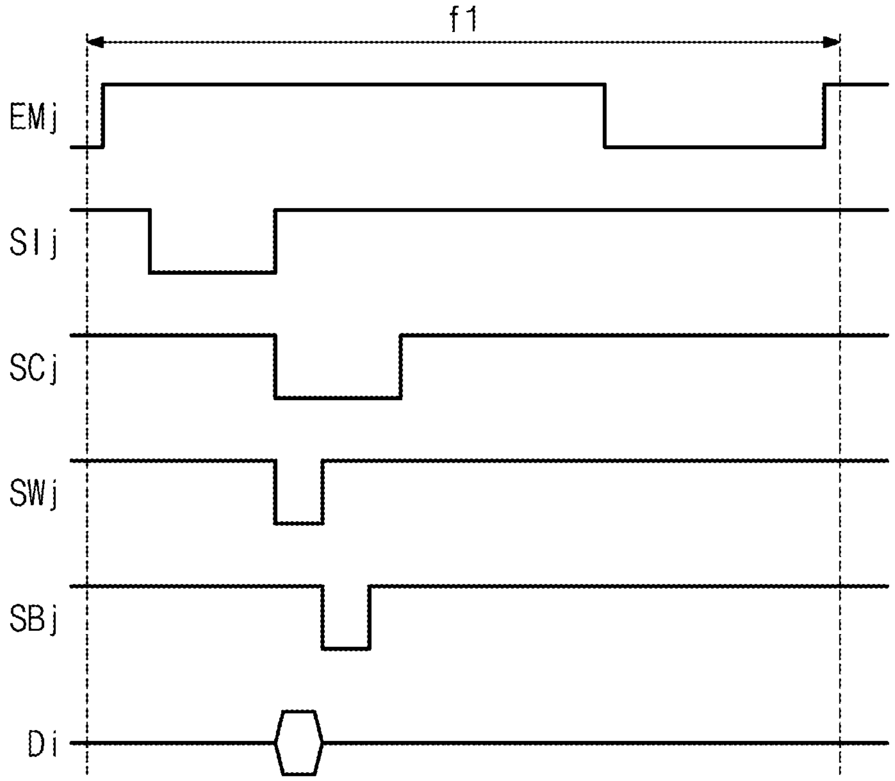
FIG. 8 is a waveform diagram for describing an operation of a second pixel illustrated in FIG. 7.

FIG. 7 is a circuit diagram of a second pixel according to an embodiment of the present disclosure. FIG. 8 is a waveform diagram illustrating the operation of the second pixel illustrated in FIG. 7. FIG. 7 illustrates an equivalent circuit diagram of a second pixel PX2_*ij* which is one of a plurality of second pixels PX2 illustrated in FIG. 6. Hereinafter, for convenience of description, since each of the second pixels PX2 has the same circuit structure, the circuit structure of the second pixel PX2_*ij* will be representatively described, and the details of remaining second pixels will be omitted.

Referring to FIG. 7, the second pixel PX2_*ij* is connected to an i-th data line DLi (hereinafter, a data line) of a plurality of data lines, connected to a j-th initializing scan line SILj (hereinafter, an initializing scan line), a j-th compensating scan line SCLj (hereinafter, a compensating scan line), a j-th write scan line SWLj (hereinafter, a write scan line), and a j-th black scan line SBLj (hereinafter, a black scan line) of a plurality of scan lines, and connected to a j-th light-emitting control line EMLj (hereinafter, a light-emitting control line) of a plurality of light-emitting control lines, where each of i and j is a positive integer. According to an embodiment of the present disclosure, the second pixel PX2_*ij* is connected to the first switching line MSL1 and the second switching line MSL2.

The second pixel PX2_*ij* includes a first light-emitting element (or referred to as a wide light-emitting element) ED1, a second light-emitting element (or referred to as a narrow light-emitting element) ED2, and a pixel circuit PXC. The pixel circuit PXC may include first to ninth transistors T1, T2, T3, T4, T5, T6, T7, T8, and T9, a first capacitor Cst, and a second capacitor Chold. Each of the first to ninth transistors T1, T2, T3, T4, T5, T6, T7, T8, and T9 may be a transistor having a low-temperature polycrystalline silicon (LTPS) semiconductor layer. The first to ninth transistors T1, T2, T3, T4, T5, T6, T7, T8, and T9 may be P-type transistors. However, the present disclosure is not limited thereto. For example, according to an embodiment, all of the first to ninth transistors T1 to T9 may be N-type transistors. According to an embodiment, some of the first to ninth transistors T1 to T9 may be P-type transistors, and the remaining transistors may be N-type transistors. For example, among the first to ninth transistors T1 to T9, the first, second, and fifth to ninth transistors T1, T2, and T5 to T9 may be P-type transistors, and third and fourth transistors T3 and T4 may be N-type transistors including oxide semiconductors serving as semiconductor layers. However, a configuration of the pixel circuit PXC according to embodiments of the present disclosure is not limited to the embodiment illustrated in FIG. 7. The pixel circuit PXC illustrated in FIG. 7 is provided only for the illustrative purpose, and the configuration of the pixel circuit PXC may be modified according to embodiments. For example, the first to ninth transistors T1 to T9 may be all P-type transistors or N-type transistors.

The initializing scan line SILj, the compensating scan line SCLj, the write scan line SWLj, the black scan line SBLj, and the light-emitting control line EMLj may apply a j-th initializing scan signal SIj (hereinafter, an initializing scan signal), a j-th compensating scan signal SCj (hereinafter, a compensating scan signal), a j-th write scan signal SWj (hereinafter, a write scan signal), a j-th black scan signal SBj (hereinafter, a black scan signal), and a j-th light-emitting control signal EMj (hereinafter, a light-emitting control signal) to the second pixel PX2_*ij*. The data line DLi applies a data signal Di to the second pixel PX2_*ij*. The first switching line MSL1 may apply the first switching signal MS1 to the second pixel PX2_*ij*, and the second switching line MSL2 may apply the second switching signal MS2 to the second pixel PX2_*ij*.

First and second driving voltage lines VL1 and VL2 may supply the first and second driving voltages ELVDD and ELVSS to the second pixel PX2_*ij*. The second pixel PX2_*ij* may receive a first initializing voltage VINT and a second initializing voltage AINT through the first and second initializing voltage lines VIL and VAIL, respectively. The second pixel PX2_*ij* may further receive a reference voltage VREF through a reference voltage line VRL. Although FIG. 7 illustrates a structure in which five voltage lines are connected to the second pixel PX2_*ij*, the number of voltage lines connected to the second pixel PX2_*ij* may be variously changed.

The first transistor T1 includes a first electrode connected to the first driving voltage line VL1, a second electrode electrically connected to a common node CN through the sixth transistor T6, and a gate electrode connected to a first terminal (or a first node N1) of the second capacitor Chold. The first transistor T1 may receive a data signal Di transmitted through the data line DLi in response to a switching operation of the second transistor T2 and may supply the driving current Id to the common node CN.

The second transistor T2 may include a (2-1)-th transistor T2_1 and a (2-2)-th transistor T2_2. The (2-1)-th transistor T2_1 includes a first electrode connected to the data line DLi, a second electrode connected to a first electrode of the (2-2)-th transistor T2_2, and a gate electrode connected to the write scan line SWLj. The (2-2)-th transistor T2_2 includes the first electrode connected to the second electrode of the (2-1)-th transistor T2_1, a second electrode connected to a second terminal (or referred to as a "second node" N2) of the second capacitor Chold, and the gate electrode connected to the write scan line SWLj. The (2-1)-th and (2-2)-th transistors T2_1 and T2_2 may be turned on in response to the write scan signal SWj received through the write scan line SWLj to transmit the data signal Di, which is received through the data line DLi, to the gate electrode of the first transistor T1.

The first terminal of the first capacitor Cst is connected to the second node N2, and the second terminal of the first capacitor Cst is connected to the first driving voltage line VL1.

The third transistor T3 may include a (3-1)-th transistor T3_1 and a (3-2)-th transistor T3_2. The (3-1)-th transistor T3_1 includes a first electrode connected to the second electrode of the first transistor T1, a second electrode connected to a first electrode of the (3-2)-th transistor T3_2, and a gate electrode connected to the compensating scan line SCLj. The (3-2)-th transistor T3_2 includes the first electrode connected to the second electrode of the (3-1)-th transistor T3_1, the second electrode connected to the gate electrode (that is, the first node N1) of the first transistor T1, and a gate electrode connected to the compensating scan line SCLj. The (3-1)-th transistor T3_1 and the (3-2)-th transistor T3_2 may be turned on in response to the compensating scan signal SCj transmitted through the compensating scan line SCLj. Accordingly, the gate electrode and the second electrode of the first transistor T1 are connected to each other to diode-connect the first transistor T1.

The fourth transistor T4 may include a (4-1)-th transistor T4_1, a (4-2)-th transistor T4_2, and a (4-3)-th transistor T4_3. The (4-1)-th transistor T4_1, the (4-2)-th transistor T4_2, and the (4-3)-th transistor T4_3 may be connected in series between the first node N1 and the first initializing voltage line VIL. The (4-1)-th transistor T4_1, the (4-2)-th transistor T4_2, and the (4-3)-th transistor T4_3 has gate electrodes commonly connected to the initializing scan line SILj to receive the initializing scan signal SIj. When The (4-1)-th transistor T4_1, the (4-2)-th transistor T4_2, and the (4-3)-th transistor T4_3 are turned on in response to the initializing scan signal SIj, the gate electrode (that is, the first node N1) of the first transistor T1 may be initialized with the first initializing voltage VINT.

The fifth transistor T5 may include a (5-1)-th transistor T5_1 and a (5-2)-th transistor T5_2. The (5-1)-th transistor T5_1 and the (5-2)-th transistor T5_2 may be connected in series between the second node N2 and the reference voltage line VRL. The (5-1)-th transistor T5_1 and the (5-2)-th transistor T5_2 have gate electrodes commonly connected to the compensating scan line SCLj to receive the compensating scan signal SCj. When the (5-1)-th transistor T5_1 and the (5-2)-th transistor T5_2 are turned on in response to the compensating scan signal SCj, the second node N2 may be initialized with the reference voltage VREF.

The sixth transistor T6 (or referred to as a "light-emitting control transistor") includes a first electrode connected to the second electrode of the first transistor T1, a second electrode connected to the common node CN, and a gate electrode connected to the light-emitting control line EMLj.

The sixth transistor T6 is turned on in response to the light-emitting control signal EMj received through the light-emitting control line EMLj. The driving current Id may be transmitted to the common node CN through the sixth transistor T6 which is turned on.

The seventh transistor T7 may include a (7-1)-th transistor T7_1 and a (7-2)-th transistor T7_2. The (7-1)-th transistor T7_1 (or referred to as a "first initializing transistor") includes a first electrode connected to the anode of the first light-emitting element ED1, a second electrode connected to the second initializing voltage line VAIL, and a gate electrode connected to the black scan line SBLj. The (7-2)-th transistor T7_2 (or referred to as a "second initializing transistor") includes a first electrode connected to an anode of the second light-emitting element ED2, a second electrode connected to the second initializing voltage line VAIL, and a gate electrode connected to the black scan line SBLj. The (7-1)-th transistor T7_1, and the (7-2)-th transistor T7_2 have gate electrodes commonly connected to the black scan line SBLj to receive the black scan signal SBj. When the (7-1)-th transistor T7_1 and the (7-2)-th transistor T7_2 are turned on in response to the black scan signal SBj, the anodes of the first and second light-emitting elements ED1 and ED2 may be initialized with the second initializing voltage VAINT.

The cathodes of the first and second light-emitting elements ED1 and ED2 may be connected to the second driving voltage line VL2 to transmit the second driving voltage ELVSS.

A first switching circuit SW1 is interposed between the common node CN and the first light-emitting element ED1, and a second switching circuit SW2 is interposed between the common node CN and the second light-emitting element ED2. According to an embodiment of the present disclosure, the first switching circuit SW1 includes the eighth transistor T8, and the second switching circuit SW2 includes the ninth transistor T9. The eighth transistor T8 may be referred to as a first mode switching transistor, and the ninth transistor T9 may be referred to as a second mode switching transistor. The eighth transistor T8 includes a first electrode connected to the common node CN, a second electrode connected to the anode of the first light-emitting element ED1, and a gate electrode connected to the first switching line MSL1. The ninth transistor T9 includes a first electrode connected to the common node CN, a second electrode connected to the anode of the second light-emitting element ED2, and a gate electrode connected to the second switching line MSL2.

In the first mode, the eighth transistor T8 may be turned on in response to the first switching signal MS1 received through the first switching line MSL1, and the first light-emitting element ED1 may receive the driving current Id through the eighth transistor T8 which is turned on. Since the ninth transistor T9 is turned off in the first mode, the driving current Id may be provided only to the first light-emitting element ED1. The eighth transistors T8 of the second pixels PX2 (see FIG. 6) may all be turned on in response to the first switching signal MS1 in the first mode, and the ninth transistors T9 of the second pixels PX2 may all be turned off in response to the second switching signal MS2 in the first mode. In the second mode, the ninth transistor T9 may be turned on in response to the second switching signal MS2 received through the second switching line MSL2, and the second light-emitting element ED2 may receive the driving current Id through the ninth transistor T9 which is turned on. Since the eighth transistor T8 is turned off in the second mode, the driving current Id may be provided only to the second light-emitting element ED2. In the second mode, the ninth transistors T9 of the second pixels PX2 may all be turned on in response to the second switching signal MS2, and the eighth transistors T8 of the second pixels PX2 may all be turned off in response to the first switching signal MS1.

The second pixel PX2_*ij* may display an image through the first light-emitting element ED1 in the first mode, and may display an image through the second light-emitting element ED2 in the second mode. However, the present disclosure is not limited thereto. For example, in an embodiment, the second pixel PX2_*ij* may display an image through the first and second light-emitting elements ED1 and ED2 in the first mode, and may display an image through only the second light-emitting element ED2 in the second mode. In this case, in the first mode, the eighth and ninth transistors T8 and T9 may be simultaneously turned on.

Referring to FIGS. 7 and 8, when the initializing scan signal SIj at a low level is provided through the initializing scan line SILj for an initializing period of one frame f1, the (4-1)-th to (4-3)-th transistors T4_1 to T4_3 are turned on in response to the initializing scan signal SIj at the low level. The first initializing voltage VINT is transmitted to the gate electrode (that is, the first node N1) of the first transistor T1 through the (4-1)-th to (4-3)-th transistors T4_1 to T4_3, which are turned on, and the gate electrode of the first transistor T1 is initialized by the first initializing voltage VINT.

Next, when the compensating scan signal SCj at the low level is supplied through the compensating scan line SCLj for a compensating period of one frame f1, the (3-1)-th and (3-2)-th transistors T3_1 and T3_2 are turned on. The compensating period may be in a non-overlap state with the initializing period. An activation period of the compensating scan signal SCj is defined as a period in which the compensating scan signal SCj has the low level, and an activation period of the initializing scan signal SIj is defined as a period in which the initializing scan signal SIj has the low level. The activation period of the compensating scan signal SCj may be in a non-overlap state with the activation period of the initializing scan signal SIj. The activation period of the initializing scan signal SIj may precede the activation period of the compensating scan signal SCj.

For the compensating period, the first transistor T1 is diode-connected by the (3-1)-th and (3-2)-th transistors T3_1 and T3_2, which are turned on, and is forward-biased. In addition, the compensating period may include a data write period in which the write scan signal SWj is generated at the low level. For the data write period, the (2-1)-th and (2-2)-th transistors T2_1 and T2_2 are turned on in response to the write scan signal SWj at the low level. Then, a compensating voltage "Di-Vth", which is obtained by reducing the threshold voltage Vth of the first transistor T1 from the data signal Di supplied from the data line DLi, is applied to the gate electrode of the first transistor T1. In other words, the potential of the gate electrode of the first transistor T1 may be the compensating voltage "Di-Vth".

A first driving voltage ELVDD and a data signal Di may be applied to opposite terminals of the first capacitor Cst, respectively, and charges corresponding to a voltage difference between the opposite terminals of the first capacitor Cst may be stored in the first capacitor Cst.

Meanwhile, the (7-1)-th transistor T7_1 and the (7-2)-th transistor T7_2 are turned on by receiving the black scan signal SBLj, which is at the low level, through the black scan line SBLj. A portion of the driving current Id may flow out of the (7-1)-th transistor T7_1 and the (7-2)-th transistor T7_2, while functioning as a bypass current.

Next, the light-emitting control signal EMj supplied from the light-emitting control line EMLj is changed from a high level to the low level. The sixth transistor T6 is turned on in response to the light-emitting control signal EMj at the low level. Then, the driving current Id resulting from the voltage difference between the gate voltage across the gate electrode of the first transistor T1 and the first driving voltage ELVDD may be generated, and may be provided to the common node CN through the sixth transistor T6. The driving current Id may be provided to the first light-emitting element ED1 or the second light-emitting element ED2 through the eighth or ninth transistor T8 and T9 turned on depending on the mode.

Figure 9A:
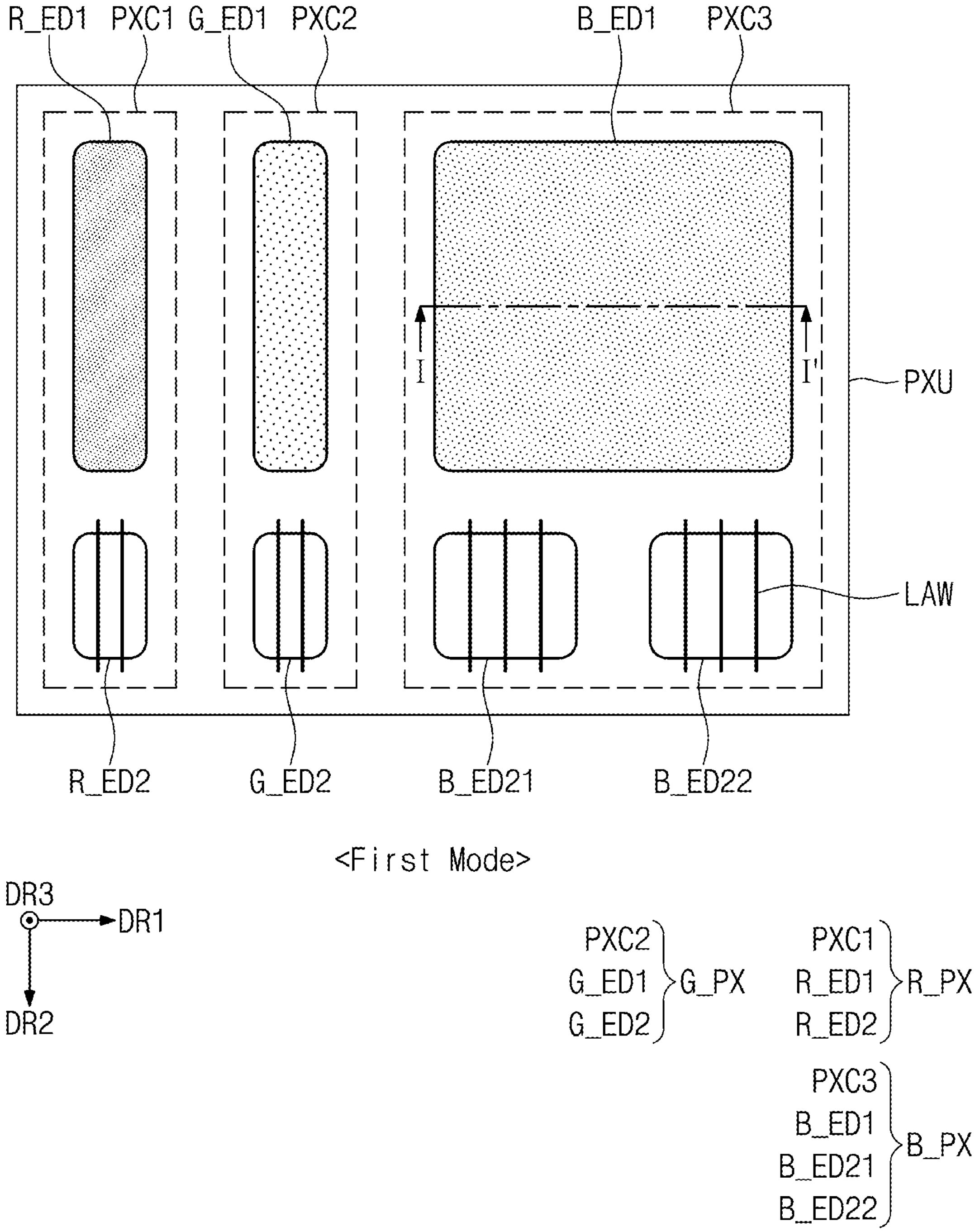
FIG. 9A is a view illustrating wide light-emitting elements, which are turned on in a first mode, according to an embodiment of the present disclosure.
Figure 9B:
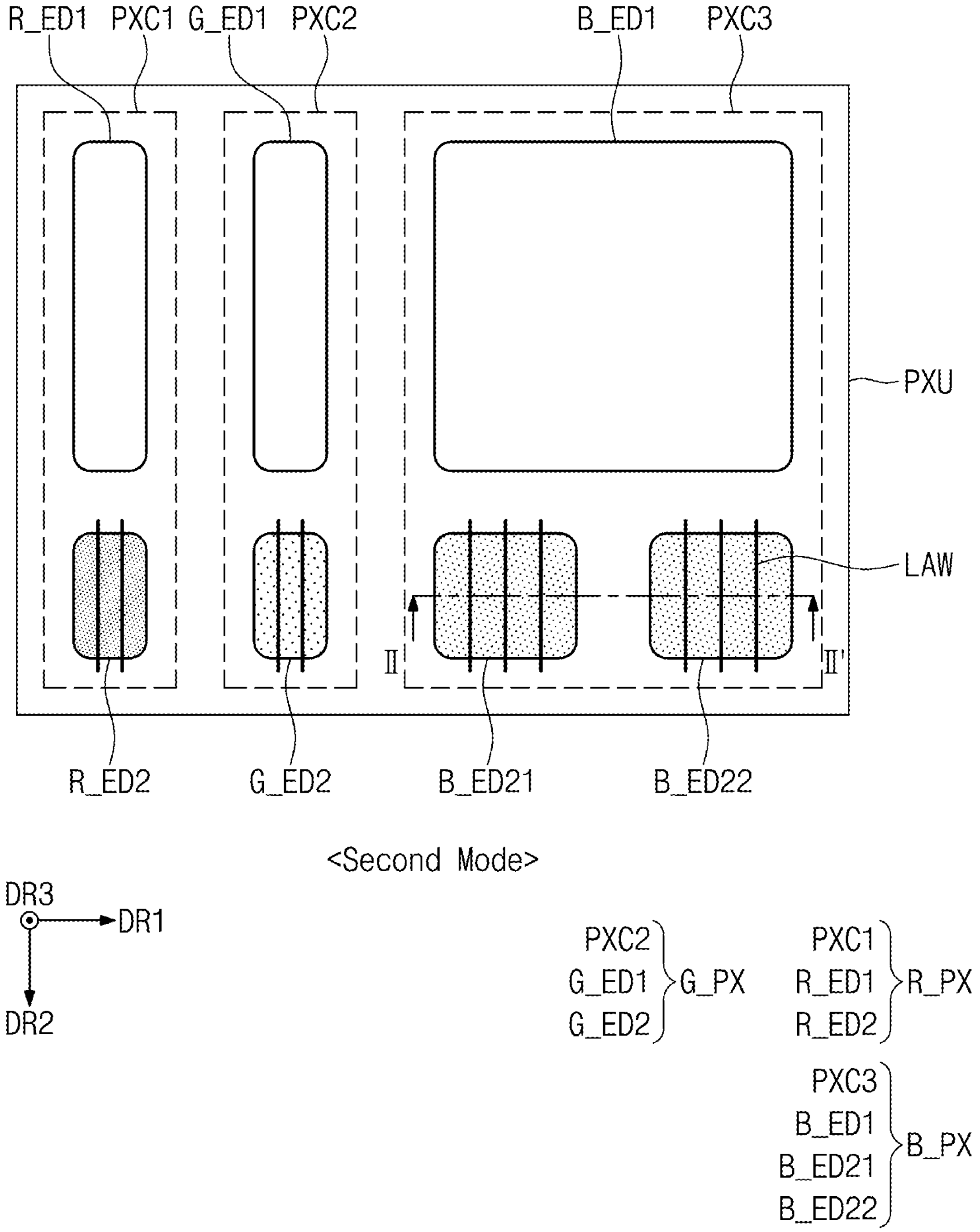
FIG. 9B is a view illustrating narrow light-emitting elements, which are turned on in a second mode, according to an embodiment of the present disclosure.
Figure 10A:
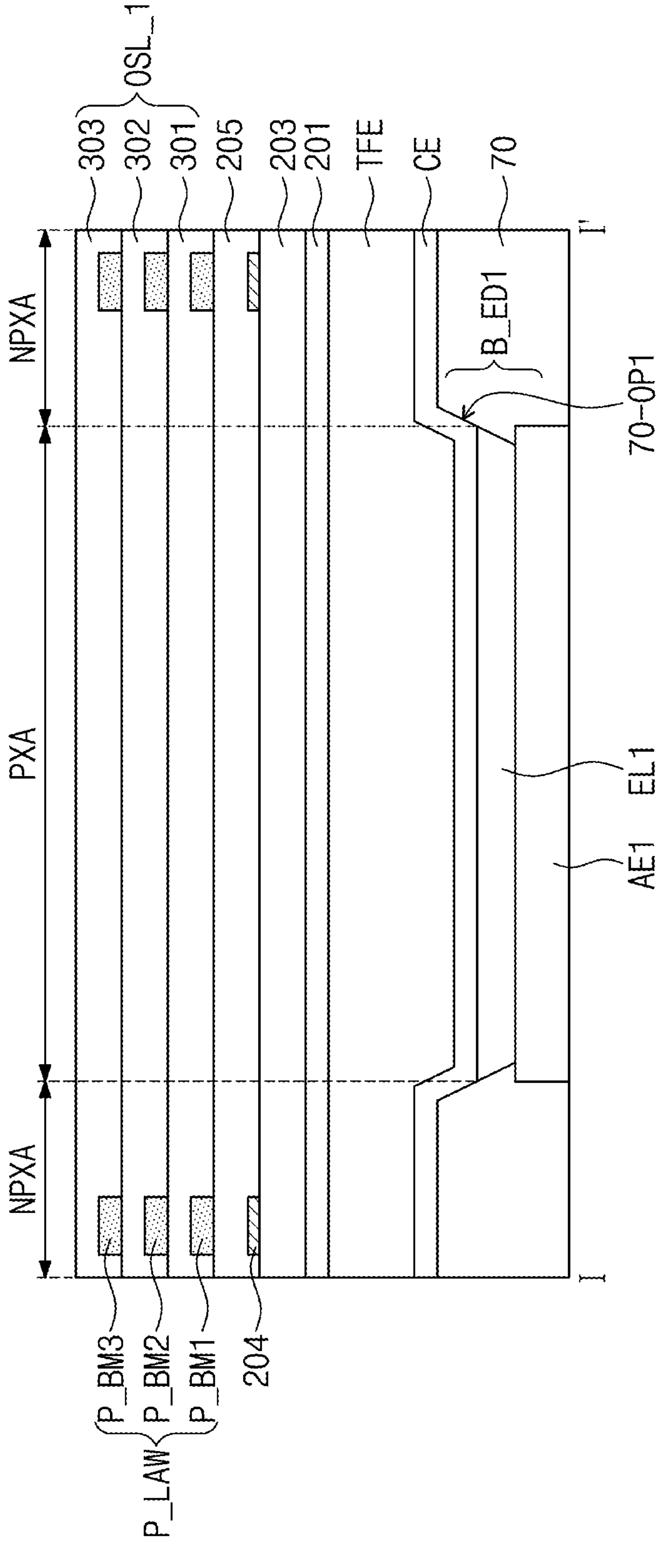
FIG. 10A is a cross-sectional view taken along line I-I' illustrated in FIG. 9A.
Figure 10B:
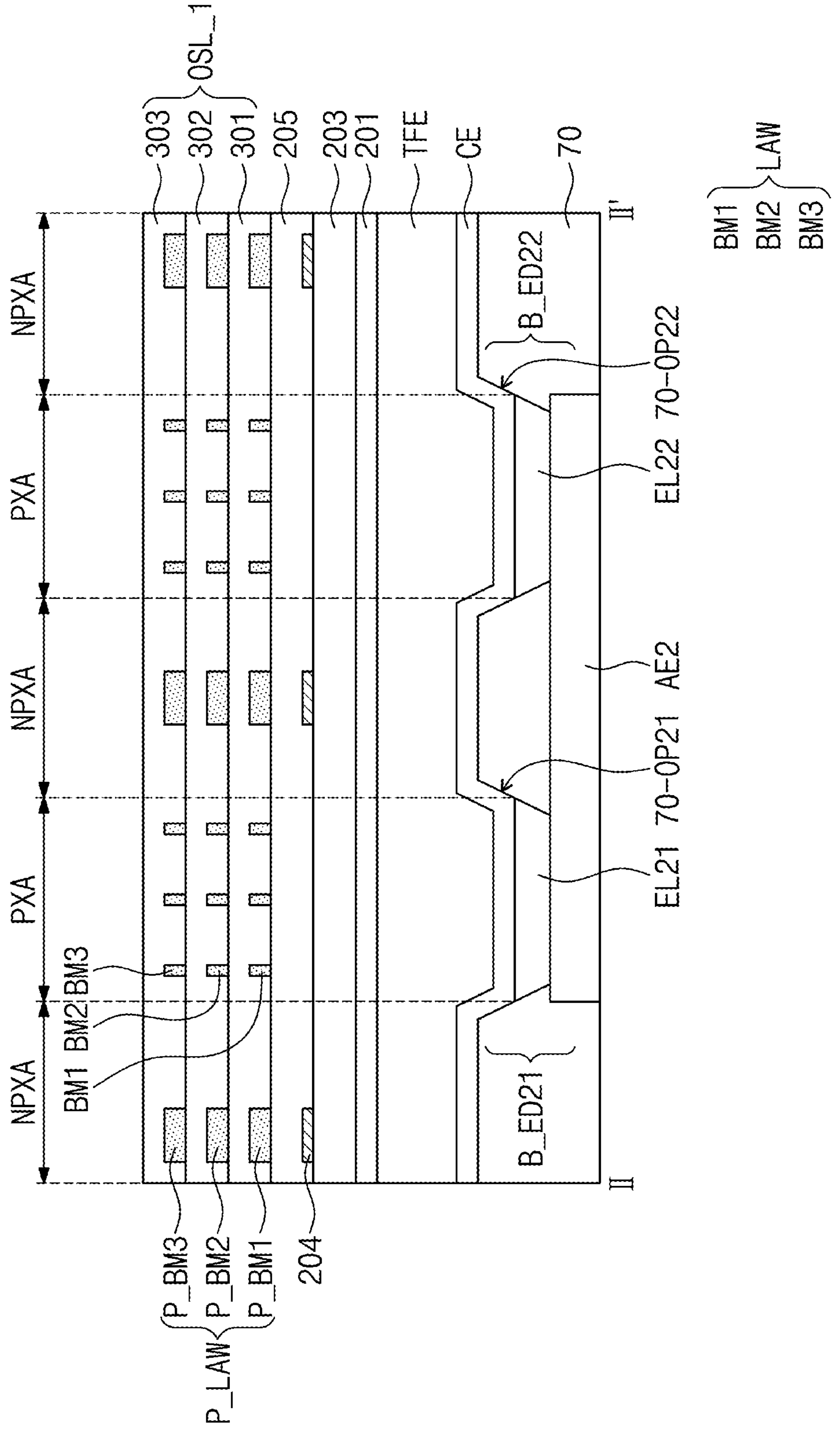
FIG. 10B is a cross-sectional view taken along line II-II' illustrated in FIG. 9B.

FIG. 9A is a view illustrating the wide light-emitting elements, which are turned on in the first mode, according to an embodiment of the present disclosure. FIG. 9B is a view illustrating the narrow light-emitting elements, which are turned on in the second mode, according to an embodiment of the present disclosure. FIG. 10A is a cross-sectional view taken along line I-I' illustrated in FIG. 9A. FIG. 10B is a cross-sectional view taken along line II-II' illustrated in FIG. 9B.

Referring to FIGS. 9A and 9B, the plurality of second pixels PX2 (see FIG. 6) are disposed in units of a pixel cell PXU in the second display region DA2 (see FIG. 6).

According to an embodiment of the present disclosure, the pixel cell PXU may include a red pixel R_PX, a green pixel G_PX, and a blue pixel B_PX. The red pixel R_PX includes a red pixel circuit PXC1, a first red light-emitting element R_ED1, and a second red light-emitting element R_ED2, and the green pixel G_PX includes a green pixel circuit PXC2, a first green light-emitting element G_ED1, and a second green light-emitting element G_ED2. The blue pixel B_PX includes a blue pixel circuit PXC3, a first blue light-emitting element B_ED1, a (2-1)-th blue light-emitting element B_ED21, and a (2-2)-th blue light-emitting element B_ED22. In this case, the first red light-emitting element R_ED1, the first green light-emitting element G_ED1, and the first blue light-emitting element B_ED1 may be referred to as wide light-emitting elements, and the second red light-emitting element R_ED2, the second green light-emitting element G_ED2, and the (2-1)-th and (2-2)-th blue light-emitting elements B_ED21 and B_ED22 may be referred to as narrow light-emitting elements.

According to an embodiment of the present disclosure, the first red light-emitting element R_ED1 may have a size larger than a size of the second red light-emitting element R_ED2, and the first green light-emitting element G_ED1 may have a size larger than a size of the second green light-emitting element G_ED2. The first blue light-emitting element B_ED1 may have a size larger than those of the (2-1)-th blue light-emitting element B_ED21 and the (2-2)-th blue light-emitting element B_ED22. The (2-1)-th blue light-emitting element B_ED21 and the (2-2)-th blue light-emitting element B_ED22 may have about equal sizes to each other.

Although FIGS. 9A and 9B illustrate that the wide light-emitting element has a size larger than a size of the narrow light-emitting element, the present disclosure is not limited thereto. For example, the first red light-emitting element R_ED1 may have a size about equal to a size the second red light-emitting element R_ED2, and the first green light-emitting element G_ED1 may have a size about equal to a size of the second green light-emitting element G_ED2, according to embodiments of the present disclosure.

A plurality of light absorbing partition walls LAW may be formed on the narrow light-emitting element. The plurality of light absorbing partition walls LAW may overlap the narrow light-emitting element and may be in a non-overlap state with the wide light-emitting element. The plurality of light absorbing partition walls LAW may be included in the optical path control layers OSL and OSL_1 illustrated in FIGS. 4A to 5B. According to an embodiment of the present disclosure, the plurality of light absorbing partition walls LAW may overlap light-emitting regions of the second red light-emitting element R_ED2, the second green light-emitting element G_ED2, the (2-1)-th blue light-emitting element B_ED21 and the (2-2)-th blue light-emitting element B_ED22. According to an embodiment of the present disclosure, the plurality of light absorbing partition walls LAW may extend in the first direction DR1, and may be spaced apart from each other in the second direction DR2. The light absorbing partition walls LAW may absorb a portion of a light (referred to as side light), which travels in a lateral direction, of a light output from the second red light-emitting element R_ED2, the second green light-emitting element G_ED2, the (2-1)-th blue light-emitting element B_ED21 and the (2-2)-th blue light-emitting element B_ED22. The side light may refer to a light emitted in a direction tilted at a specific angle or more with respect to a line normal to a light emitting surface of the narrow light-emitting element.

The pixel cell PXU may display an image using the wide light-emitting element in the first mode, and may display an image using the narrow light-emitting element in the second mode. Since the side light of the light output through the narrow light-emitting element in the second mode is absorbed through the light absorbing partition walls LAW, a viewing angle of the image displayed in the second mode may be narrower than the viewing angle of the image displayed in the first mode. Accordingly, when the second display region DP_DA2 operates in the second mode, the driver DV (see FIG. 2B) cannot view the second image IM2 (see FIG. 2B).

According to embodiments of the present disclosure, the use of different light-emitting elements in the first mode and the second mode may result in distinct optical and electrical stress profiles over time. For example, the wide light-emitting element used in the first mode may operate at different current densities or emission durations compared to the narrow light-emitting element used in the second mode. These operational differences may lead to asymmetric aging or degradation characteristics between the two elements, even within the same pixel cell PXU. To maintain consistent image quality and prevent afterimage artifacts, embodiments of the present disclosure may independently track degradation information for each mode, or for each type of light-emitting element, and apply compensation accordingly. This approach may provide accurate luminance control and improved visual performance across both public and private display modes.

When the first switching signal MS1 is activated in the first mode, the red pixel R_PX, the green pixel G_PX, and the blue pixel B_PX may display an image by using the first red light-emitting element R_ED1, the first green light-emitting element G_ED1, and the first blue light-emitting element B_ED1. Since the second switching signal MS2 is deactivated in the first mode, the second red light-emitting element R_ED2, the second green light-emitting element G_ED2, the (2-1)-th blue light-emitting element B_ED21 and the (2-2)-th blue light-emitting element B_ED22 are maintained turned off.

Meanwhile, when the second switching signal MS2 is activated in the second mode, the red pixel R_PX, the green pixel G_PX, and the blue pixel G_PX may display an image using the second red light-emitting element R_ED2, the second green light-emitting element G_ED2, the (2-1)-th blue light-emitting element B_ED21, and the (2-2)-th blue light-emitting element B_ED22. Since the first switching signal MS1 is deactivated in the second mode, the first red light-emitting element R_ED1, the first green light-emitting element G_ED1, and the first blue light-emitting element B_ED1 are maintained turned off.

Referring to FIGS. 10A and 10B, the first blue light-emitting element B_ED1 includes a first blue anode AE1, a first blue light-emitting layer EL1, and a cathode CE. The pixel defining layer 70 has a first blue opening 70-OP1, which is provided in the pixel defining layer 70, to expose the first blue anode AE1, and the first blue light-emitting layer EL1 is disposed on the first blue anode AE1 exposed through the first blue opening 70-OP1.

The (2-1)-th blue light-emitting element B_ED21 includes a second blue anode AE2, a (2-1)-th blue light-emitting layer EL21, and the cathode CE, and a (2-2)-th blue light-emitting element B_ED22 includes the second blue anode AE2, a (2-2)-th blue light-emitting layer EL22, and a cathode CE. The pixel defining layer 70 has a (2-1)-th blue opening 70-OP21 and a (2-2)-th blue opening 70-OP22, which are provided in the pixel defining layer 70, to expose the second blue anode AE2. The (2-1)-th blue light-emitting layer EL21 is disposed on the second blue anode AE2 exposed through the (2-1)-th blue opening 70-OP21, and the (2-2)-th blue light-emitting layer EL22 is disposed on the second blue anode AE2 exposed through the (2-2)-th blue opening 70-OP22.

The cathode CE is disposed on the first blue light-emitting layer EL1, the (2-1)-th blue light-emitting layer EL21, and the (2-2)-th blue light-emitting layer EL22. The cathode CE is covered by the encapsulating layer TFE.

The base insulating layer 201, the intermediate insulating layer 203, and the cover insulating layer 205 may be sequentially stacked on the encapsulating layer TFE. The second conductive layer 204 may be disposed in the non-light-emitting region NPXA. The first conductive layer 202 (see FIGS. 5A and 5B) may be further disposed in the non-light-emitting region NPXA. The optical path control layer OSL_1 may be disposed on the cover insulating layer 205. The optical path control layer OSL_1 may include a plurality of light absorbing partition walls LAW disposed to correspond to the light-emitting region PXA of the narrow light-emitting element. Since the first blue light-emitting element B_ED1 belongs to the wide light-emitting element, the plurality of light absorbing partition walls LAW are not disposed above the first blue light-emitting element B_ED1. Since the (2-1)-th blue light-emitting element B_ED21 and the (2-2)-th blue light-emitting element B_ED22 belong to the narrow light-emitting element, the plurality of light absorbing partition walls LAW are disposed above the (2-1)-th blue light-emitting element B_ED21 and the (2-2)-th blue light-emitting element B_ED22.

According to an embodiment of the present disclosure, each of the plurality of light absorbing partition walls LAW may include a plurality of black matrices. Although FIGS. 10A and 10B illustrate the structure that each of the plurality of light absorbing partition walls LAW includes three black matrices (hereinafter, referred to as "first to third black matrices BM1, BM2, and BM3"), the structure of each of the plurality of light absorbing partition walls LAW is not limited thereto. For example, each of the plurality of light absorbing partition walls LAW may include one black matrix, or at least two or four black matrices.

The first black matrix BM1 may be disposed on the cover insulating layer 205 and may be covered by a first transparent insulating layer 301. The second black matrix BM2 may be disposed on the first transparent insulating layer 301 and may be covered by the second transparent insulating layer 302. The third black matrix BM3 may be disposed on the second transparent insulating layer 302 and may be covered by the third transparent insulating layer 303. Each of the first to third black matrices BM1, BM2, and BM3 may include a light-absorbing material or a light-blocking material. Accordingly, light incident on the first to third black matrices BM1, BM2, and BM3 may be absorbed without being reflected. Each of the first to third transparent insulating layers 301, 302 and 303 may include a transparent organic material.

The range of light output from the (2-1)-th blue light-emitting element B_ED21 and the (2-2)-th blue light-emitting element B_ED22 may be controlled by the plurality of light absorbing partition walls LAW. In other words, a side light among the lights output from the (2-1)-th and (2-2)-th blue light-emitting elements B_ED21 and B_ED22 is absorbed by the light absorbing partition walls LAW and is not output. The range of the light output from the (2-1)-th blue light-emitting element B_ED21 and the (2-2)-th blue light-emitting element B_ED22 may be narrowed by the light absorbing partition walls LAW. Accordingly, the viewing angle of the image displayed in the display region DA (see FIG. 2A) in the second mode may be narrowed.

For example, the range of light output from the (2-1)-th blue light-emitting element B_ED21 and the (2-2)-th blue light-emitting element B_ED22 may be limited by the plurality of light-absorbing partition walls LAW. For example, side-emitted light from these blue light-emitting elements may be absorbed by the light-absorbing partition walls LAW, which may prevent the light from being emitted outward. As a result, the emission range of the (2-1)-th blue light-emitting element B_ED21 and the (2-2)-th blue light-emitting element B_ED22 may be reduced, and the viewing angle of the image displayed in the display region DA (see FIG. 2A) in the second mode may be correspondingly narrowed.

The optical path control layer OSL_1 may further include a peripheral partition wall P_LAW disposed to correspond to the non-light-emitting region NPXA. The peripheral partition wall P_LAW may have a structure including a plurality of peripheral black matrices P_BM1, P_BM2, and P_BM3. In an embodiment, the peripheral partition wall P_LAW may be omitted from the optical path control layer OSL_1.

Figure 11A:
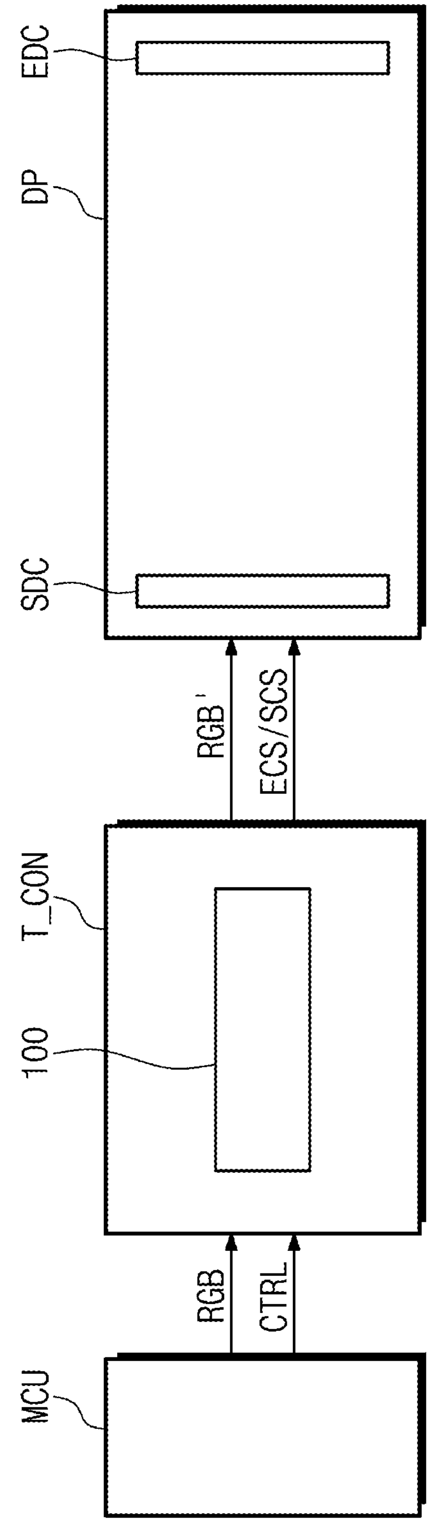
FIG. 11A is a block diagram of an electronic device according to an embodiment of the present disclosure.
Figure 11B:
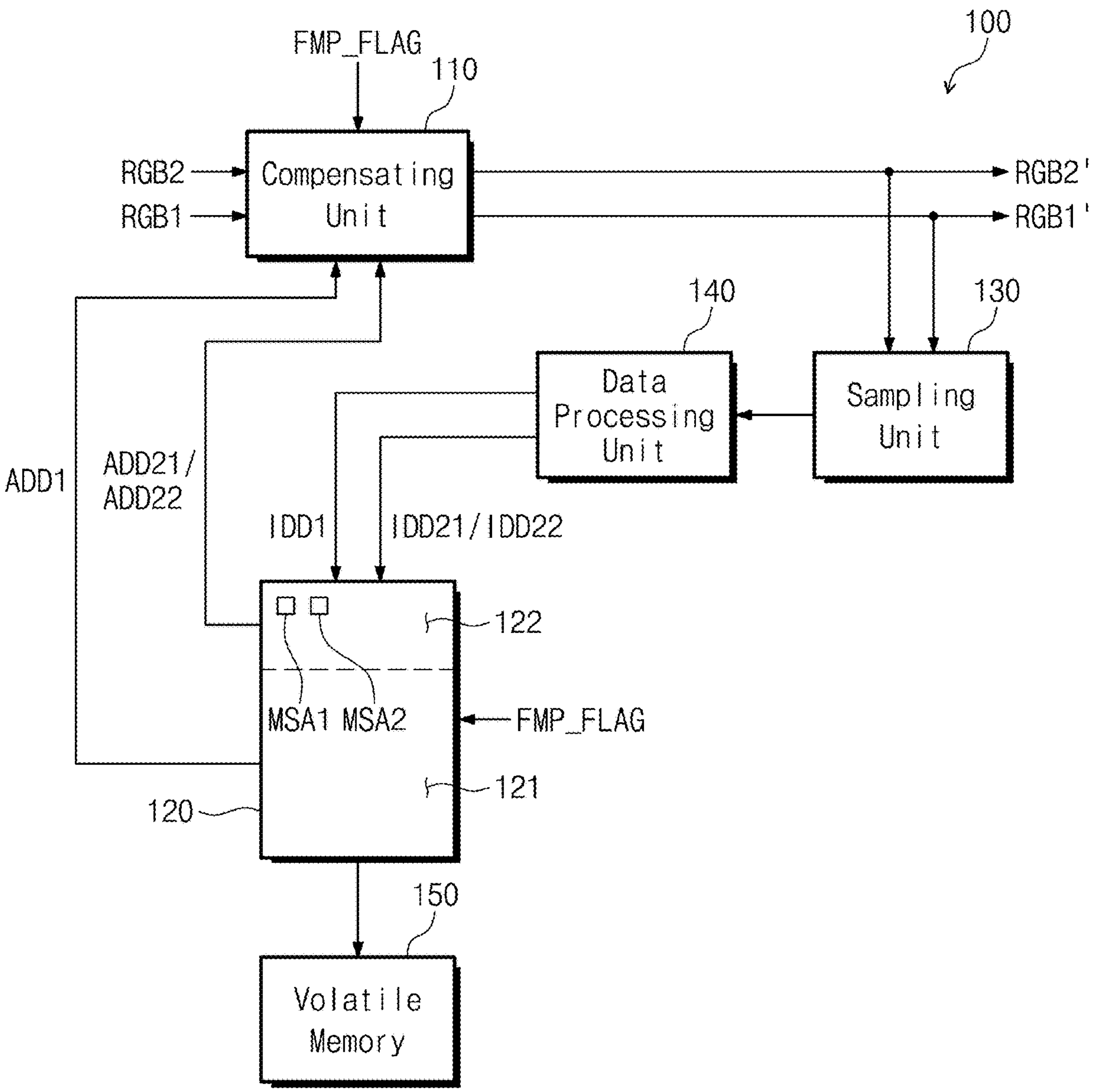
FIG. 11B is a block diagram of an afterimage compensating circuit according to an embodiment of the present disclosure.
Figure 12A:
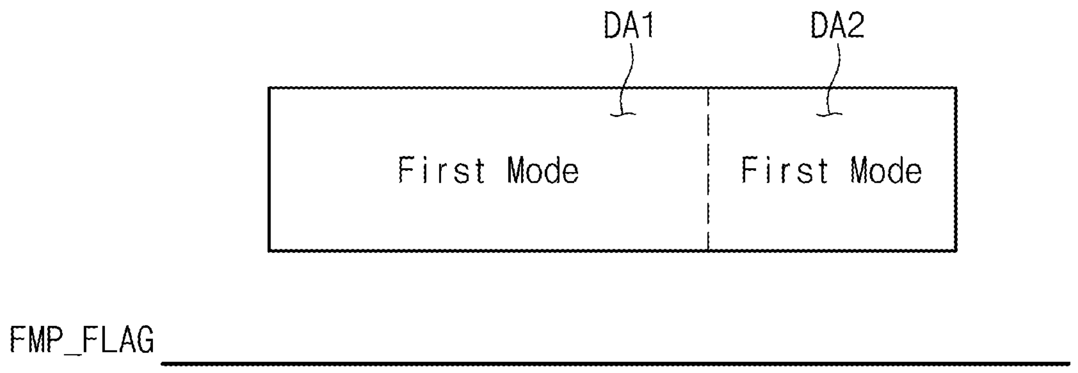
FIGS. 12A and 12B are views illustrating the state of a flag signal depending on an operating mode of an electronic device.
Figure 12B:
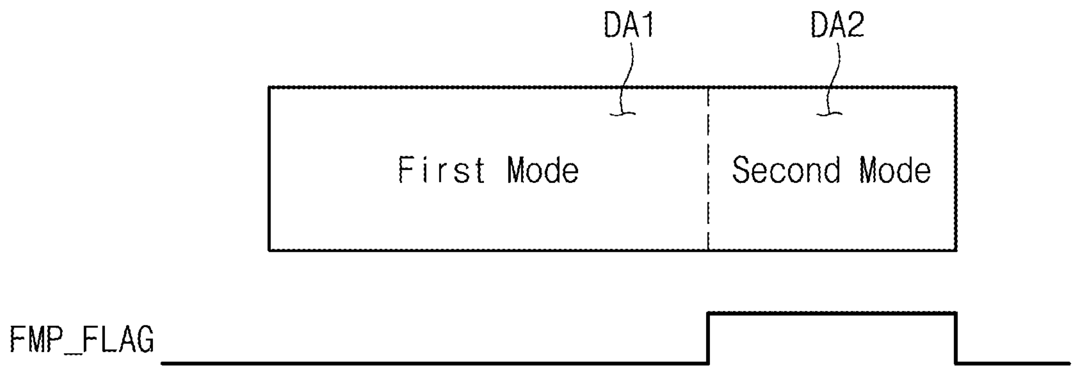

FIG. 11A is a block diagram of an electronic device according to an embodiment of the present disclosure. FIG. 11B is a block diagram illustrating an afterimage compensating circuit according to an embodiment of the present disclosure. FIGS. 12A and 12B are views illustrating the state of a flag signal depending on an operating mode of the electronic device.

Referring to FIGS. 11A and 11B, the driving controller T_CON receives the input image signal RGB and the control signal CTRL from a main processor MCU (e.g., a micro-controller or a graphic controller). The driving controller T_CON converts the input image signal RGB to generate image data, and generates a driving control signal based on the control signal CTRL, such as a scan control signal SCS and an emission control signal ECS. The image data may be provided to a plurality of driving chips, and the driving control signal may be a control signal that controls the driving of the driving circuit (that is, a plurality of driving chips DIC1 to DIC3 (see FIG. 6); the scan driving circuit SDC (see FIG. 6); and the light-emitting driving circuit EDC (see FIG. 6)). When the plurality of driving chips DIC1 to DIC3, the scan driving circuit SDC, and the light-emitting driving circuit EDC are mounted or integrated on the display panel DP, the driving control signal may be applied to the display panel DP through a flexible circuit film.

The driving controller T_CON may include an afterimage compensating circuit 100. The afterimage compensating circuit 100 receives the input image signal RGB, and compensates for the input image signals RGB based on degradation information to generate a compensated image signal RGB'. The input image signal RGB may include a first input image signal RGB1 for the first display region DA1 (see FIG. 2A) and a second input image signal RGB2 for the second display region DA2 (see FIG. 2A). The afterimage compensating circuit 100 may compensate for the first and second input image signals RGB1 and RGB2 to generate first and second compensated image signals RGB1' and RGB2', respectively.

In embodiments of the present disclosure, the degradation information used by the afterimage compensating circuit 100 may differ between the first display region DA1 and the second display region DA2, depending on the respective operating modes and the characteristics of the light-emitting elements used in each region. For example, if the second display region DA2 is operated in the second mode (narrow viewing angle) using a different set of light-emitting elements or driving conditions, its degradation profile may diverge significantly from that of the first display region DA1, which operates solely in the first mode. To account for this, the afterimage compensating circuit 100 may apply distinct compensation parameters to the first and second input image signals RGB1 and RGB2, which may enable accurate luminance correction and reduction of image retention artifacts specific to each region. This independent compensation strategy may provide improved long-term image quality.

Although FIG. 11A illustrates a structure in which the afterimage compensating circuit 100 is included in the driving controller T_CON, the present disclosure is not limited thereto. For example, the afterimage compensating circuit 100 may be provided as a component independent from the driving controller T_CON, without being included in the driving controller T_CON, according to embodiments.

Referring to FIGS. 11B, 12A, and 12B, the afterimage compensating circuit 100 includes a compensating unit 110 (also referred to as a compensating circuit), an accumulating memory 120, a sampling unit 130 (also referred to as a sampling circuit), a data processing unit 140 (also referred to as a data processing circuit), and a volatile memory 150.

The compensating unit 110 receives the first input image signal RGB1 and the second input image signal RGB2, compensates for the first input image signal RGB1 and the second input image signal RGB2, based on first accumulated data ADD1 and second accumulated data ADD21/ADD22 stored in the accumulating memory 120, and generates the first compensated image signal RGB1' and the second compensated image signal RGB2'.

The accumulating memory 120 includes a first storage region 121 and a second storage region 122. First degradation data IDD1 for the first display region DA1 is accumulated in the first storage region 121, and second degradation data IDD21/IDD22 for the second display region DA2 is accumulated in the second storage region 122. According to an embodiment of the present disclosure, the accumulating memory 120 may receive a flag signal FMP_FLAG. The flag signal FMP_FLAG may be a signal which is deactivated when the second display region DA2 operates in the first mode, and activated when the second display region DA2 operates in the second mode.

According to embodiments of the present disclosure, the compensating unit 110 dynamically adjusts its compensation strategy based on the operating mode of the second display region DA2, as indicated by the flag signal FMP_FLAG. For example, when the flag signal FMP_FLAG is activated, indicating that the second display region DA2 is operating in the second mode (e.g., private mode with limited viewing angle), the compensating unit 110 accesses the second accumulated data ADD21/ADD22 stored in the second storage region 122 and applies degradation compensation specifically tailored to the narrow-viewing configuration. Conversely, when the flag signal FMP_FLAG is deactivated, the compensation is based on the first accumulated data ADD1 stored in the first storage region 121, which corresponds to public mode operation of the second display region DA2. This selective compensation approach may enable embodiments to maintain consistent luminance performance across varying modes and viewing conditions, despite differing stress and aging profiles associated with distinct light-emitting elements or usage patterns. By maintaining separate storage regions, e.g., the first storage region 121 for the first display region DA1 and the second storage region 122 for the second display region DA2, within the accumulating memory 120, embodiments may allow for degradation data to remain mode-specific, allowing more accurate and localized afterimage prevention and image fidelity correction.

According to an embodiment of the present disclosure, the second storage region 122 may include a first mode storage region MSA1 and a second mode storage region MSA2. Accordingly, the accumulating memory 120 accumulates the second degradation data in the first mode storage region MSA1 in response to the flag signal FMP_FLAG, which is deactivated (e.g., the state of logic "0"), and accumulates the second degradation data in the second mode storage region MSA2 in response to the flag signal FMP-_FLAG, which is activated (e.g., the state of logic "1"). The second degradation data accumulated in the first mode storage region MSA1 is referred to as (2-1)-th degradation data IDD21, and the second degradation data accumulated in the second mode storage region MSA2 is referred to as (2-2)-th degradation data IDD22.

The accumulating memory 120 stores the first accumulated data ADD1 which is obtained by accumulating the first degradation data IDD1 to first previously-accumulated data stored in the first storage region 121. The first accumulated data ADD1 stored in the first storage region 121 may be provided to the compensating unit 110, and the compensating unit 110 may compensate for the first input image signal RGB1, based on the first accumulated data ADD1 to generate the first compensated image signal RGB1'.

The accumulating memory 120 stores the second accumulated data ADD21 and ADD22 obtained by accumulating second degradation data IDD21 and IDD22 to second previously-accumulated data stored in the second storage region 122. For example, the accumulating memory 120 stores the (2-1)-th accumulated data ADD21 obtained by accumulating the (2-1)-th degradation data IDD21 to (2-1)-th previously-accumulated data, which is previously stored in the first mode storage region MSA1 of the second storage region 122. In addition, the accumulating memory 120 stores the (2-2)-th accumulated data ADD22 obtained by accumulating the (2-2)-th degradation data IDD22 to (2-2)-th previously-accumulated data, which is previously stored in the second mode storage region MSA2 of the second storage region 122.

The second accumulated data ADD21 and ADD22, which are stored in the second storage region 122, are provided to the compensating unit 110, and the compensating unit 110 compensates for the second input image signal RGB2 based on the second accumulated data ADD21 and ADD22 to generate the second compensated image signal RGB2'.

In embodiments of the present disclosure, the accumulating memory 120 enables mode-aware compensation by dividing the second storage region 122 into separate subregions for each operating mode of the second display region DA2. For example, the first mode storage region MSA1 may accumulate (2-1)-th degradation data IDD21 corresponding to operation in the first mode, while the second mode storage region MSA2 may accumulate (2-2)-th degradation data IDD22 corresponding to operation in the second mode. These degradation values may be continuously updated as accumulated data ADD21 and ADD22, respectively, and provided to the compensating unit 110. This configuration may allow the compensating unit 110 to generate accurately compensated image signals RGB2' for the second display region DA2 based on the specific mode in use, rather than applying a generic correction. As a result, image fidelity may be preserved over time even under asymmetric usage conditions, such as frequent switching between public and private display modes.

According to an embodiment of the present disclosure, the compensating unit 110 may receive the flag signal FMP_FLAG. The compensating unit 110 reads out the (2-1)-th accumulated data ADD21 from the accumulating memory 120, and compensates for the second input image signal RGB2 based on the (2-1)-th accumulated data ADD21 to generate the second compensated image signal RGB2', in response to the flag signal FMP_FLAG which is deactivated (e.g., the state of logic '0'). Meanwhile, the compensating unit 110 reads out the (2-2)-th accumulated data ADD22 from the accumulating memory 120, and compensates for the second input image signal RGB2 based on the (2-2)-th accumulated data ADD22 to generate the second compensated image signal RGB2', in response to the flag signal FMP_FLAG which is activated (e.g., the state of logic '1').

For example, in embodiments of the present disclosure, the compensating unit 110 may selectively access mode-specific accumulated data from the accumulating memory 120 based on the logic state of the flag signal FMP_FLAG. When the second display region DA2 is operating in the first mode (e.g., public mode), the compensating unit 110 may use the (2-1)-th accumulated data ADD21 to correct the second input image signal RGB2. Conversely, when operating in the second mode (e.g., private mode), the compensating unit 110 may switch to the (2-2)-th accumulated data ADD22 to perform the compensation. This selective readout mechanism may enable the image compensation process to reflect the distinct degradation behavior associated with each mode, allowing for luminance corrections to remain accurate even as the display transitions between different usage scenarios.

The sampling unit 130 may receive the first and second compensated image signals RGB1' and RGB2' from the compensating unit 110, and may perform a sampling operation for some image signals of the first and second compensated image signals RGB1' and RGB2'. According to an embodiment of the present disclosure, the sampling unit 130 may perform the sampling operation in the unit of a frame. A signal, which is obtained by performing the sampling operation for the first compensated image signal RGB1', is referred to as a first sampled signal. A signal, which is obtained by performing the sampling operation for the second compensated image signal RGB2', is referred to as a second sampled signal. The first sampled signal and the second sampled signal are provided to the data processing unit 140. The process of the sampling operation of the sampling unit 130 will be described in further detail with reference to FIGS. 13A and 13B.

For example, in embodiments of the present disclosure, the sampling unit 130 may support efficient degradation tracking by selectively sampling portions of the first and second compensated image signals RGB1' and RGB2', respectively. The sampling may be performed on a per-frame basis, enabling embodiments to monitor representative luminance behavior over time without processing full-frame data continuously. The resulting first and second sampled signals provide reduced-bandwidth yet informative versions of the compensated image data, which are transmitted to the data processing unit 140 for use in updating or validating degradation information. This sampling-based strategy may balance compensation accuracy with processing efficiency.

The data processing unit 140 may generate the first degradation data IDD1 for the first display region DA1, based on the first sampled signal, and may generate the second degradation data IDD21 and IDD22 for the second display region DA2, based on the second sampled signal. The data processing unit 140 may accumulate the first and second degradation data IDD1, IDD21, and IDD22 in the accumulating memory 120.

For example, according to embodiments, the data processing unit 140 may analyze the first and second sampled signals received from the sampling unit 130 to compute updated degradation data for each display region. For example, the data processing unit 140 may generate first degradation data IDD1 for the first display region DA1 and separately generates second degradation data IDD21 and IDD22 for the second display region DA2, corresponding to its operation in the first and second modes, respectively. These values may reflect the cumulative aging or stress experienced by the light-emitting elements over time. Once calculated, this degradation data may be accumulated in the appropriate sub-regions of the accumulating memory 120, forming the basis for future compensation operations by the compensating unit 110. This feedback-driven architecture may enable embodiments to dynamically adapt to real-world usage patterns and maintain image quality across diverse viewing conditions.

The volatile memory 150 may store the first and second accumulated data ADD1, ADD21, and ADD22. The volatile memory 150 may further store a frame number related to a current sampling operation.

Figure 13A:
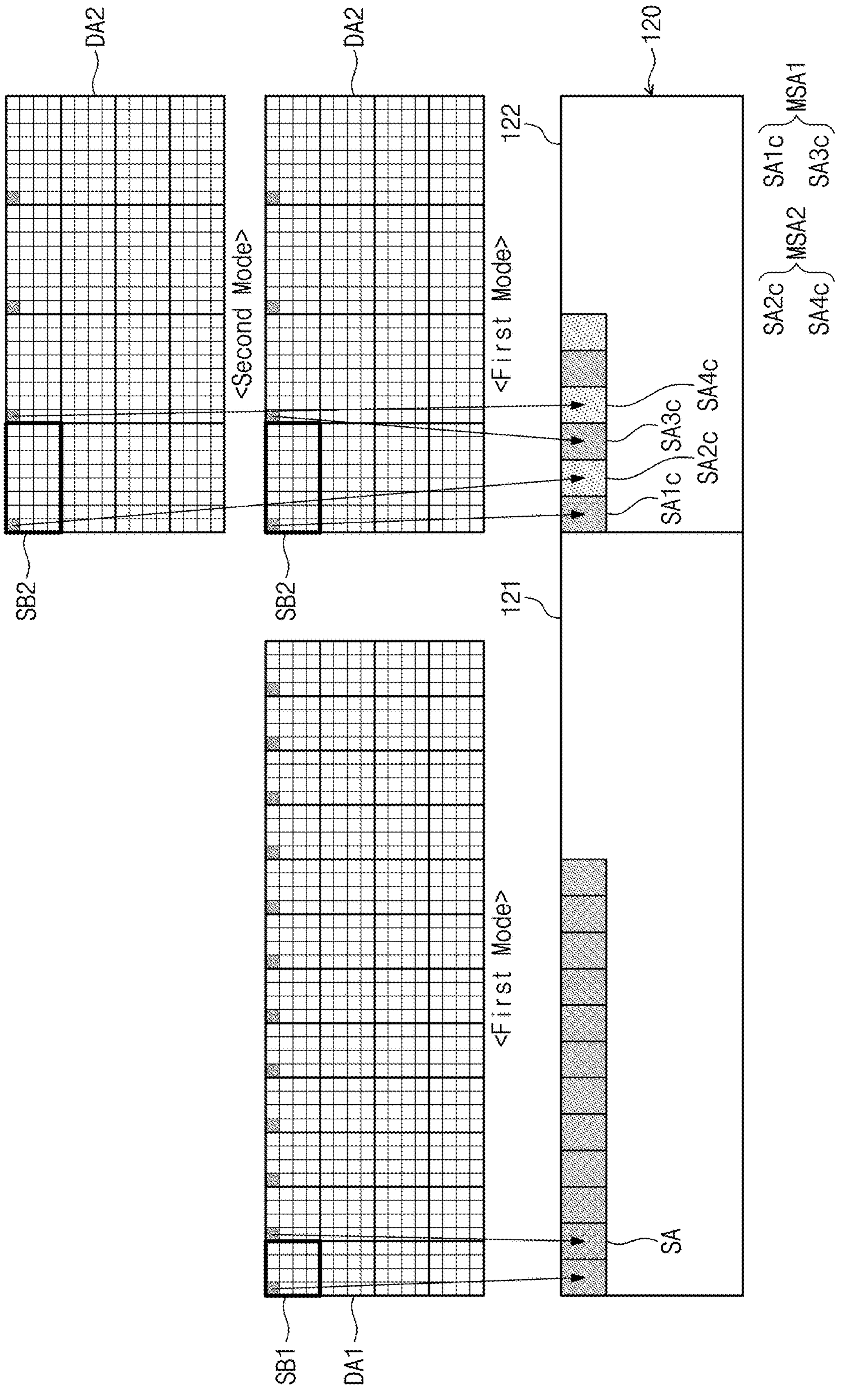
FIG. 13A illustrates a sampling operation for a first display region and a second display region depending on modes according to an embodiment of the present disclosure.
Figure 13B:
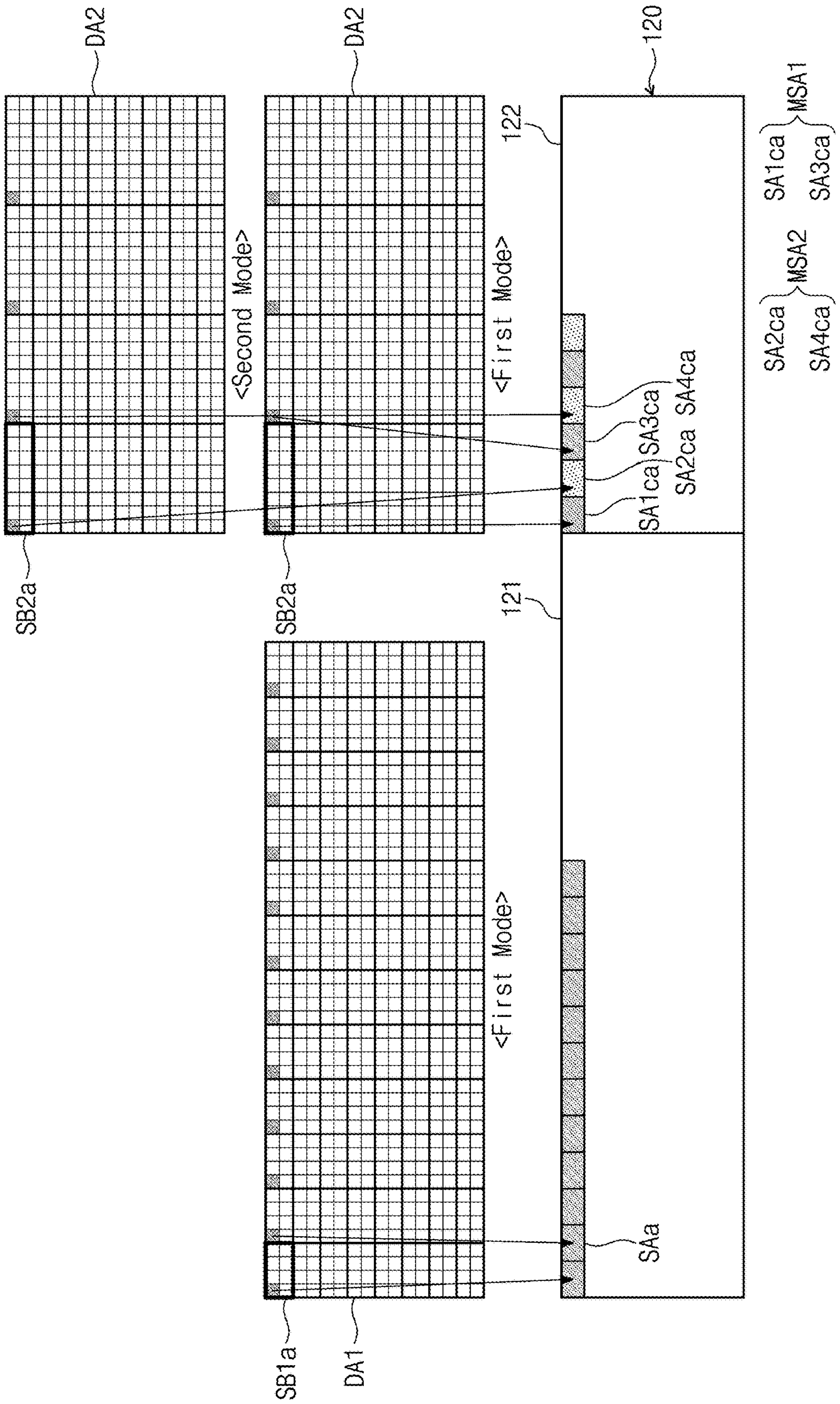
FIG. 13B illustrates a sampling operation for a first display region and a second display region depending on modes according to an embodiment of the present disclosure.

FIG. 13A illustrates a sampling operation for a first display region and a second display region depending on modes according to an embodiment of the present disclosure. FIG. 13B illustrates a sampling operation for a first display region and a second display region depending on modes according to an embodiment of the present disclosure.

Referring to FIG. 13A, a plurality of first blocks SB1 are defined in the first display region DA1, and a plurality of second blocks SB2 are defined in the second display region DA2 and having a size different from a size of the first blocks SB1. Each of the first blocks SB1 may have the size of (p×q), and each of the second blocks SB2 may have the size of (p×2q). In this case, each of 'p' and 'q' may be an integer of '1' or more.

According to an embodiment of the present disclosure, although FIG. 13A illustrates that 'p' is '4', and 'q' is '4', the present disclosure is not limited thereto. In other words, each of the first blocks SB1 may have the size of (4×4), and each of the second blocks SB2 may have the size of (4×8). In other words, 16 sampling pixels are disposed in each of the first blocks SB1, and 32 sampling pixels are disposed in each of the second blocks SB2.

The sampling unit 130 (see FIG. 11B) may perform a sampling operation in each preset sampling period. For example, the sampling unit 130 may output, as a sampled signal, a signal corresponding to first sampling pixels of the first blocks SB1, which are positioned in a first row, from the first compensated image signal RGB1', for the first sampling period. For example, the sampling unit 130 may output, as a sampled signal, a signal corresponding to first sampling pixels of the first blocks SB1, which are positioned in a fourth row, from the first compensated image signal RGB1', for the fourth sampling period. For example, the sampling unit 130 may output, as a sampled signal, a signal corresponding to second sampling pixels of the first blocks SB1, which are positioned in the first row, from the first compensated image signal RGB1', for the fifth sampling period. Such a process is repeated to extract sampled signals for all sampling pixels provided in the first blocks SB1.

The sampled signals extracted from the first blocks SB1 may be processed to be the first degradation data IDD1 (see FIG. 11B) and then accumulated in the first storage region 121. According to an embodiment of the present disclosure, the first storage region 121 may include a plurality of unit storage regions. In each unit storage region of the first storage region 121, the first degradation data IDD1 for the relevant first block SB1 may be accumulated.

For example, the sampling unit 130 may output, as a sampled signal, a signal corresponding to first sampling pixels of the second blocks SB2, which are positioned in a first row, from the second compensated image signal RGB2', for the first sampling period. For example, the sampling unit 130 may output, as a sampled signal, a signal corresponding to first sampling pixels of the second blocks SB2 which are positioned in a fourth row, from the second compensated image signal RGB2', for the fourth sampling period. For example, the sampling unit 130 may output, as a sampled signal, a signal corresponding to second sampling pixels of each of the second blocks SB2, which are positioned in the first row, from the second compensated image signal RGB2', for the fifth sampling period. Such a process is repeated to extract sampled signals for all sampling pixels provided in the second blocks SB2.

When the second display region DA2 operates in the first mode, the sampled signals extracted from the second blocks SB2 may be processed to be the (2-1)-th degradation data IDD21 (see FIG. 11B) and then accumulated in the first mode storage region MSA1 of the second storage region 122. When the second display region DA2 operates in the second mode, the sampled signals extracted from the second blocks SB2 may be processed to be the (2-2)-th degradation data IDD22 (see FIG. 11B) and then accumulated in the second mode storage region MSA2 of the second storage region 122.

For example, referring to FIG. 13A, according to embodiments of the present disclosure, the sampling unit 130 may extract sampled signals from defined pixel blocks over sequential sampling periods to generate degradation data specific to each operating mode and display region. The first blocks SB1 (e.g., 4×4 pixel regions) correspond to the first display region DA1 and are sampled periodically row by row, with accumulated data stored in individual unit regions of the first storage region 121. The second blocks SB2 (e.g., 4×8 pixel regions) correspond to the second display region DA2, and the extracted sampled signals are conditionally processed based on whether the second display region DA2 is operating in the first or second mode. This block-based, mode-aware sampling framework may enable localized degradation tracking while preserving temporal resolution, thereby allowing embodiments to perform precise afterimage compensation tailored to both display region and viewing mode.

According to an embodiment of the present disclosure, the second storage region 122 may include a plurality of unit storage regions. In this case, the first mode storage region MSA1 may include unit storage regions SA1*c* and SA3*c* in an odd-numbered column, and the second mode storage region MSA2 may include unit storage regions SA2*c* and SA4*c* in an even-numbered column. The (2-1)-th degradation data IDD21 may be accumulated in the unit storage regions SA1*c* and SA3*c* in the odd-numbered column, and the (2-2)-th degradation data IDD22 may be accumulated in the unit storage regions SA2*c* and SA4*c* in the even-numbered column.

The size of the second blocks SB2 defined in the second display region DA2 operating in the first mode or the second mode is set to be different from the size of the first blocks SB1 defined in the first display region DA1 operating in the first mode, thereby preventing the accumulating memory 120 from being increased. In addition, the degradation data for each mode of the second display region DA2 may be exactly accumulated without increasing the size of the accumulating memory 120, thereby preventing the afterimage compensation performance from being degraded.

As the size of each of the first block SB1 and the second block SB2 is decreased, the afterimage compensation is more precisely performed, thereby improving the afterimage compensation performance.

For example, according to embodiments of the present disclosure, to enable mode-specific accumulation of degradation data while maintaining a compact memory footprint, the second storage region 122 may be subdivided into unit storage regions arranged by column. For example, the first mode storage region MSA1 may use unit storage regions in odd-numbered columns (e.g., SA1*c* and SA3*c*), while the second mode storage region MSA2 may use unit storage regions in even-numbered columns (e.g., SA2*c* and SA4*c*). This interleaved storage strategy allows for degradation data for the second display region DA2, under both the first mode and second mode, to be stored distinctly without utilizing separate memory modules. Additionally, by adjusting the block size of the second blocks SB2 to differ from the first blocks SB1, embodiments may reduce memory overhead while preserving accurate tracking. As smaller block sizes are used, the granularity of degradation compensation increases, enhancing the precision and effectiveness of afterimage correction.

Although FIG. 13B illustrates that ‘p’ is ‘2’, and ‘q’ is ‘4’, the present disclosure is not limited thereto. In other words, each of the first blocks SB1*a* may have the size of (2×4), and each of the second blocks SB2*a* may have the size of (2×8). In other words, eight sampling pixels are provided in each of the first blocks SB1*a*, and 16 sampling pixels are provided in each of the second blocks SB2*a*.

According to an embodiment of the present disclosure, the first storage region 121 may include a plurality of unit storage regions SAa. In each unit storage region SAa of the first storage region 121, the first degradation data IDD1 for the relevant first block SB1*a* may be accumulated. In this case, each of the unit storage regions SAa may have a size smaller than (e.g., about half) the size of each of the unit storage regions SA illustrated in FIG. 13A.

When the second display region DA2 operates in the first mode, the sampled signals extracted from the second blocks SB2*a* may be processed to be the (2-1)-th degradation data IDD21 and then accumulated in the first mode storage region MSA1 of the second storage region 122. When the second display region DA2 operates in the second mode, the sampled signals extracted from the second blocks SB2*a* may be processed to be the (2-2)-th degradation data IDD22 and then accumulated in the second mode storage region MSA2 of the second storage region 122.

For example, according to embodiments, first storage region 121 may be organized into multiple unit storage regions SAa, each dedicated to storing degradation data IDD1 for a corresponding first block SB1*a*. These unit storage regions SAa may be configured with reduced dimensions, e.g., about half the size of the unit storage regions SA shown in FIG. 13A, allowing finer granularity in tracking degradation characteristics without increasing memory usage. Likewise, degradation data for the second display region DA2 may be divided by operating mode and accumulated in distinct sub-regions of the second storage region 122: the first mode storage region MSA1 for data IDD21, and the second mode storage region MSA2 for data IDD22. This selective data routing may allow for accurate degradation profiling tailored to the mode of operation, thereby enhancing the precision of image compensation in both public and private viewing scenarios.

According to an embodiment of the present disclosure, the second storage region 122 may include a plurality of unit storage regions. In this case, the first mode storage region MSA1 may include unit storage regions SA1*ca* and SA3*ca* in an odd-numbered column, and the second mode storage region MSA2 may include unit storage regions SA2*ca* and SA4*ca* in an even-numbered column. The (2-1)-th degradation data IDD21 may be accumulated in the unit storage regions SA1*ca* and SA3*ca* in the odd-numbered column, and the (2-2)-th degradation data IDD22 may be accumulated in the unit storage regions SA2*ca* and SA4*ca* in the even-numbered column.

In this case, each of the unit storage regions SA1*ca* and SA3*ca* in the odd-numbered column may have a size smaller than (e.g., about half) the size of each of the unit storage regions SA1*c* and SA3*c* in the odd-numbered column illustrated in FIG. 13A. In this case, each of the unit storage regions SA2*ca*, and SA4*ca* in the even-numbered column may have a size smaller than (e.g., about half) the size of each of the unit storage regions SA2*c* and SA4*c* in the even-numbered column illustrated in FIG. 13A.

For example, according to embodiments, the second storage region 122 may be subdivided into finer unit storage regions, which may improve the precision of degradation data management. For example, the first mode storage region MSA1 may include smaller unit storage regions SA1*ca* and SA3*ca* in odd-numbered columns, while the second mode storage region MSA2 may include similarly downsized unit storage regions SA2*ca* and SA4*ca* in even-numbered columns. Each of these finer storage regions, SA1*ca* through SA4*ca*, may be about half the size of their corresponding regions shown in FIG. 13A. This reduction in region size allows more localized accumulation of mode-specific degradation data (IDD21 and IDD22), which may improve the granularity of compensation without increasing the overall memory size or compromising processing efficiency.

Figure 14A:
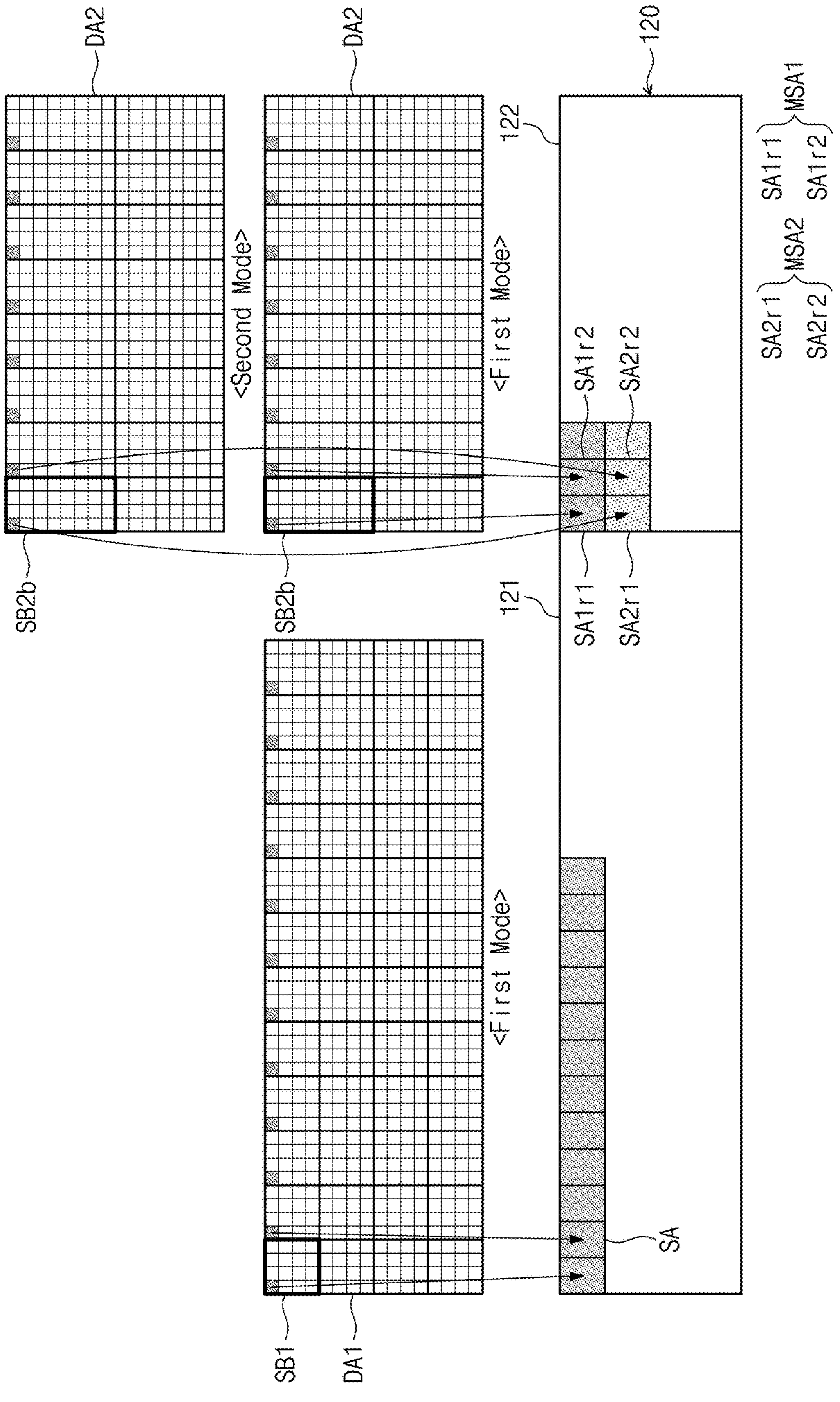
FIG. 14A illustrates a sampling operation for a first display region and a second display region depending on modes according to an embodiment of the present disclosure.
Figure 14B:
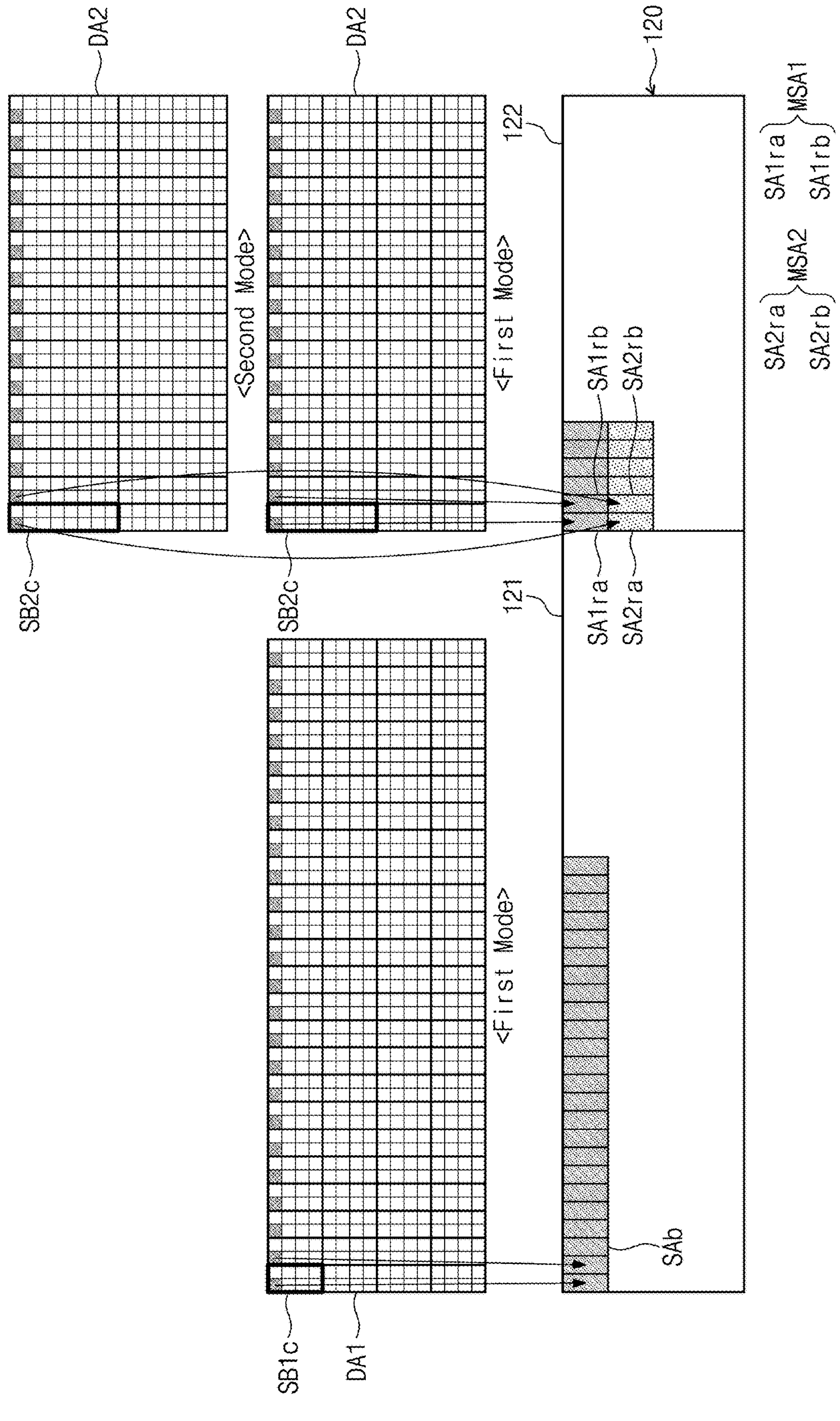
FIG. 14B illustrates a sampling operation for a first display region and a second display region depending on modes according to an embodiment of the present disclosure.

FIG. 14A illustrates a sampling operation for a first display region and a second display region depending on modes according to an embodiment of the present disclosure. FIG. 14B illustrates a sampling operation for a first display region and a second display region depending on modes according to an embodiment of the present disclosure.

Referring to FIG. 14A, a plurality of first blocks SB1 are defined in the first display region DA1, and a plurality of second blocks SB2*b* are defined in the second display region DA2 and have a size different from a size of the first blocks SB1. Each of the first blocks SB1 may have the size of (p×q), and each of the second blocks SB2*b* may have the size of (2p×q). In this case, each of 'p' and 'q' may be an integer of '1' or more.

According to an embodiment of the present disclosure, although FIG. 14A illustrates that 'p' is '4', and 'q' is '4', the present disclosure is not limited thereto. In other words, each of the first blocks SB1 may have the size of (4×4), and each of the second blocks SB2*b* may have the size of (8×4). In other words, 16 sampling pixels are disposed in each of the first blocks SB1, and 32 sampling pixels are disposed in each of the second blocks SB2*b*.

When the second display region DA2 operates in the first mode, the sampled signals extracted from the second blocks SB2*b* may be processed to be the (2-1)-th degradation data IDD21 and then accumulated in the first mode storage region MSA1 of the second storage region 122. When the second display region DA2 operates in the second mode, the sampled signals extracted from the second blocks SB2*b* may be processed to be the (2-2)-th degradation data IDD22 and then accumulated in the second mode storage region MSA2 of the second storage region 122.

According to an embodiment of the present disclosure, the second storage region 122 may include a plurality of unit storage regions. In this case, the first mode storage region MSA1 may include unit storage regions SA1*r*1 and SA1*r*2 in an odd-numbered row, and the second mode storage region MSA2 may include unit storage regions SA2*r*1 and SA2*r*2 in an even-numbered row. The (2-1)-th degradation data IDD21 may be accumulated in the unit storage regions SA1*r*1 and SA1*r*2 in the odd-numbered row, and the (2-2)-th degradation data IDD22 may be accumulated in the unit storage regions SA2*r*1 and SA2*r*2 in the even-numbered row.

Although FIG. 14B illustrates that 'p' is '4', and 'q' is '2', the present disclosure is not limited thereto. In other words, each of the first blocks SB1*c* may have the size of (4×2), and each of the second blocks SB2*c* may have the size of (8×2). In other words, eight sampling pixels are provided in each of the first blocks SB1*c*, and 16 sampling pixels are provided in each of the second blocks SB2*c*.

According to an embodiment of the present disclosure, the first storage region 121 may include a plurality of unit storage regions SAb. In each unit storage region SAb of the first storage region 121, the first degradation data IDD1 for the relevant first block SB1*c* may be accumulated. In this case, each of the unit storage regions SAb may have a size smaller than (e.g., about half) the size of each of the unit storage regions SA illustrated in FIG. 14A.

According to an embodiment of the present disclosure, the second storage region 122 may include a plurality of unit storage regions. In this case, the first mode storage region MSA1 may include unit storage regions SA1*ra* and SA1*rb* in an odd-numbered row, and the second mode storage region MSA2 may include unit storage regions SA2*ra* and SA2*rb* in an even-numbered row. The (2-1)-th degradation data IDD21 may be accumulated in the unit storage regions SA1*ra* and SA1*rb* in the odd-numbered row, and the (2-2)-th degradation data IDD22 may be accumulated in the unit storage regions SA2*ra* and SA2*rb* in the even-numbered row.

In this case, each of the unit storage regions SA1*ra* and SA1*rb* in an odd-numbered row may have a size smaller than (e.g., about half) the size of each of the unit storage regions SA1*r*1 and SA1*r*2 in an odd-numbered row illustrated in FIG. 14A. In this case, each of the unit storage regions SA2*ra* and SA2*rb* in an even-numbered row may have a size smaller than (e.g., about half) the size of each of the unit storage regions SA2*r*1 and SA2*r*2 in an even-numbered row illustrated in FIG. 14A.

Figure 15A:
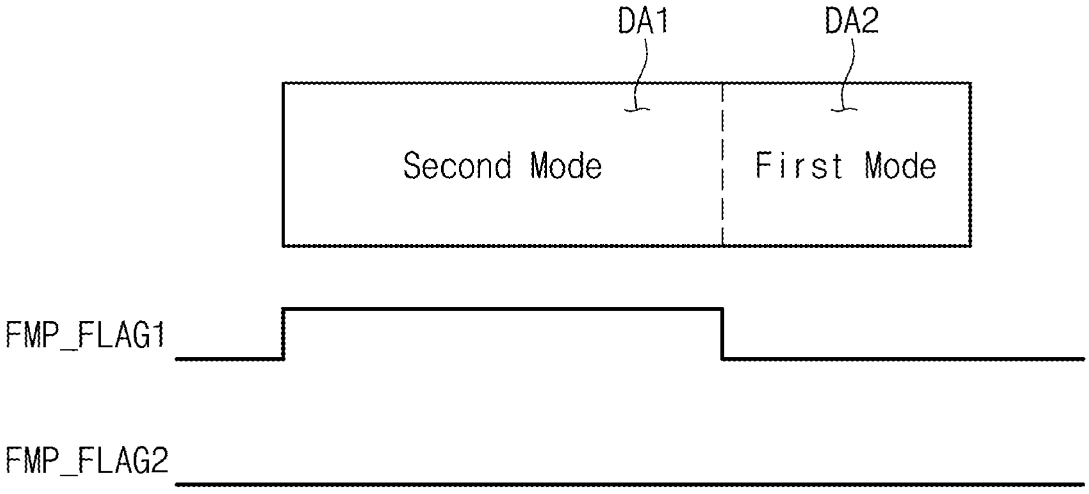
FIGS. 15A and 15B are views illustrating the state of a first flag signal and a second flag signal depending on an operating mode of an electronic device.
Figure 15B:
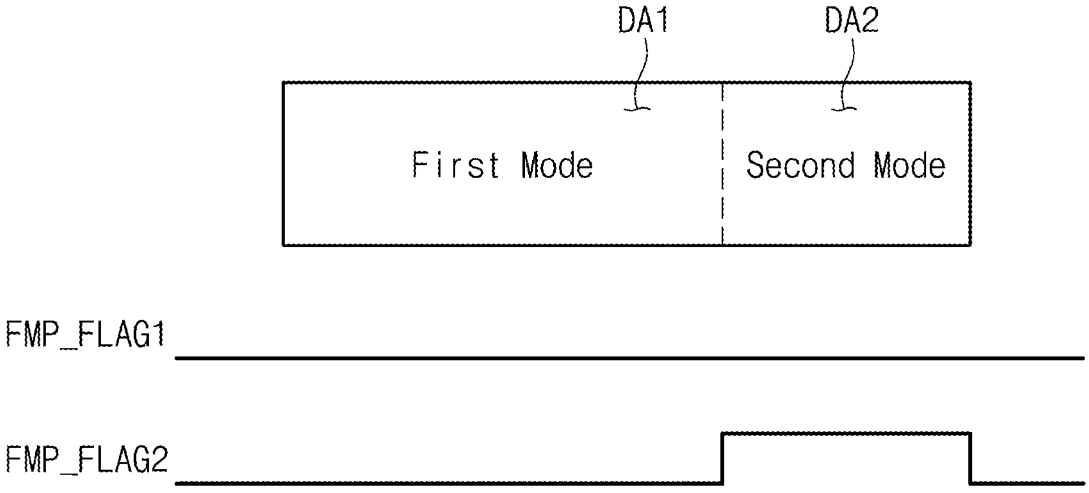
Figure 16:
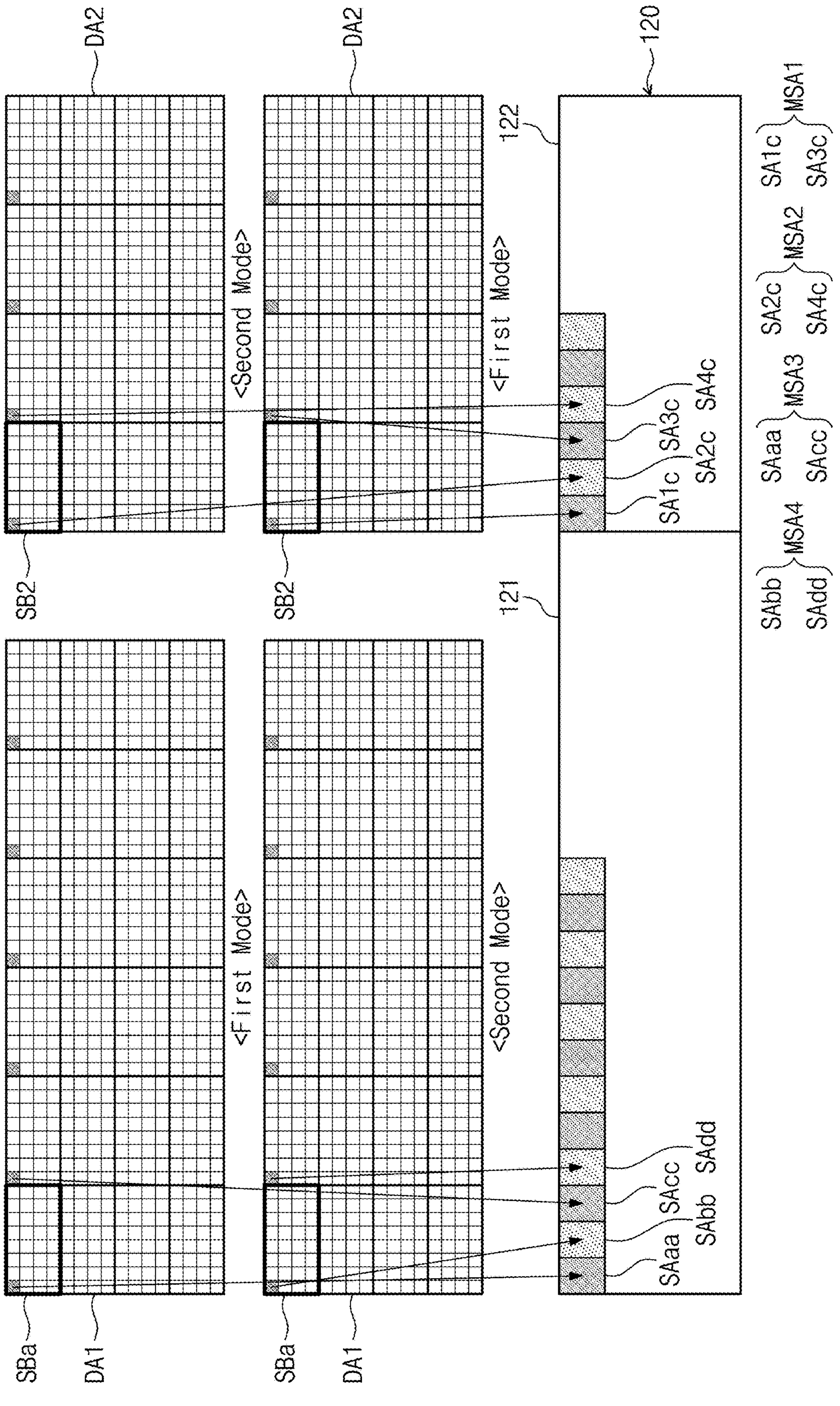
FIG. 16 illustrates a sampling operation for a first display region and a second display region depending on modes according to an embodiment of the present disclosure.

FIGS. 15A and 15B are views illustrating the state of a first flag signal and a second flag signal depending on an operating mode of the electronic device. FIG. 16 illustrates a sampling operation for a first display region and a second display region depending on modes according to an embodiment of the present disclosure.

Referring to FIGS. 15A and 15B, the second display region DA2 may operate in the first mode or the second mode, and the first display region DA1 may operate in the first mode or the second mode. In this case, the afterimage compensating circuit 100 (see FIG. 11B) may receive two flag signals (that is, a first flag signal FMP_FLAG1 and a second flag signal FMP_FLAG2).

The first flag signal FMP_FLAG1 may be a signal which is deactivated when the first display region DA1 operates in the first mode, and activated when the first display region DA1 operates in the second mode. The second flag signal FMP_FLAG2 may be a signal which is deactivated when the second display region DA2 operates in the first mode, and activated when the second display region DA2 operates in the second mode.

Referring to FIG. 16, a plurality of first blocks SBa are defined in the first display region DA1, and a plurality of second blocks SB2 are defined in the second display region DA2 and having a same size as a size of the first blocks SBa. The first storage region 121 include a third mode storage region MSA3 and a fourth mode storage region MSA4, and the second storage region 122 include a first mode storage region MSA1 and a second mode storage region MSA2. The first mode storage region MSA1 may include unit storage regions SA1*c* and SA3*c* in an odd-numbered column, and the second mode storage region MSA2 may include unit storage regions SA2*c* and SA4*c* in an even-numbered column. The third mode storage region MSA3 may include unit storage regions SAaa and SAcc in an odd-numbered column, and the fourth mode storage region MSA4 may include unit storage regions SAbb and SAdd in an even-numbered column.

The afterimage compensating circuit 100 accumulates first degradation data in the third mode storage region MSA3 in response to the first flag signal FMP_FLAG1, which is deactivated (e.g., the state of logic "0"), and accumulates the first degradation data in the fourth mode storage region MSA4 in response to the first flag signal FMP_FLAG1, which is activated (e.g., the state of logic "1"). The first degradation data accumulated in the third mode storage region MSA3 is referred to as the (1-1)-th degradation data, and the first degradation data accumulated in the fourth mode storage region MSA4 is referred to as the (1-2)-th degradation data.

The afterimage compensating circuit 100 stores the (1-1)-th accumulated data obtained by accumulating the (1-1)-th degradation data to (1-1)-th previously-accumulated data, which is previously stored in the third mode storage region MSA3 of the first storage region 121. In addition, the afterimage compensating circuit 100 stores the (1-2)-th accumulated data obtained by accumulating the (1-2)-th degradation data to (1-2)-th previously-accumulated data, which is previously stored in the fourth mode storage region MSA4 of the first storage region 121.

Hereinafter, the second storage region 122 of the afterimage compensating circuit 100 has been described with reference to FIG. 13A, so the details thereof will be omitted to avoid redundancy.

Figure 17:
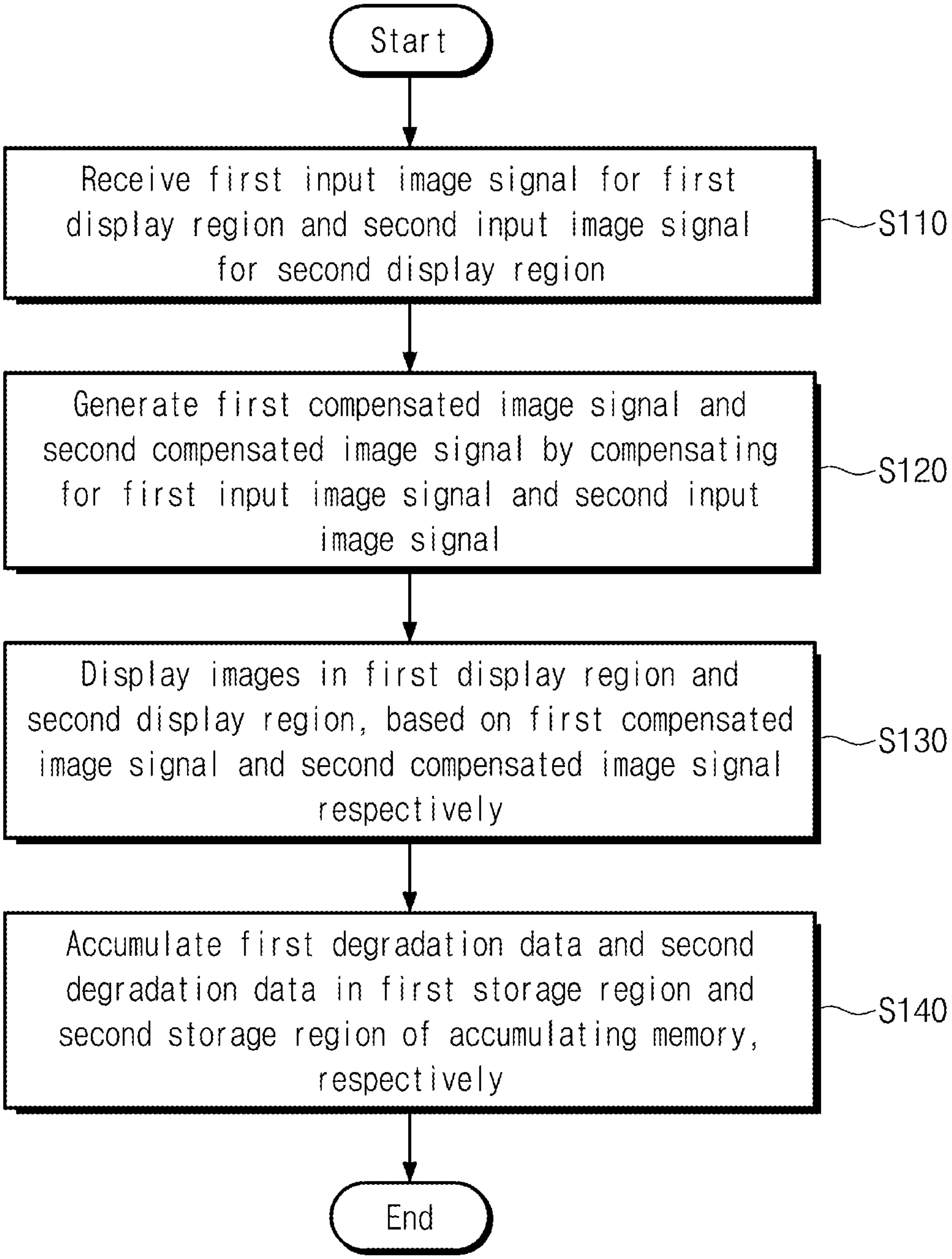
FIG. 17 is a flowchart illustrating an operating procedure of an electronic device according to an embodiment of the present disclosure.
Figure 18A:
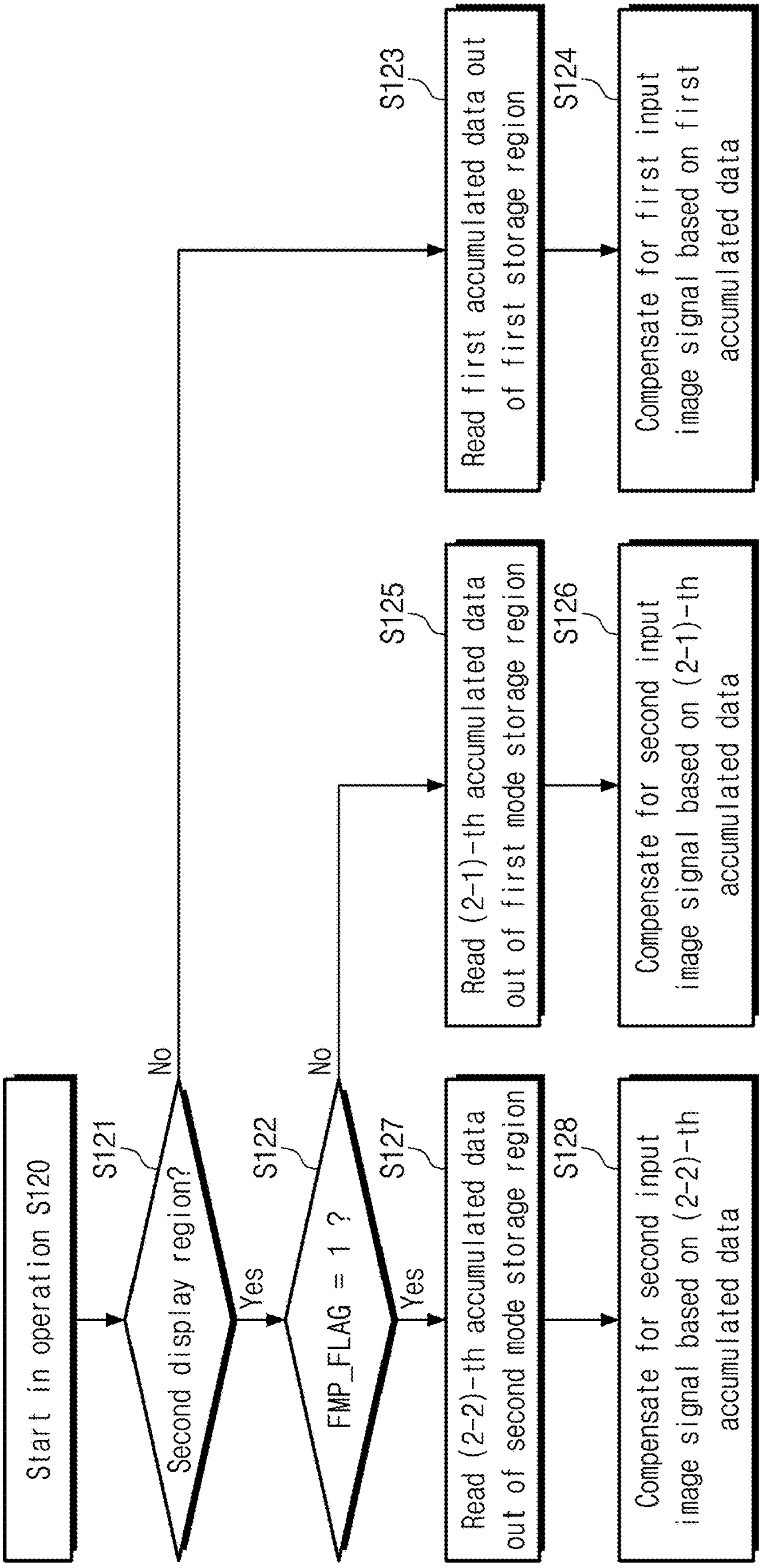
FIG. 18A is a flowchart illustrating a method of compensating for a signal in an operation S120 illustrated in FIG. 17.
Figure 18B:
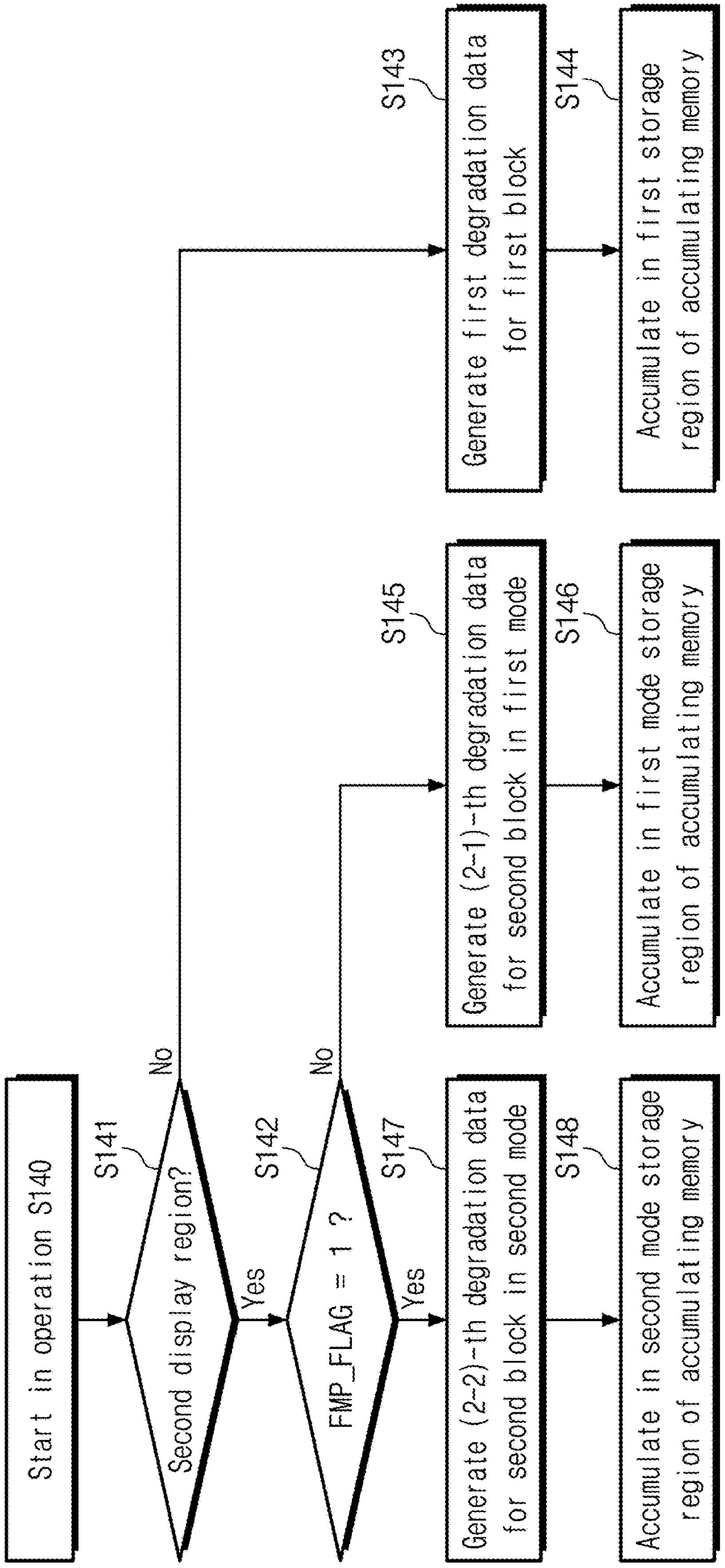
FIG. 18B is a flowchart illustrating a method of accumulating degradation data in an operation S140 illustrated in FIG. 17.

FIG. 17 is a flowchart illustrating an operating procedure of an electronic device according to an embodiment of the present disclosure. FIG. 18A is a flowchart illustrating a method of compensating for a signal in an operation S120 illustrated in FIG. 17. FIG. 18B is a flowchart illustrating a method of accumulating degradation data in an operation S140 illustrated in FIG. 17.

Referring to FIGS. 11B and 17, when the electronic device DD starts to operate, the afterimage compensating circuit 100 receives the first input image signal RGB1 for the first display region DA1 (see FIG. 12A) and the second input image signal RGB2 for the second display region DA2 (see FIG. 12A) (an operation S110).

The afterimage compensating circuit 100 may compensate for the first and second input image signals RGB1 and RGB2 based on degradation information to generate first and second compensated image signals RGB1' and RGB2' (an operation S120). The degradation information may be generated based on the first and second accumulated data ADD1, ADD21, and ADD22 read out of the accumulating memory 120.

The electronic device DD may display an image in the first and second display regions DA1 and DA2, based on the first and second compensated image signals RGB1' and RGB2', respectively (an operation S130).

The afterimage compensating circuit 100 accumulates the first degradation data IDD1, which is generated based on the first compensated image signal RGB1', in the first storage region 121 of the accumulating memory 120, and accumulates the second degradation data IDD21 and IDD22, which is generated based on the second compensated image signal RGB2', in the second storage region 122 of the accumulating memory 120 (an operation S140).

Referring to FIG. 18A, when the operation for compensating for the first and second input image signals RGB1 and RGB2 (an operation S120) is started, the afterimage compensating circuit 100 determines whether the first and second input image signals RGB1 and RGB2 are for the first display region DA1 or the second display region DA2 (an operation S121). In other words, when it is determined that the first input image signal RGB1 is for the first display region DA1, an operation 'S123' is performed. When it is determined that the second input image signal RGB2 is for the second display region DA2, an operation 'S122' is performed.

In the operation S122, the afterimage compensating circuit 100 may determine the state of the flag signal FMP_FLAG. When the flag signal FMP_FLAG is deactivated (the state of logic '0'), operation S125 is performed. When the flag signal FMP_FLAG is activated (the state of logic '1'), operation S127 is performed.

In the operation S123, the afterimage compensating circuit 100 reads the first accumulated data ADD1 from the first storage region 121. Thereafter, the afterimage compensating circuit 100 compensates for the first input image signal RGB1 based on the first accumulated data ADD1 to generate the first compensated image signal RGB1' (an operation S124).

In the operation S125, the afterimage compensating circuit 100 reads the (2-1)-th accumulated data ADD21 out of the first mode storage region MSA1 of the second storage region 122. Thereafter, the afterimage compensating circuit 100 compensates for the second input image signal RGB2 based on the (2-1)-th accumulated data ADD21 to generate the second compensated image signal RGB2' (an operation S126).

In the operation S127, the afterimage compensating circuit 100 reads the (2-2)-th accumulated data ADD22 from the second mode storage region MSA2 of the second storage region 122. Thereafter, the afterimage compensating circuit 100 compensates for the second input image signal RGB2 based on the (2-2)-th accumulated data ADD22 to generate the second compensated image signal RGB2' (an operation S128).

Referring to FIG. 18B, when the operation S140 for accumulating the first and second degradation data is started, the afterimage compensating circuit 100 determines whether the sampled signal is for the first display region DA1 or the second display region DA2 (an operation S141). When the sampled signal is not for the second display region DA2, an operation S143 is performed. When the sampled signal is for the second display region DA2, an operation S142 is performed.

In the operation S142, the afterimage compensating circuit 100 may determine the state of the flag signal FMP_FLAG. When the flag signal FMP_FLAG is deactivated (the state of logic '0'), an operation S145 is performed. When the flag signal FMP_FLAG is activated (the state of logic '1'), an operation S147 is performed.

The afterimage compensating circuit 100 generates the first degradation data IDD1 for the first blocks SB1 of the first display region DA1 based on a sampled signal in operation S143 and accumulates the first degradation data IDD1 in the first storage region 121 of the accumulating memory 120 (an operation S144).

In the operation S145, the afterimage compensating circuit 100 generates the (2-1)-th degradation data IDD21 for the second blocks SB2 of the second display region DA2 operating in the first mode based on the sampled signal. Thereafter, the afterimage compensating circuit 100 accumulates the (2-1)-th degradation data IDD21 in the first mode storage region MSA1 of the second storage region 122 (an operation S146).

In the operation S147, the afterimage compensating circuit 100 generates the (2-2)-th degradation data IDD22 for the second blocks SB2 of the second display region DA2 operating in the second mode based on the sampled signal. Thereafter, the afterimage compensating circuit 100 accumulates the (2-2)-th degradation data IDD22 in the second mode storage region MSA2 of the second storage region 122 (an operation S148).

Figure 19:
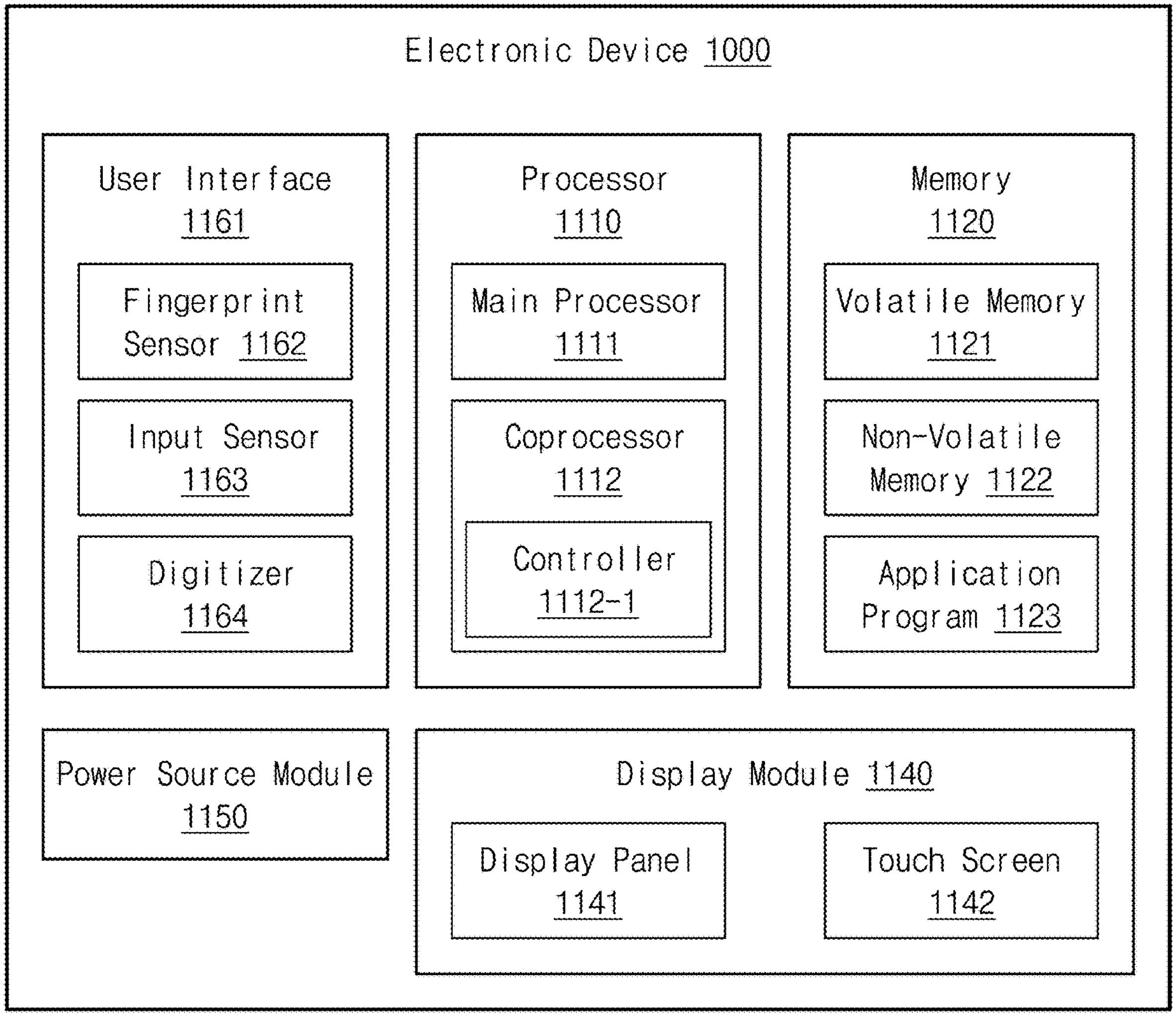
FIG. 19 is a diagram illustrating an electronic device according to an embodiment of the present disclosure.

FIG. 19 is a diagram illustrating an electronic device according to an embodiment of the present invention.

Referring to FIG. 19, the electronic device 1000 according to an embodiment of the present disclosure may output various information (e.g., images, text, music, etc.) through a display module 1140. When a processor 1110 executes an application stored in a memory 1120, the display module 1140 may provide application information to a user through a display panel 1141.

In some embodiments, the electronic device 1000 may be configured as a smartphone, camera, smart TV, monitor, smartwatch, tablet, automotive display, or AR/VR headset. For example, the electronic device 1000 may be a smartphone including a touch-sensitive display area for interaction and a non-display area including sensors and circuits for enhanced functionality. For example, the electronic device 1000 may be a television or monitor including a large display area for high-resolution video playback and a non-display area incorporating driving circuits or connectivity modules for external inputs. For example, the electronic device 1000 may be a smartwatch including a display area optimized for compact and high-clarity visuals and a non-display area integrating biometric sensors for health monitoring. In some cases, the electronic device 1000 may be an AR/VR headset.

In some embodiments, memory 1120 may store information such as software codes for operating an application program 1123. The application program 1123 may include a software designed to execute specific tasks or provide functionality to a user. The application program 1123 may operate under the control of the processor 1110 and utilizes data stored in the memory 1120 to deliver a wide range of features, such as productivity tools, multimedia streaming and playback, file or mail deliveries or communication services. The application program 1123 interacts seamlessly with the user interface 1161 or touch screen 1142, allowing a user to launch, navigate, and utilize the program through user inputs such as touch, tap, gesture, or voice interaction.

Upon user selection of an application via touch screen 1142 or user interface 1161, the processor 1110 may execute the application program 1123 corresponding to the selected application retrieved from the memory 1120 to perform functionalities of the application. For example, when a user selects a camera application by tapping the icon (or a camera application icon) presented on the display panel 1141, the processor 1110 activates a camera module. The processor 1110 may transmit image data corresponding to a captured image acquired through the camera module to the display module 1140. The display module 1140 may display an image corresponding to the captured image through the display panel 1141.

As another example, when a user wishes to make a phone call, the user taps the telephone icon displayed on the display module 1140, the processor 1110 may execute a phone application program stored in the memory 1120. A telephone keypad may be presented on the display panel 1141 for the user to enter a phone number to call.

As another example, the display module 1140 may be integrated into an electronic device 1000, such as a laptop computer, smart TV, or tablet. A user wishing to access a multimedia streaming application (e.g., to watch a music video or movie) can do so by tapping the corresponding icon. This action activates the application, allowing the user to view the streamed content.

The processor 1110 may include a main processor 1111 and an auxiliary or coprocessor 1112. The main processor 1111 may include a central processing unit (CPU). The main processor 1111 may further include one or more of a graphics processing unit (GPU), a communication processor (CP), and an image signal processor (ISP).

The coprocessor 1112 may include a controller 1112-1. The controller 1112-1 may include an interface conversion circuit and a timing control circuit. The controller 1112-1 may receive an image signal from the main processor 1111, convert the data format of the image signal to match the interface specifications with the display module 1140, and output image data. The controller 1112-1 may output various control signals to drive the display module 1140. For example, the controller 1112-1 may drive the display module 1140 to display the icon on the display screen suitable for selection by a user to cause execution of an application program 1123.

The memory 1120 may store one or more application programs 1123 and various data used by at least one component (for example, the processor 1110 or the user interface 1161) of the electronic device 1000 and input data or output data for commands related thereto. For example, a camera application program, a GPS application program, an augmented reality and virtual reality application program, and other application programs that can be executed by the processor 1110 upon selection of corresponding icons presented on the display screen (or display panel 1141) via the touch screen 1142 or user interface 1161 by the user. In addition, various setting data corresponding to user settings may be stored in the memory 1120. The memory 1120 may include volatile memory 1121 and non-volatile memory 1122.

The display module 1140 may output visual information (images) to the user. The display module 1140 may include the display panel 1141, a gate driver, the source driver, a voltage generation circuit, and a touch screen 1142. The display module 1140 may further include a window, a chassis, and a bracket to protect the display panel 1141.

The user interface 1161 serves as the interaction medium between a user and the electronic device 1000. The user interface 1161 may detect an input by a part (e.g., finger) of a user's body or an input by a pen or a mouse, and generate an electric signal or data value corresponding to the input. The user interface 1161 includes the fingerprint sensor 1162, the input sensor 1163, and a digitizer 1164.

The fingerprint sensor 1162 may sense a fingerprint for biometric recognition of the user and may also measure one or more biological signals such as blood pressure, moisture, or body mass.

The input sensor 1163 may sense user interactions including touch, tap, gesture, motion, spoken command, and eye movement. The input sensor 1163 includes optical sensors for image capture, eye tracking, or motion and gesture detection. Optical sensors may be infrared or semiconductor photodetectors. The input sensor 1163 includes audio and acoustic sensors, which may be MEMS microphones for voice recognition or sound-based interaction. The audio and acoustic sensors can be installed as part of the user interface 1161 or embedded in the display panel 1141.

The digitizer 1164 may generate a data value corresponding to coordinate information of input by a pen or a mouse to control movement of an onscreen cursor. The digitizer 1164 may generate the amount of change in electromagnetic due to the input as the data value. The digitizer 1164 may detect an input by a passive pen or transmit and receive data with an active pen or a remote.

At least one of the fingerprint sensor 1162, the input sensor 1163, or the digitizer 1164 may be implemented as a sensor layer formed on the top layer of the display panel 1141 through a continuous process with a process of forming elements (for example, the light emitting element, the transistor, and the like) included in the display panel 1141.

In addition, the user interface 1161 may further include, for example, a gesture sensor, a gyro sensor that senses rotational movements, an acceleration sensor to track translational movement, a grip sensor, a pressure sensor, a proximity sensor, a color sensor, an infrared (IR) emitter and camera sensor for tracking gaze direction and eye movements, a temperature sensor, or a light sensor. For example, the gyro sensor, acceleration sensor, and infrared emitter and camera sensor may be particularly suitable for AR/VR headset functions.

The touch screen 1142 includes touch sensors embedded in semiconductor layers of the display panel 1141 to sense pressure applied to the top layer (screen) of the display panel 1141. The touch sensors can be a capacitive or a resistive type. The touch screen 1142 may serve as the primary interface for the user to select and navigate applications, control, and interact with the electronic device 1000.

The display panel 1141 (or display) may include a liquid crystal display panel, an organic light emitting display panel, or an inorganic light emitting display panel, and the type of the display panel 1141 is not particularly limited. The display panel 1141 may be of a rigid type or a flexible type that can be rolled or folded. The display module 1140 may further include a supporter, bracket, heat dissipation member, and the like that support the display panel 1141.

The power source module 1150 may supply power to the components of the electronic device 1000. The power source module 1150 may include a battery that charges the power source voltage. The battery may include a non-rechargeable primary battery or a rechargeable secondary battery or fuel cell. The power source module 1150 may include a power management integrated circuit (PMIC). The PMIC may supply optimized power source to each of the components described above including the display module 1140.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

As described above, the size of the second blocks used for the sampling operation in the second display region, whether operating in the first mode or the second mode, may be set differently from the size of the first blocks used for the sampling operation in the first display region operating in the first mode. This configuration may help prevent an increase in the size of the accumulating memory provided in the afterimage compensating circuit, while still allowing degradation data for each mode of the second display region to be accurately accumulated.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An electronic device, comprising:

a display panel including a first display region which operates in a first mode, and a second display region which operates in the first mode or a second mode; and an afterimage compensating circuit configured to receive a first input image signal for the first display region and a second input image signal for the second display region, and generate a first compensated image signal and a second compensated image signal by compensating for the first input image signal and the second input image signal based on degradation information for the first display region and the second display region, respectively, wherein a plurality of first blocks are defined in the first display region, and a plurality of second blocks are defined in the second display region, each of the second blocks having a size different from a size of each of the first blocks, wherein the afterimage compensating circuit includes:

an accumulating memory including a first storage region configured to accumulate first degradation data for each of the plurality of first blocks, and a second storage region configured to accumulate second degradation data for each of the plurality of second blocks, and wherein the second storage region includes:

a first mode storage region configured to accumulate the second degradation data for the each of the second blocks in the first mode; and a second mode storage region configured to accumulate the second degradation data for the each of the second blocks in the second mode.

2. The electronic device of claim 1, wherein the each of the first blocks has a size of (p×q), wherein each of the second blocks has a size of (p×2q), and wherein each of 'p' and 'q' is an integer of '1' or more.

3. The electronic device of claim 2, wherein the second storage region includes a plurality of unit storage regions, wherein the first mode storage region includes unit storage regions among the plurality of unit storage regions in an odd-numbered column, and wherein the second mode storage region includes unit storage regions among the plurality of unit storage regions in an even-numbered column.

4. The electronic device of claim 1, wherein the each of the first blocks has a size of (p×q), wherein the each of the second blocks has a size of (2p×q), and wherein each of 'p' and 'q' is an integer of '1' or more.

5. The electronic device of claim 4, wherein the second storage region includes a plurality of unit storage regions, wherein the first mode storage region includes unit storage regions among the plurality of unit storage regions in an odd-numbered row, and wherein the second mode storage region includes unit storage regions among the plurality of unit storage regions in an even-numbered row.

6. The electronic device of claim 1, wherein the afterimage compensating circuit further includes a compensating circuit, wherein the compensating circuit receives, as the degradation information for the first display region, first accumulated data stored in the first storage region, and generates the first compensated image signal by compensating for the first input image signal based on the first accumulated data, and wherein the compensating circuit receives, as the degradation information for the second display region, second accumulated data stored in the second storage region, and generates the second compensated image signal by compensating for the second input image signal based on the second accumulated data.

7. The electronic device of claim 6, wherein the afterimage compensating circuit is further configured to:

read a (2-1)-th accumulated data stored in the first mode storage region and compensates for the second input image signal based on the (2-1)-th accumulated data in the first mode; and read a (2-2)-th accumulated data stored in the second mode storage region and compensates for the second input image signal based on the (2-2)-th accumulated data in the second mode.

8. The electronic device of claim 1, wherein the afterimage compensating circuit is further configured to:

receive a flag signal deactivated in the first mode and activated in the second mode; and select one of the first mode storage region and the second mode storage region in response to the flag signal.

9. The electronic device of claim 1, wherein the display panel includes a pixel provided in the first display region and the second display region, and wherein the pixel includes:

a first light-emitting element;

a second light-emitting element; and a pixel circuit configured to drive the first light-emitting element and the second light-emitting element.

10. The electronic device of claim 9, wherein the first mode is a first viewing angle mode in which an image is output at a first viewing angle, wherein the second mode is a second viewing angle mode in which the image is output at a second viewing angle narrower than the first viewing angle, and wherein the electronic device further includes:

an optical path control layer disposed on the second light-emitting element and configured to control a range of a light output from the second light-emitting element in the second mode.

11. The electronic device of claim 10, wherein the optical path control layer includes:

a light absorbing partition wall overlapping the second light-emitting element when viewed in a plan view.

12. The electronic device of claim 9, wherein the pixel circuit includes:

a first switching circuit electrically connected to the first light-emitting element and configured to apply a first driving current to the first light-emitting element, in response to a first switching signal activated in the first mode; and a second switching circuit electrically connected to the second light-emitting element and configured to apply a second driving current to the second light-emitting element, in response to a second switching signal activated in the second mode.

13. A method of driving an electronic device, including a first display region operating in a first mode, and a second display region operating in the first mode or a second mode, the method comprising:

receiving a first input image signal for the first display region and a second input image signal for the second display region;

generating a first compensated image signal and a second compensated image signal by compensating for the first input image signal and the second input image signal based on degradation information for the first display region and the second display region, respectively;

displaying an image in the first display region and the second display region based on the first compensated image signal and the second compensated image signal, respectively; and accumulating first degradation data generated based on the first compensated image signal in a first storage region of an accumulating memory, and accumulating second degradation data generated based on the second compensated image signal in a second storage region of the accumulating memory, wherein a plurality of first blocks are defined in the first display region, and a plurality of second blocks are defined in the second display region, each of the second blocks having a size different from a size of each of the first blocks, and wherein the second storage region includes:

a first mode storage region configured to accumulate (2-1)-th degradation data for each of the second blocks in the first mode; and a second mode storage region configured to accumulate (2-2)-th degradation data for the each of the second blocks in the second mode.

14. The method of claim 13, wherein compensating for the first input image signal and the second input image signal includes:

determining whether the first input image signal and the second input image signal are for the first display region or the second display region;

compensating for the first input image signal, based on first accumulated data for the first display region, when the first input image signal is for the first display region;

determining a state of a flag signal when the second input image signal is for the second display region;

compensating for the second input image signal, based on (2-1)-th accumulated data for the second display region in the first mode, when the flag signal is deactivated; and compensating for the second input image signal based on (2-2)-th accumulated data for the second display region in the second mode, when the flag signal is activated.

15. The method of claim 13, wherein accumulating the first degradation data and the second degradation data includes:

determining whether a sampled signal is for the first display region or the second display region;

generating the first degradation data for the first blocks, based on the sampled signal, when the sampled signal is not for the second display region, and accumulating the first degradation data in the first storage region;

determining a state of a flag signal when the sampled signal is for the second display region;

generating the (2-1)-th degradation data for the second blocks in the first mode, and accumulating the (2-1)-th degradation data in the first mode storage region, when the flag signal is deactivated; and generating the (2-2)-th degradation data for the second blocks in the second mode, and accumulating the (2-2)-th degradation data in the second mode storage region, when the flag signal is activated.

16. The method of claim 13, wherein each of the first blocks has a size of (p×q), wherein the each of the second blocks has a size of (p×2q), and wherein each of ‘p’ and ‘q’ is an integer of ‘1’ or more.

17. The method of claim 16, wherein the second storage region includes a plurality of unit storage regions, wherein the first mode storage region includes unit storage regions among the plurality of unit storage regions in an odd-numbered column, and wherein the second mode storage region includes unit storage regions among the plurality of unit storage regions in an even-numbered column.

18. The method of claim 13, wherein each of the first blocks has a size of (p×q), wherein the each of the second blocks has a size of (2p×q), and wherein each of ‘p’ and ‘q’ is an integer of ‘1’ or more.

19. The method of claim 18, wherein the second storage region includes a plurality of unit storage regions, wherein the first mode storage region includes unit storage regions among the plurality of unit storage regions in an odd-numbered row, and wherein the second mode storage region includes unit storage regions among the plurality of unit storage regions in an even-numbered row.

20. An electronic device, comprising:

a display panel including a first display region which operates in a first mode or a second mode, and a second display region which operates in the first mode or the second mode; and an afterimage compensating circuit configured to receive a first input image signal for the first display region and a second input image signal for the second display region and generate a first compensated image signal and a second compensated image signal by compensating for the first input image signal and the second input image signal based on degradation information of the first display region and the second display region, respectively, wherein the afterimage compensating circuit includes:

an accumulating memory including a first storage region and a second storage region, wherein the second storage region includes:

a first mode storage region configured to accumulate (2-1)-th degradation data for the second display region in the first mode; and a second mode storage region configured to accumulate (2-2)-th degradation data for the second display region in the second mode, and wherein the first storage region includes:

a third mode storage region configured to accumulate (1-1)-th degradation data for the first display region in the first mode; and a fourth mode storage region configured to accumulate (1-2)-th degradation data for the first display region in the second mode.

* * * * *